(12) United States Patent
Park

(10) Patent No.: US 12,451,291 B2
(45) Date of Patent: Oct. 21, 2025

(54) CAPACITOR WIRE AND ELECTRONIC DEVICE INCLUDING THE SAME

(71) Applicant: Samsung Electronics Co., Ltd., Suwon-si (KR)

(72) Inventor: Soojae Park, Asan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 588 days.

(21) Appl. No.: 17/940,268

(22) Filed: Sep. 8, 2022

(65) Prior Publication Data
US 2023/0245828 A1    Aug. 3, 2023

(30) Foreign Application Priority Data

Jan. 28, 2022   (KR) .................. 10-2022-0013022

(51) Int. Cl.
| | |
|---|---|
| *H01G 4/30* | (2006.01) |
| *H01G 2/06* | (2006.01) |
| *H01G 4/12* | (2006.01) |
| *H01G 4/224* | (2006.01) |
| *H01G 4/232* | (2006.01) |
| *H01L 23/00* | (2006.01) |
| *H01L 25/16* | (2023.01) |

(52) U.S. Cl.
CPC ........... *H01G 4/2325* (2013.01); *H01G 2/065* (2013.01); *H01G 4/12* (2013.01); *H01G 4/224* (2013.01); *H01G 4/30* (2013.01); *H01L 24/16* (2013.01); *H01L 24/32* (2013.01); *H01L 24/48* (2013.01); *H01L 24/73* (2013.01); *H01L 25/16* (2013.01); *H01L 2224/16195* (2013.01); *H01L 2224/32195* (2013.01); *H01L 2224/48195* (2013.01); *H01L 2224/73253* (2013.01); *H01L 2924/19041* (2013.01)

(58) Field of Classification Search
CPC ........ H01G 4/2325; H01G 2/065; H01G 4/12; H01G 4/224; H01G 4/30; H01G 4/1209; H01G 4/008; H01G 4/28; H01G 4/228; H01L 24/16; H01L 24/32; H01L 24/48; H01L 24/73; H01L 25/16; H01L 2224/16195; H01L 2224/32195; H01L 2224/49195; H01L 2224/73253; H01L 2924/19041; H01L 23/642; H01L 21/561; H01L 23/3128
See application file for complete search history.

(56) References Cited

U.S. PATENT DOCUMENTS

| | | | |
|---|---|---|---|
| 5,828,093 A | 10/1998 | Naito et al. | |
| 6,882,051 B2 * | 4/2005 | Majumdar | ........... H10D 62/118 |
| | | | 257/734 |

(Continued)

FOREIGN PATENT DOCUMENTS

| | | | |
|---|---|---|---|
| JP | 2007184554 A | | 7/2007 |
| JP | 2011049605 A | * | 3/2011 |

(Continued)

*Primary Examiner* — Dion R. Ferguson
(74) *Attorney, Agent, or Firm* — Muir Patent Law, PLLC

(57) ABSTRACT

A capacitor wire includes a core electrode line provided in the form of a wire, an outer electrode line covering at least a portion of the core electrode line, and a dielectric line interposed between the core electrode line and the outer electrode line. The outer electrode line comprises material having a melting point lower than material of the core electrode line.

21 Claims, 47 Drawing Sheets

(56) References Cited

U.S. PATENT DOCUMENTS

| | | | | |
|---|---|---|---|---|
| 7,385,220 B2* | 6/2008 | Granstrom | ............ | H10K 10/471 |
| | | | | 257/E51.038 |
| 7,906,803 B2* | 3/2011 | Shioya | ................. | H10D 62/122 |
| | | | | 257/532 |
| 8,169,050 B2 | 5/2012 | Daley et al. | | |
| 8,988,857 B2 | 3/2015 | McConnell et al. | | |
| 9,711,284 B2* | 7/2017 | Doyle | .................... | B82Y 10/00 |
| 2005/0227059 A1* | 10/2005 | Granstrom | ............ | D06M 15/63 |
| | | | | 428/292.1 |
| 2006/0008942 A1* | 1/2006 | Romano | ........... | H01L 21/02639 |
| | | | | 438/758 |
| 2014/0160628 A1* | 6/2014 | Doyle | .................... | H10D 30/43 |
| | | | | 257/532 |
| 2015/0221592 A1 | 8/2015 | Verma et al. | | |
| 2021/0225784 A1 | 7/2021 | Shilimkar et al. | | |
| 2021/0249360 A1 | 8/2021 | Honda | | |
| 2021/0327831 A1 | 10/2021 | Ha et al. | | |
| 2022/0293342 A1* | 9/2022 | Hirao | ...................... | H01G 4/005 |
| 2023/0245828 A1* | 8/2023 | Park | ........................ | H01G 4/28 |
| | | | | 257/737 |
| 2024/0006122 A1* | 1/2024 | Park | ........................ | H01L 24/48 |
| 2024/0021663 A1* | 1/2024 | Park | ........................ | H01G 4/40 |

FOREIGN PATENT DOCUMENTS

| | | | |
|---|---|---|---|
| JP | 2016501440 A | | 1/2016 |
| KR | 20150056855 A | * | 5/2015 |

* cited by examiner

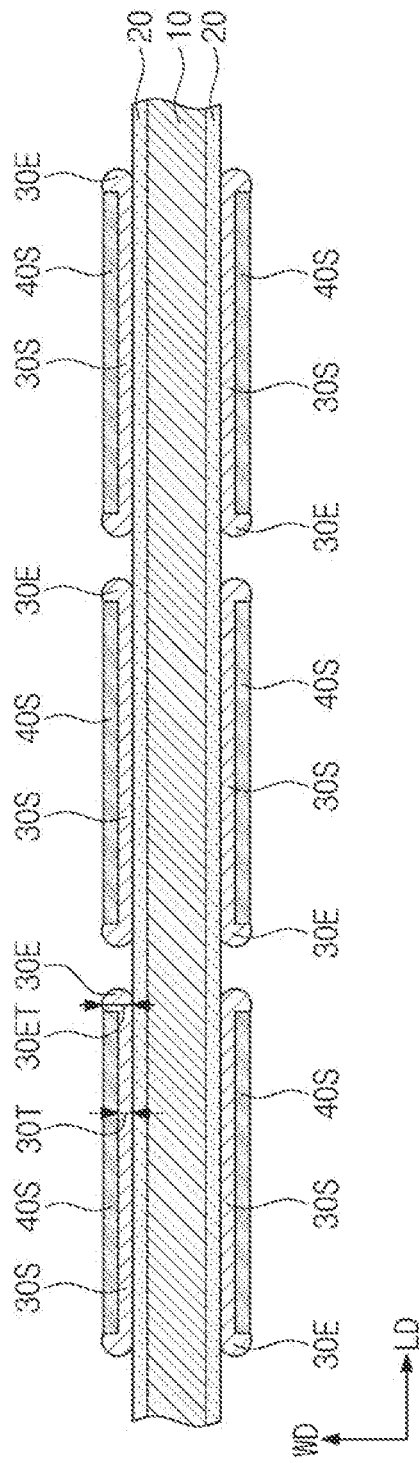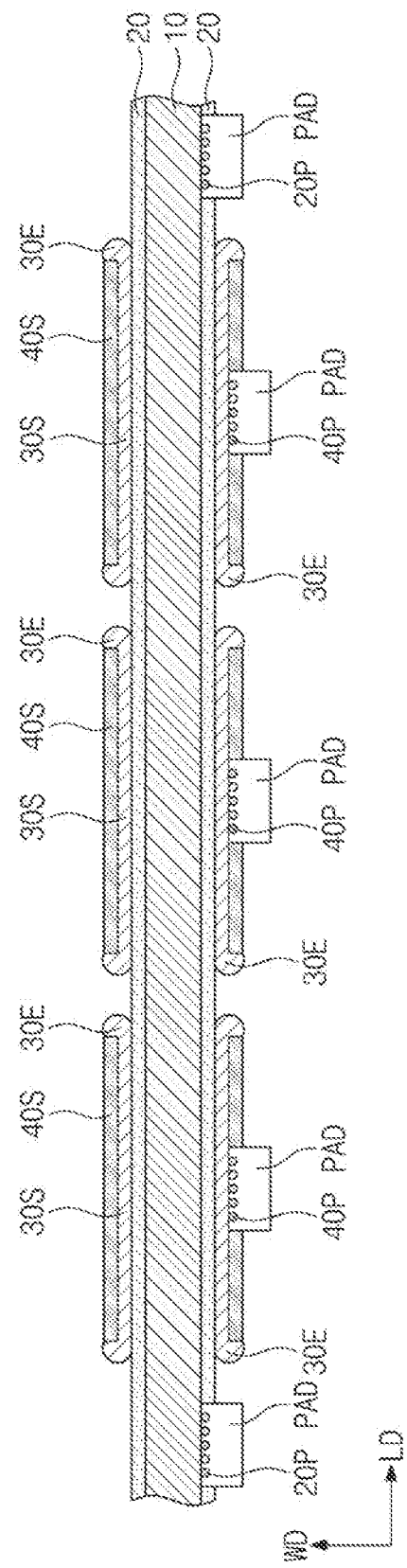

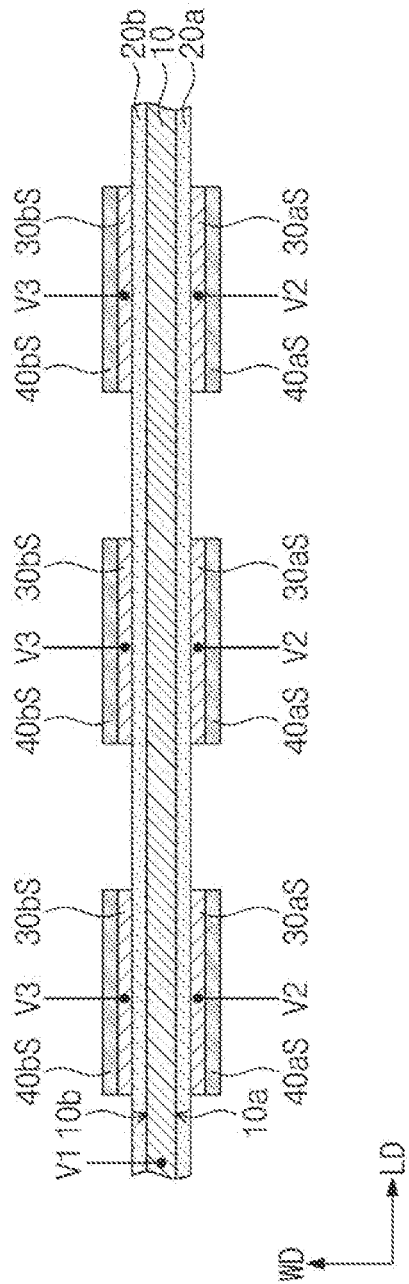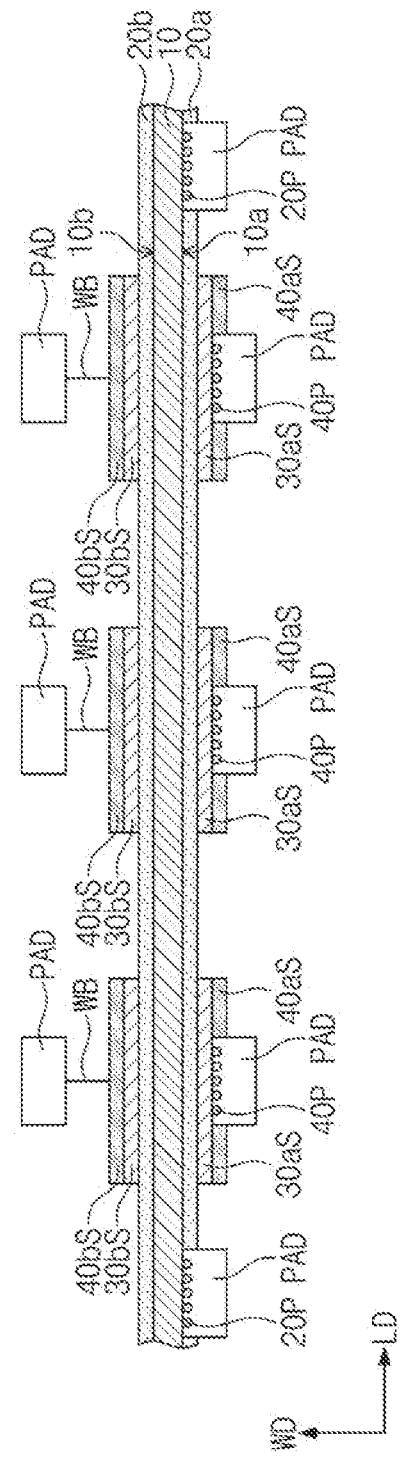

_US 12,451,291 B2_

CAPACITOR WIRE AND ELECTRONIC DEVICE INCLUDING THE SAME

CROSS-REFERENCE TO RELATED APPLICATIONS

This U.S. non-provisional patent application claims priority under 35 U.S.C. § 119 to Korean Patent Application No. 10-2022-0013022, filed on Jan. 28, 2022, in the Korean Intellectual Property Office, the entire contents of which are hereby incorporated by reference.

BACKGROUND OF THE INVENTION

The present disclosure relates to a capacitor wire and an electronic device including the same.

A multi-layer ceramic capacitor (MLCC), which is used as an electric part in various electronic devices, has a small size and a large capacity and is mounted on a substrate using a soldering method. As an example, the multi-layer ceramic capacitor is mounted on a substrate of an electronic device, such as a display device, a computer, and a smart phone, and is used as a chip-shaped condenser for charging or discharging electricity in the electronic device. As a size of the electronic device is reduced, it is necessary to reduce a size of the multi-layer ceramic capacitor. However, due to various difficulty in processes of fabricating and mounting the multi-layer ceramic capacitor, there is a difficulty in reducing the size of the multi-layer ceramic capacitor.

SUMMARY

An embodiment of the inventive concept provides a capacitor wire having a small size and an electronic device including the same.

An embodiment of the inventive concept provides a capacitor wire, which can be easily mounted on a substrate, and an electronic device including the same.

An embodiment of the inventive concept provides a highly-integrated electronic device.

According to an embodiment of the inventive concept, a capacitor wire may include a core electrode line having a wire shape; an outer electrode line covering at least a portion of the core electrode line; and a dielectric line interposed between the core electrode line and the outer electrode line. The outer electrode line may include material having a melting point lower than a melting point of material of the core electrode line.

According to an embodiment of the inventive concept, a capacitor wire may include a core electrode line having a wire shape; an outer electrode line covering at least a portion of the core electrode line and extending in a length direction of the core electrode line; a dielectric line interposed between the core electrode line and the outer electrode line to extend in the length direction of the core electrode line; and a passivation line covering the outer electrode line and extending in the length direction of the core electrode line. The outer electrode line may be interposed between the dielectric line and the passivation line.

According to an embodiment of the inventive concept, an electronic device may include a substrate; pads on the substrate; and a capacitor wire connected to the pads. The capacitor wire may include a core electrode line having a wire shape; an outer electrode line covering at least a portion of the core electrode line and extending in a length direction of the core electrode line; and a dielectric line interposed between the core electrode line and the outer electrode line to extend in the length direction of the core electrode line. The capacitor wire may be connected to corresponding ones of the pads by a wire bonding method.

BRIEF DESCRIPTION OF THE DRAWINGS

FIG. 19 is a sectional view illustrating a modified example of the capacitor wire of FIG. 16 and corresponding to the line A-A' of FIG. 16.

FIG. 20 is a conceptual diagram illustrating an example method of bonding the capacitor wire of FIG. 19.

FIG. 46 is a sectional view taken along a line A-A' of FIG. 45.

FIG. 47 is a conceptual diagram illustrating an example method of bonding the capacitor wire of FIG. 46.

DETAILED DESCRIPTION

Example embodiments of the inventive concepts will now be described more fully with reference to the accompanying drawings, in which example embodiments are shown. Like numbers refer to like elements throughout. As used herein, the term "contact" refers to direct contact (i.e., touching) unless the context indicates otherwise. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Figure 1:
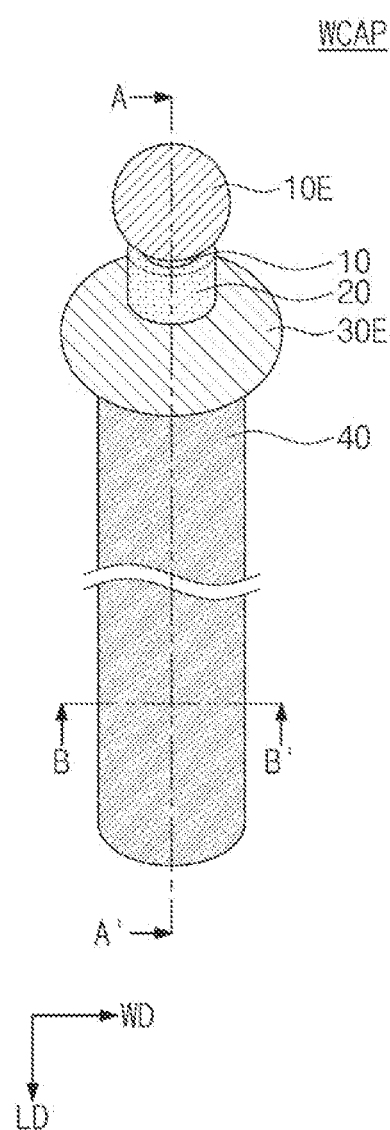
FIG. 1 is a perspective view schematically illustrating a capacitor wire, according to an example embodiment of the inventive concept.
Figure 2A:
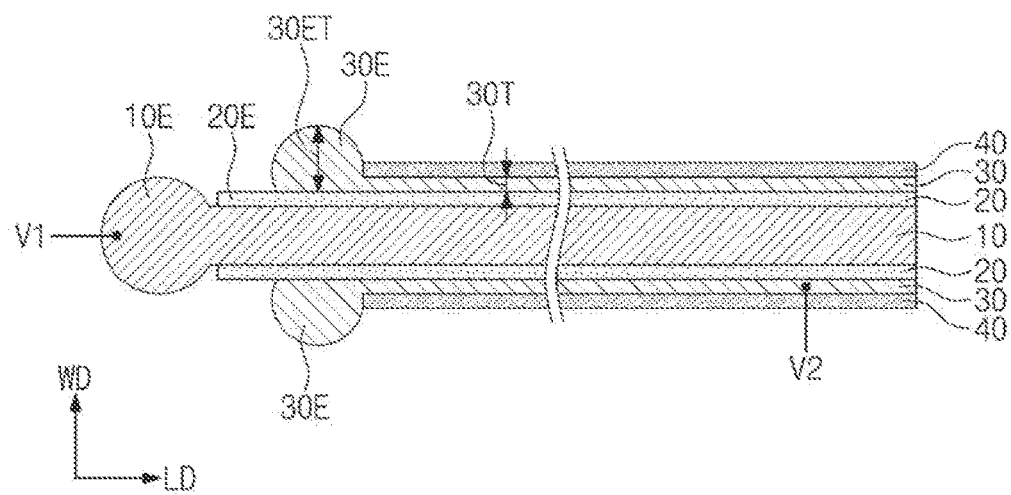
FIG. 2A is a sectional view taken along a line A-A' of FIG. 1.
Figure 2B:
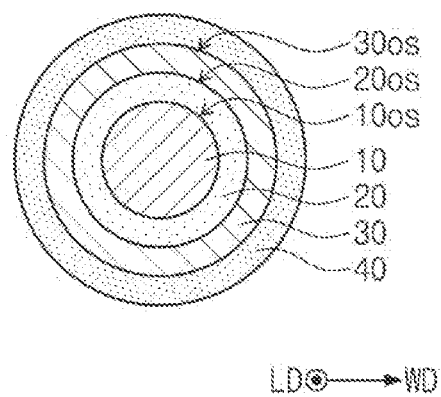
FIG. 2B is a sectional view taken along a line B-B' of FIG. 1.
Figure 2C:
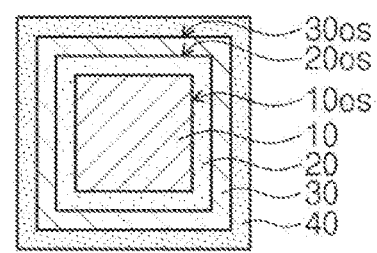
FIG. 2C is a sectional view, which is taken along the line B-B' of FIG. 1 to illustrate a modified example of the capacitor wire of FIG. 1.

FIG. 1 is a schematic perspective view illustrating a capacitor wire according to an example embodiment of the inventive concept. FIG. 2A is a sectional view taken along a line A-A' of FIG. 1, and FIG. 2B is a sectional view taken along a line B-B' of FIG. 1. FIG. 2C is a sectional view, which is taken along the line B-B' of FIG. 1 to illustrate a modified example of the capacitor wire of FIG. 1.

Referring to FIGS. 1 and 2A to 2C, a capacitor wire WCAP may include a core electrode line 10, an outer electrode line 30 covering at least a portion of the core electrode line 10, a dielectric line 20 interposed between the core electrode line 10 and the outer electrode line 30, and a passivation line 40 covering at least a portion of the outer electrode line 30. In example embodiments, an inner surface of the dielectric line 20 may contact an outer circumferential surface 10os of the core electrode line 10, an inner surface of the outer electrode line 30 may contact an outer circumferential surface 20os of the dielectric line 20, and an inner surface of the passivation line 40 may contact an outer circumferential surface 30os of the outer electrode line 30.

The core electrode line 10 may have a wire shape and may be elongated in a specific direction. The specific direction may be referred to as a length direction LD of the core electrode line 10, and a direction perpendicular to the length direction LD may be referred to as a width direction WD. In an embodiment, as shown in FIG. 2B, the core electrode line 10 may have a rounded or cylindrical (e.g., circular) shape, when viewed in a section taken along the width direction WD. In another embodiment, as shown in FIG. 2C, the core electrode line 10 may have a polygonal (e.g., rectangular) shape, when viewed in a section taken along the width direction WD. The core electrode line 10 may include a first metal, and for example, the first metal may include at least one of Au, Ag, Pd, Cu, or Al.

The dielectric line 20 may cover at least a portion of the core electrode line 10 and may be extended in the length direction LD between the core electrode line 10 and the outer electrode line 30. The dielectric line 20 may enclose an outer circumference surface 10os of the core electrode line 10 and may be extended along the outer circumference surface 10os of the core electrode line 10 or in the length direction LD. The dielectric line 20 may be formed of or may include at least one of ceramic materials (e.g., $Al_2O_3$).

The outer electrode line 30 may cover at least a portion of the dielectric line 20 and may be extended in the length direction LD between the dielectric line 20 and the passivation line 40. The outer electrode line 30 may enclose an outer circumference surface 20os of the dielectric line 20 and may be extended along the outer circumference surface 20os of the dielectric line 20 or in the length direction LD. The outer electrode line 30 may be electrically disconnected or isolated from the core electrode line 10 by the dielectric line 20.

The outer electrode line 30 may be formed of at least one of materials (e.g., metal alloys) having melting points lower than the core electrode line 10. In addition, the outer electrode line 30 may be formed of at least one of materials (e.g., metal alloys) having mechanical strengths smaller than the core electrode line 10. As an example, the outer electrode line 30 may include a second metal, which is different from the first metal, or an alloy of the second metal. As an example, the outer electrode line 30 may include at least one of arsenic-copper alloy, aluminum-cerium alloy, aluminum-scandium alloy, silver-germanium alloy, silver-palladium alloy, aluminum-indium alloy, field's metal, arsenic-antimony alloy, aluminum-magnesium alloy, magnesium-praseodymium alloy, arsenic-tin alloy, aluminum-silicon alloy, gold-magnesium alloy, aluminum-gold alloy, silver-aluminum alloy, gold-lanthanum alloy, aluminum-copper alloy, silver-calcium alloy, aluminum-calcium alloy, silver-arsenic alloy, silver-cerium alloy, gold-cerium alloy, silver-lanthanum alloy, magnesium-nickel alloy, gold-cadmium alloy, silver-antimony alloy, silver-magnesium alloy, silver-strontium alloy, babbitt metal, aluminum-germanium alloy, magnesium-strontium alloy, gold-tellurium alloy, aluminum-zinc alloy, gold-silicon alloy, gold-antimony alloy, gold-germanium alloy, silver-tellurium alloy, magnesium-zinc alloy, or silver-lead alloy.

The passivation line 40 may cover at least a portion of the outer electrode line 30 and may be extended in the length direction LD, on the outer electrode line 30. The passivation line 40 may enclose an outer circumference surface 30os of the outer electrode line 30 and may be extended along the outer circumference surface 30os of the outer electrode line 30 and in the length direction LD. The outer electrode line 30 may be interposed between the dielectric line 20 and the passivation line 40. The passivation line 40 may be formed of or may include at least one of ceramic materials (e.g., $Al_2O_3$) or metallic materials (e.g., Au, Ni, and Pd).

An end portion 10E of the core electrode line 10 may not be covered with the dielectric line 20, the outer electrode line 30, and the passivation line 40, and may be exposed to the outside. In an embodiment, the end portion 10E of the core electrode line 10 may be provided in the form of a ball. The dielectric line 20 may include an end portion 20E, which is adjacent to the end portion 10E of the core electrode line 10, is not covered with the outer electrode line 30 and the passivation line 40, and is exposed to the outside. In example embodiments, the end portion 20E of the dielectric line 20 may be spaced apart from the end portion 10E of the core electrode line 10. An end portion 30E of the outer electrode line 30 may be provided near the end portion 10E of the core electrode line 10 and adjacent to the end portion 20E of the dielectric line 20. The end portion 30E of the outer electrode line 30 may not be covered with the passivation line 40 and may be exposed to the outside.

The outer electrode line 30 may have a thickness measured in the width direction WD from an interface between the outer electrode line 30 and the dielectric line 20 (e.g., the outer circumference surface 20os of the dielectric line 20). In an embodiment, a thickness 30ET of the end portion 30E of the outer electrode line 30 may be larger than a thickness 30T of the outer electrode line 30. For example, the thickness 30ET of the end portion 30E of the outer electrode line 30 may be larger than the thickness 30T of other portions of the outer electrode line 30. In this case, the end portion 30E of the outer electrode line 30 may have a ring shape enclosing the outer circumference surface 20os of the dielectric line 20.

A first voltage V1 may be applied to the core electrode line 10 through the end portion 10E of the core electrode line 10, and a second voltage V2 may be applied to the outer electrode line 30. The first and second voltages V1 and V2 may be different from each other. As an example, one of the first and second voltages V1 and V2 may be a power voltage, and the other of the first and second voltages V1 and V2 may be a ground voltage. Since the core electrode line 10 and the outer electrode line 30 are applied with different voltages, electric charges may be accumulated in the dielectric line 20. Accordingly, the capacitor wire WCAP, which has a wire shape and is used as a capacitor, may be realized.

Figure 3A:
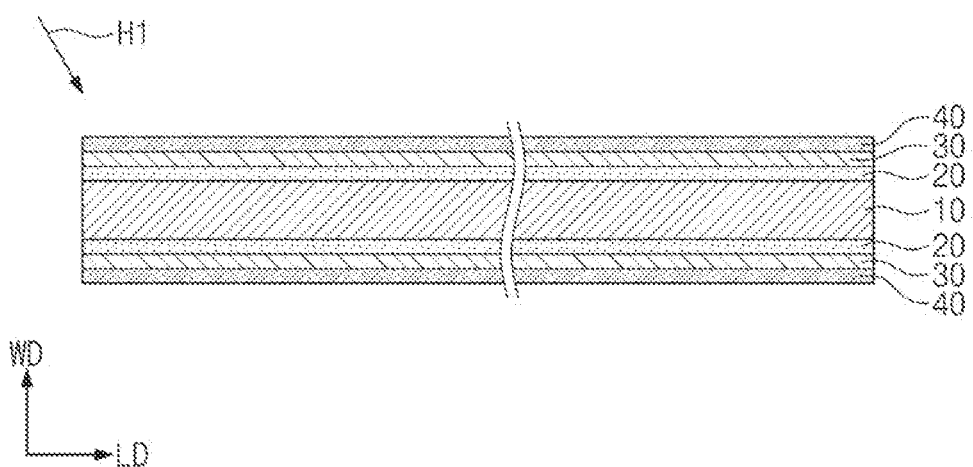
FIGS. 3A and 3B are sectional views illustrating an example method of fabricating the capacitor wire of FIG. 1 and corresponding to the line A-A' of FIG. 1.
Figure 3B:
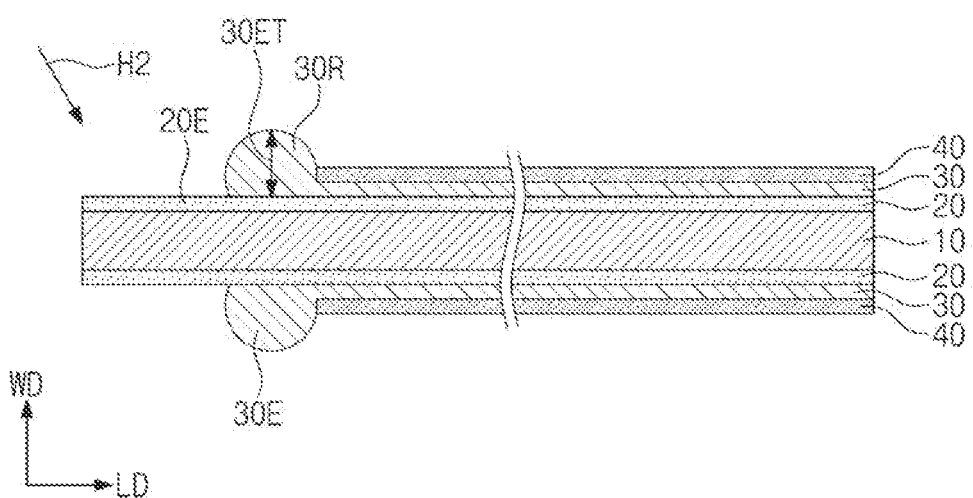

FIGS. 3A and 3B are sectional views illustrating a method of fabricating the capacitor wire of FIG. 1 and corresponding to the line A-A' of FIG. 1. For the sake of brevity, description of features overlapped with the capacitor wire described with reference to FIGS. 1, 2A, and 2B will be omitted.

Referring to FIGS. 2B and 3A, a core electrode line 10 having a wire shape may be provided. A dielectric line 20 may be formed to enclose an outer circumference surface 10os of the core electrode line 10 and may be formed by a physical vapor deposition method, a chemical vapor deposition method, or an atomic layer deposition method. An outer electrode line 30 may be formed to enclose an outer circumference surface 20os of the dielectric line 20, and a passivation line 40 may be formed to enclose an outer circumference surface 30os of the outer electrode line 30. Each of the outer electrode line 30 and the passivation line 40 may be formed by, for example, a physical vapor deposition method, a chemical vapor deposition method, or an atomic layer deposition method. A first heating process H1 may be performed on an end portion of the passivation line 40. The first heating process H1 may be performed using, for example, a laser beam or an electric spark.

Referring to FIGS. 2B and 3B, as a result of the first heating process H1, a portion of the passivation line 40 may be removed and a portion of the outer electrode line 30 may be melted. Since the portion of the outer electrode line 30 is melted, the outer electrode line 30 may be formed such that an end portion 30E thereof has a relatively large thickness 30ET in the width direction WD. The end portion 30E of the outer electrode line 30 may have a ring shape enclosing the outer circumference surface 20os of the dielectric line 20 and may expose an end portion 20E of the dielectric line 20. Thereafter, a second heating process H2 may be performed on the exposed end portion 20E of the dielectric line 20. The second heating process H2 may be performed using, for example, a laser beam or an electric spark.

Referring back to FIGS. 2A and 2B, as a result of the second heating process H2, a portion of the exposed end portion 20E of the dielectric line 20 may be removed and an end portion 10E of the core electrode line 10 may be exposed. As a result of the second heating process H2, the end portion 10E of the core electrode line 10 may be formed to have a ball shape. The capacitor wire WCAP of FIG. 1 may be fabricated by the afore-described method.

Figure 4A:
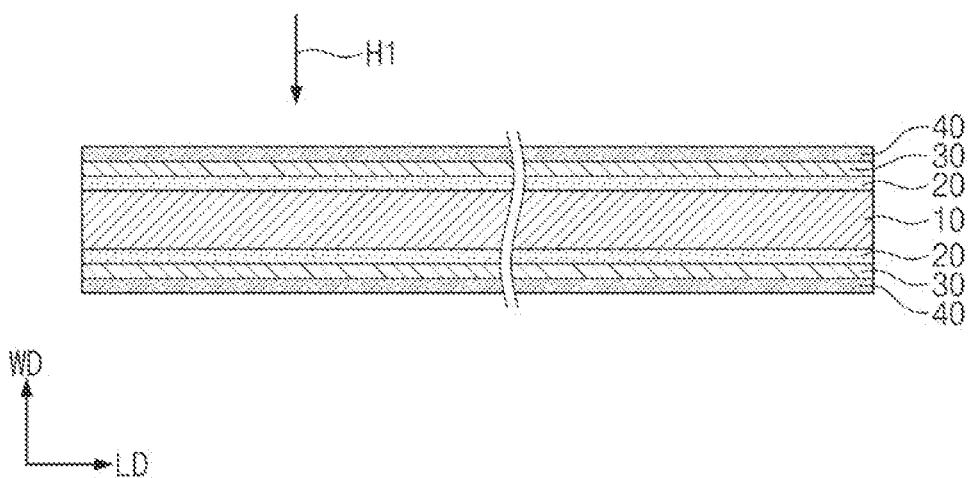
FIGS. 4A and 4B are sectional views illustrating an example method of fabricating the capacitor wire of FIG. 1 and corresponding to the line A-A' of FIG. 1.
Figure 4B:
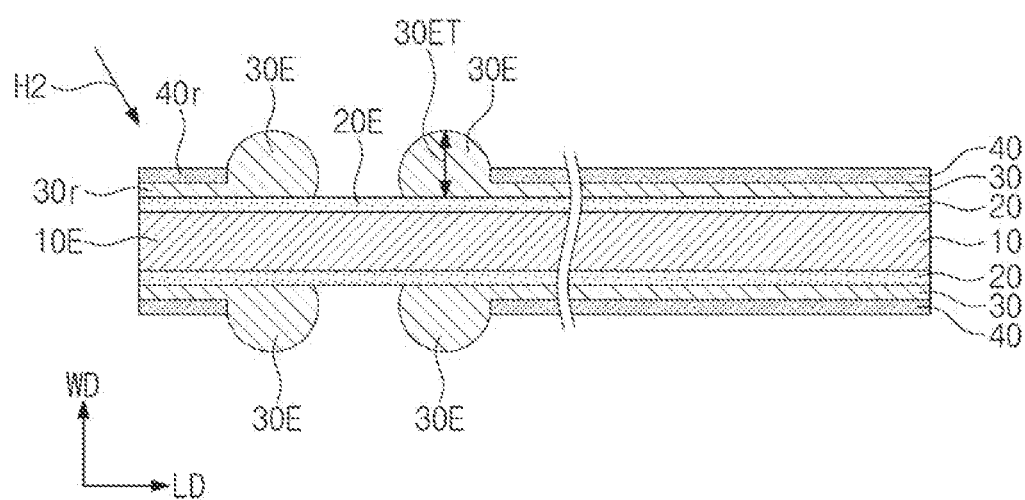

FIGS. 4A and 4B are sectional views illustrating an example method of fabricating the capacitor wire of FIG. 1 and corresponding to the line A-A' of FIG. 1. For the sake of brevity, features, which are different from the fabrication method of FIGS. 3A and 3B, will be mainly described below.

Referring to FIGS. 2B, 4A, and 4B, the first heating process H1 in an embodiment may be performed on an intermediate portion of the passivation line 40. As a result of the first heating process H1, a portion of the passivation line 40 may be removed and a portion of the outer electrode line 30 may be melted. Since the portion of the outer electrode line 30 is melted, the outer electrode line 30 may be formed such that an end portion 30E thereof has a relatively large thickness 30ET in the width direction WD. The end portion 30E of the outer electrode line 30 may have a ring shape enclosing the outer circumference surface 20os of the dielectric line 20 and may expose an end portion 20E of the dielectric line 20.

Since the first heating process H1 is performed on the intermediate portion of the passivation line 40, a remaining portion 40r of the passivation line 40 and a remaining portion 30r of the outer electrode line 30 may be left on the end portion 20E of the dielectric line 20. Thereafter, a second heating process H2 may be performed on the end portion 20E of the dielectric line 20.

Referring back to FIGS. 2A and 2B, as a result of the second heating process H2, the remaining portion 40r of the passivation line 40 may be removed, and the remaining portion 30r of the outer electrode line 30 may be melted. In addition, as a result of the second heating process H2, a portion of the end portion 20E of the dielectric line 20 may be removed, and an end portion 10E of the core electrode line 10 may be exposed. The remaining portion 30r of the outer electrode line 30 and the end portion 10E of the core electrode line 10 may be melted and mixed by the second heating process H2 and may be formed to have a ball shape. In the present embodiment, since the remaining portion 30r of the outer electrode line 30 and the end portion 10E of the core electrode line 10 are melted and mixed, the ball-shaped end portion 10E of the core electrode line 10 may contain both of the first and second metals.

Figure 5:
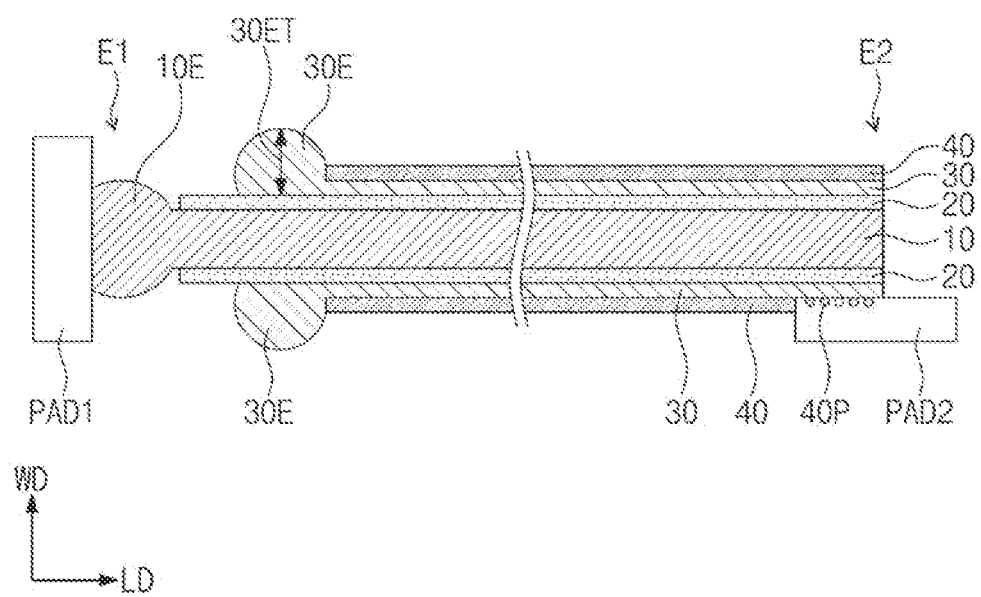
FIG. 5 is a conceptual diagram illustrating an example method of bonding the capacitor wire of FIG. 1.

FIG. 5 is a conceptual diagram illustrating an example method of bonding the capacitor wire of FIG. 1.

Referring to FIGS. 1 and 5, the capacitor wire WCAP may be connected to pads PAD1 and PAD2 by a wire bonding method. The pads PAD1 and PAD2 may be provided on a surface of a substrate and may be formed of or may include at least one of conductive materials. The capacitor wire WCAP may have a first end portion E1 and a second end portion E2, which are opposite to each other in the length direction LD. The first end portion E1 of the capacitor wire WCAP may include the end portion 10E of the core electrode line 10, which is not covered with the passivation line 40, the outer electrode line 30, and the dielectric line 20, and is exposed to the outside. The end portion 10E of the core electrode line 10 may be provided in the form of a ball. In the first end portion E1 of the capacitor wire WCAP, the end portion 10E of the core electrode line 10 may be connected to a first pad PAD1, which is one of the pads PAD1 and PAD2, by a ball bonding method. For example, the end portion 10E of the core electrode line 10 may directly contact the first pad PAD1.

The first end portion E1 of the capacitor wire WCAP may further include the end portion 30E of the outer electrode line 30 having a relatively large thickness 30ET in the width direction WD. The end portion 30E of the outer electrode line 30 may have a ring shape. The second end portion E2 of the capacitor wire WCAP may include an opposite end portion of the outer electrode line 30. In the second end portion E2 of the capacitor wire WCAP, the opposite end portion of the outer electrode line 30 may be connected to a second pad PAD2, which is another of the pads PAD1 and PAD2, by a wedge bonding method. For example, a portion of the opposite end portion of the outer electrode line 30 may not be covered by the passivation line 40, and may be in direct contact with the second pad PAD2. In an embodiment, the passivation line 40 may be formed of or may include at least one of insulating or ceramic materials (e.g., $Al_2O_3$), and in this case, passivation particles 40P may be left in a bonding interface between the opposite end portion of the outer electrode line 30 and the second pad PAD2.

Figure 6:
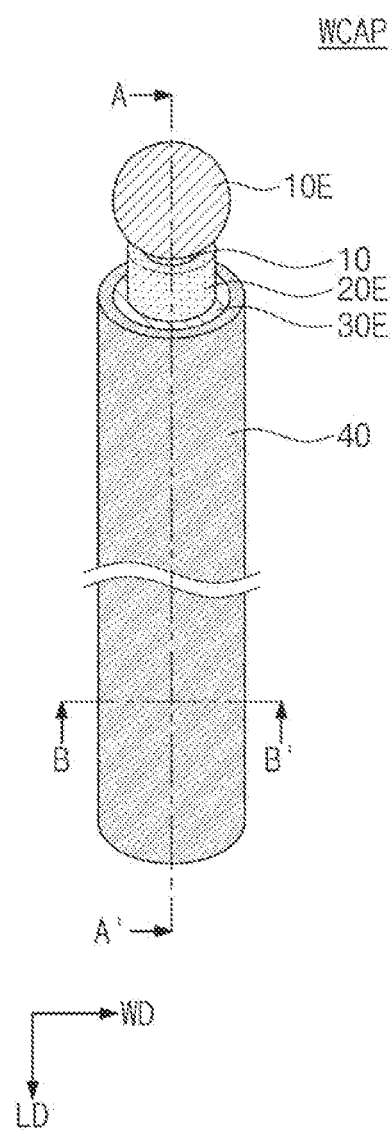
FIG. 6 is a perspective view schematically illustrating a capacitor wire, according to an example embodiment of the inventive concept.
Figure 7A:
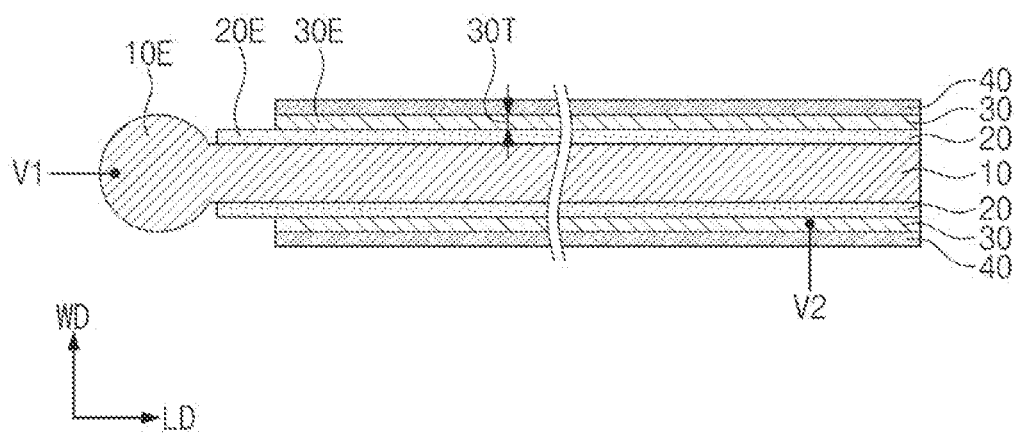
FIG. 7A is a sectional view taken along a line A-A' of FIG. 6.
Figure 7B:
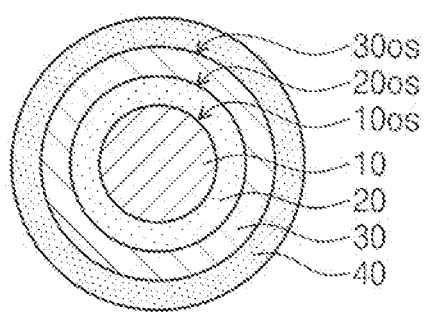
FIG. 7B is a sectional view taken along a line B-B' of FIG. 6.

FIG. 6 is a perspective view schematically illustrating a capacitor wire according to an example embodiment of the inventive concept. FIG. 7A is a sectional view taken along a line A-A' of FIG. 6, and FIG. 7B is a sectional view taken along a line B-B' of FIG. 6. For the sake of brevity, features, which are different from the capacitor wire of FIGS. 1 and 2A to 2C, will be mainly described below.

Referring to FIGS. 6, 7A, and 7B, a capacitor wire WCAP may include a core electrode line 10, an outer electrode line 30 covering at least a portion of the core electrode line 10, a dielectric line 20 interposed between the core electrode line 10 and the outer electrode line 30, and a passivation line 40 covering at least a portion of the outer electrode line 30.

The core electrode line 10 may be provided in the form of a wire and may have a rounded shape (e.g., circular shape) when viewed in a section taken along the width direction WD. As another example, the core electrode line 10 may have a polygonal (e.g., rectangular) shape, when viewed in a section taken along the width direction WD, as described with reference to FIG. 2C. The dielectric line 20 may enclose an outer circumference surface 10os of the core electrode line 10 and may be extended along the outer circumference surface 10os of the core electrode line 10 or in the length direction LD. The outer electrode line 30 may enclose an outer circumference surface 20os of the dielectric line 20 and may be extended along the outer circumference surface 20os of the dielectric line 20 or in the length direction LD. The passivation line 40 may enclose an outer circumference surface 30os of the outer electrode line 30 and may be extended along the outer circumference surface 30os of the outer electrode line 30 and in the length direction LD.

An end portion 10E of the core electrode line 10 may not be covered with the dielectric line 20, the outer electrode line 30, and the passivation line 40 and may be exposed to the outside. In an embodiment, the end portion 10E of the core electrode line 10 may be provided in the form of a ball. The dielectric line 20 may include an end portion 20E, which is adjacent to the end portion 10E of the core electrode line 10, is not covered with the outer electrode line 30 and the passivation line 40, and is exposed to the outside. An end portion 30E of the outer electrode line 30 may be provided near the end portion 10E of the core electrode line 10 and adjacent to the end portion 20E of the dielectric line 20. In an embodiment, the end portion 30E of the outer electrode line 30 may be covered with the passivation line 40. In example embodiments, end surfaces of the outer electrode line 30 and the passivation line 40 may be coplanar with one another. The end portion 30E of the outer electrode line 30 may have substantially the same thickness (i.e., 30T) as the outer electrode line 30. Except for the afore-described differences, the capacitor wire WCAP according to the present embodiment may be substantially the same as the capacitor wire WCAP described with reference to FIGS. 1, 2A, and 2B.

Figure 8A:
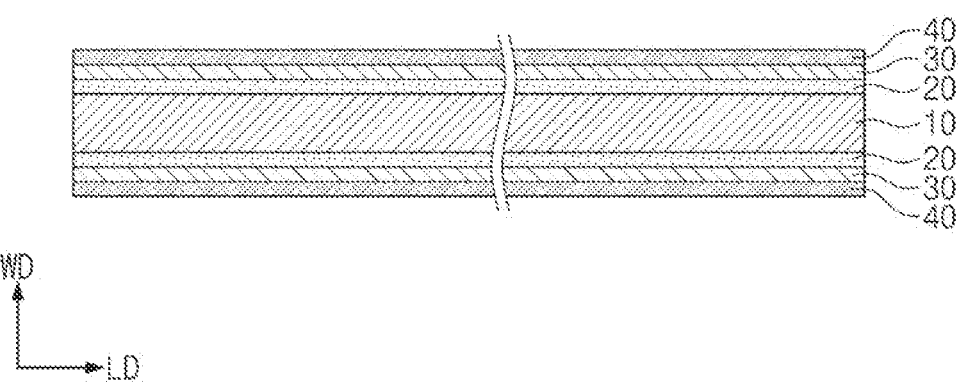
FIGS. 8A and 8B are sectional views illustrating an example method of fabricating the capacitor wire of FIG. 6 and corresponding to the line A-A' of FIG. 6.
Figure 8B:
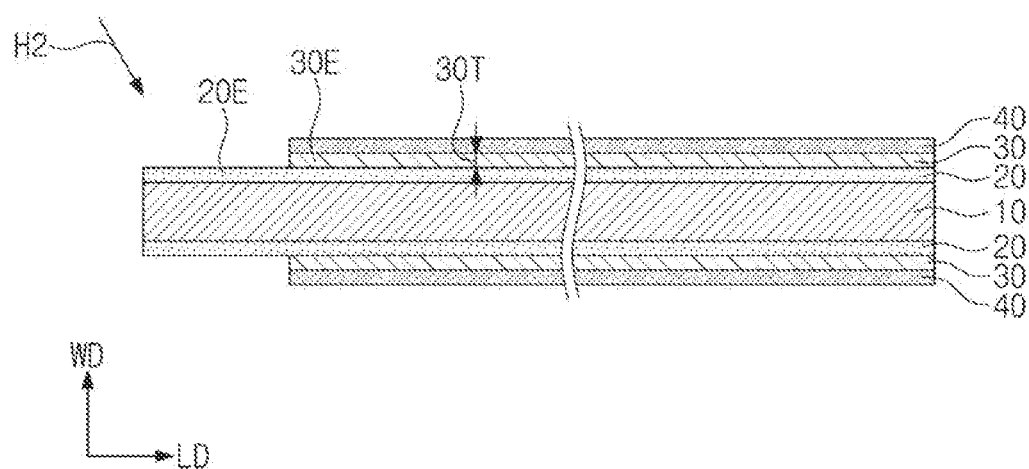

FIGS. 8A and 8B are sectional views illustrating a method of fabricating the capacitor wire of FIG. 6 and corresponding to the line A-A' of FIG. 6. For the sake of brevity, features, which are different from the fabrication method of FIGS. 3A and 3B, will be mainly described below.

Referring to FIGS. 7B and 8A, a core electrode line 10 having a wire shape may be provided. A dielectric line 20 may be formed to enclose an outer circumference surface 10os of the core electrode line 10, and an outer electrode line 30 may be formed to enclose an outer circumference surface 20os of the dielectric line 20. A passivation line 40 may be formed to enclose an outer circumference surface 30os of the outer electrode line 30.

Referring to FIGS. 7B and 8B, a portion of the passivation line 40 and a portion of the outer electrode line 30 may be removed, and thus, an end portion 20E of the dielectric line 20 may be exposed. The portion of the passivation line 40 and the portion of the outer electrode line 30 may be removed using, for example, a dry or wet etching process. In this case, an end portion 30E of the outer electrode line 30 may be covered with the passivation line 40 and may have substantially the same thickness 30T as the outer electrode line 30. Thereafter, a heating process H2 may be performed on the exposed end portion 20E of the dielectric line 20. The heating process H2 may be performed using, for example, a laser beam or an electric spark.

Referring back to FIGS. 7A and 7B, as a result of the heating process H2, a portion of the exposed end portion 20E of the dielectric line 20 may be removed and an end portion 10E of the core electrode line 10 may be exposed. As a result of the second heating process H2, the end portion 10E of the core electrode line 10 may be formed to have a ball shape. The capacitor wire WCAP of FIG. 6 may be fabricated by the afore-described method.

Figure 9:
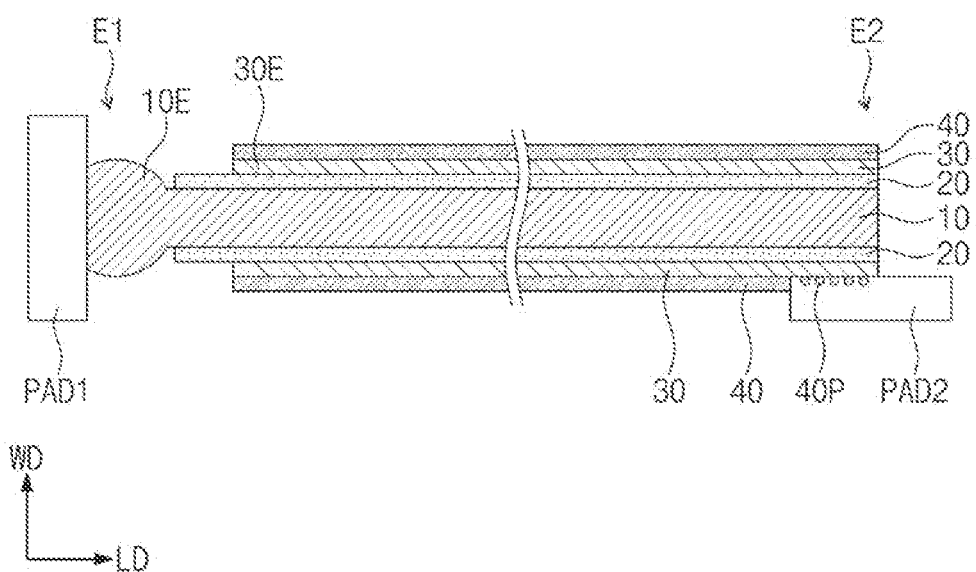
FIG. 9 is a conceptual diagram illustrating an example method of bonding the capacitor wire of FIG. 6.

FIG. 9 is a conceptual diagram illustrating an example method of bonding the capacitor wire of FIG. 6.

Referring to FIGS. 6 and 9, the capacitor wire WCAP may be connected to pads PAD1 and PAD2 by a wire bonding method. The capacitor wire WCAP may have a first end portion E1 and a second end portion E2, which are opposite to each other in the length direction LD. The first end portion E1 of the capacitor wire WCAP may include the end portion 10E of the core electrode line 10, which is not covered with the passivation line 40, the outer electrode line 30, and the dielectric line 20, and is exposed to the outside. The end portion 10E of the core electrode line 10 may be provided in the form of a ball. In the first end portion E1 of the capacitor wire WCAP, the end portion 10E of the core electrode line 10 may be connected to a first pad PAD1, which is one of the pads PAD1 and PAD2, by a ball bonding method.

The first end portion E1 of the capacitor wire WCAP may include an end portion 30E of the outer electrode line 30, and the second end portion E2 of the capacitor wire WCAP may include an opposite end portion of the outer electrode line 30. In the second end portion E2 of the capacitor wire WCAP, the opposite end portion of the outer electrode line 30 may be connected to a second pad PAD2, which is another of the pads PAD1 and PAD2, by a wedge bonding method. In an embodiment, the passivation line 40 may be formed of or may include at least one of insulating or ceramic materials (e.g., $Al_2O_3$), and in this case, passivation particles 40P may be left in a bonding interface between the opposite end portion of the outer electrode line 30 and the second pad PAD2.

Figure 10:
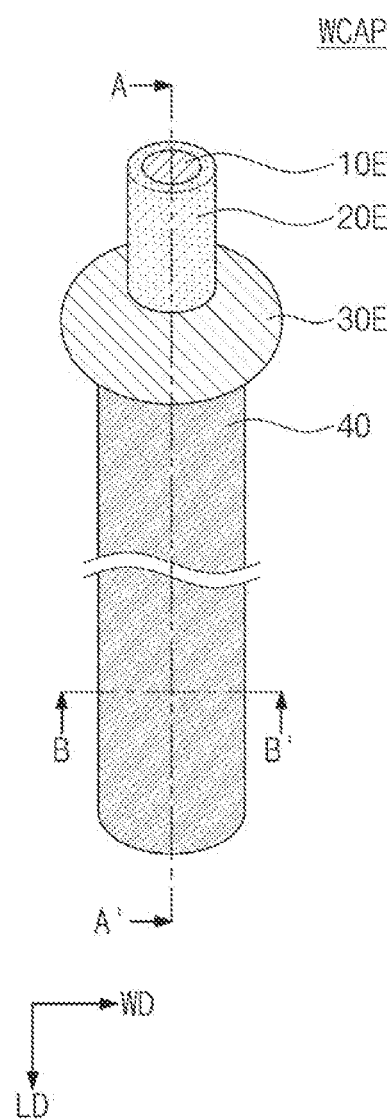
FIG. 10 is a perspective view schematically illustrating a capacitor wire, according to an example embodiment of the inventive concept.
Figure 11A:
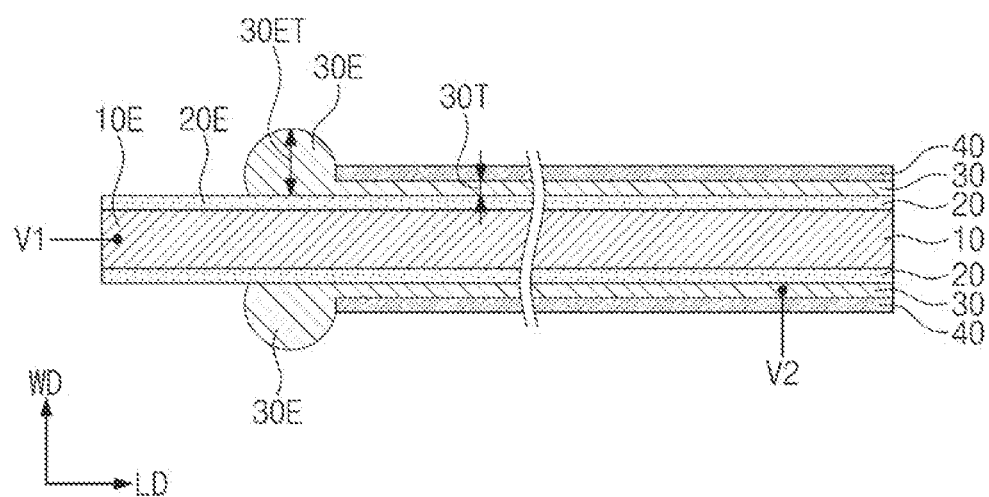
FIG. 11A is a sectional view taken along a line A-A' of FIG. 10.
Figure 11B:
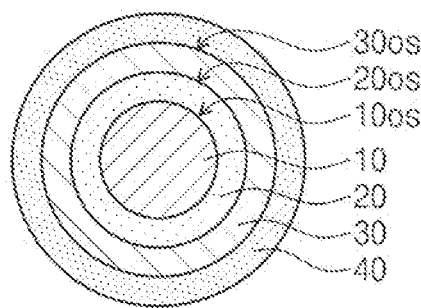
FIG. 11B is a sectional view taken along a line B-B' of FIG. 10.

FIG. 10 is a perspective view schematically illustrating a capacitor wire according to an example embodiment of the inventive concept. FIG. 11A is a sectional view taken along a line A-A' of FIG. 10, and FIG. 11B is a sectional view taken along a line B-B' of FIG. 10. For the sake of brevity, features, which are different from the capacitor wire of FIGS. 1 and 2A to 2C, will be mainly described below.

Referring to FIGS. 10, 11A, and 11B, a capacitor wire WCAP may include a core electrode line 10, an outer electrode line 30 covering at least a portion of the core electrode line 10, a dielectric line 20 interposed between the core electrode line 10 and the outer electrode line 30, and a passivation line 40 covering at least a portion of the outer electrode line 30.

The core electrode line 10 may be provided in the form of a wire and may have a rounded shape (e.g., circular shape) when viewed in a section taken along the width direction WD. As another example, the core electrode line 10 may have a polygonal (e.g., rectangular) shape, when viewed in a section taken along the width direction WD, as described with reference to FIG. 2C. The dielectric line 20 may enclose an outer circumference surface 10os of the core electrode line 10 and may be extended along the outer circumference surface 10os of the core electrode line 10 or in the length direction LD. In example embodiments, end surfaces of the core electrode line 10 and the dielectric line 20 may be coplanar with one another. The outer electrode line 30 may enclose an outer circumference surface 20os of the dielectric line 20 and may be extended along the outer circumference surface 20os of the dielectric line 20 or in the length direction LD. The passivation line 40 may enclose an outer circumference surface 30os of the outer electrode line 30 and may be extended along the outer circumference surface 30os of the outer electrode line 30 and in the length direction LD.

An end portion 10E of the core electrode line 10 may be enclosed by an end portion 20E of the dielectric line 20. The end portion 20E of the dielectric line 20 may not be covered with the outer electrode line 30 and the passivation line 40 and may be exposed to the outside. An end portion 30E of the outer electrode line 30 may be adjacent to the end portion 20E of the dielectric line 20, may not be covered with the passivation line 40, and may be exposed to the outside. In an embodiment, a thickness 30ET of the end portion 30E of the outer electrode line 30 may be larger than a thickness 30T of the outer electrode line 30. For example, the thickness 30ET of the end portion 30E of the outer electrode line 30 may be larger than the thickness 30T of the other portions of the outer electrode line 30. In this case, the end portion 30E of the outer electrode line 30 may have a ring shape enclosing the outer circumference surface 20os of the dielectric line 20. Except for the afore-described differences, the capacitor wire WCAP according to the present embodiment may be configured to have substantially the same features as the capacitor wire WCAP described with reference to FIGS. 1 and 2A to 2C.

In the present embodiment, the second heating process H2 described with reference to FIG. 3B is not performed on the exposed end portion 20E of the dielectric line 20, and except for this difference, the capacitor wire WCAP may be formed by substantially the same method as that for the capacitor wire of FIGS. 3A and 3B.

Figure 12:
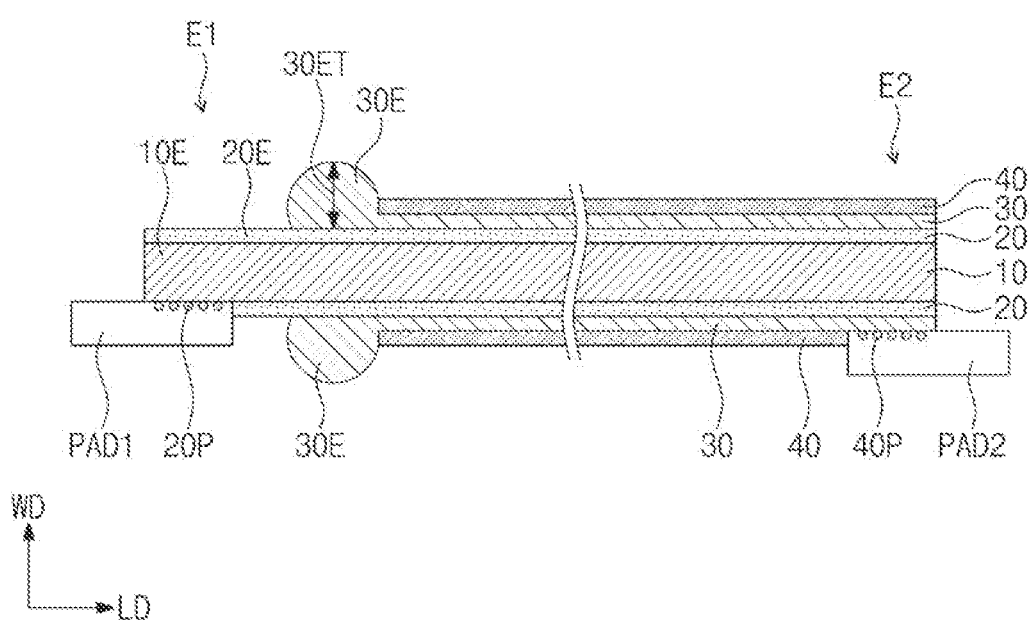
FIG. 12 is a conceptual diagram illustrating an example method of bonding the capacitor wire of FIG. 10.

FIG. 12 is a conceptual diagram illustrating a method of bonding the capacitor wire of FIG. 10.

Referring to FIGS. 10 and 12, the capacitor wire WCAP may be connected to pads PAD1 and PAD2 by a wire bonding method. The capacitor wire WCAP may have a first end portion E1 and a second end portion E2, which are opposite to each other in the length direction LD. The first end portion E1 of the capacitor wire WCAP may include the end portion 20E of the dielectric line 20, which is not covered with the passivation line 40 and the outer electrode line 30 and is exposed to the outside, and the end portion 10E of the core electrode line 10, which is enclosed by the end portion 20E of the dielectric line 20. In the first end portion E1 of the capacitor wire WCAP, the end portion 10E of the core electrode line 10 may be connected to a first pad PAD1, which is one of the pads PAD1 and PAD2, in a wedge bonding method. The dielectric line 20 may be formed of or may include at least one of insulating or ceramic materials (e.g., $Al_2O_3$), and in this case, insulating particles 20P may be left in a bonding interface between the end portion 10E of the core electrode line 10 and the first pad PAD1.

The first end portion E1 of the capacitor wire WCAP may further include the end portion 30E of the outer electrode line 30 having a relatively large thickness 30ET. The end portion 30E of the outer electrode line 30 may have a ring shape. The second end portion E2 of the capacitor wire WCAP may include an opposite end portion of the outer electrode line 30. In the second end portion E2 of the capacitor wire WCAP, the opposite end portion of the outer electrode line 30 may be connected to a second pad PAD2, which is another of the pads PAD1 and PAD2, by a wedge bonding method. In an embodiment, the passivation line 40 may be formed of or may include at least one of insulating or ceramic materials (e.g., $Al_2O_3$), and in this case, passivation particles 40P may be left in a bonding interface between the opposite end portion of the outer electrode line 30 and the second pad PAD2.

Figure 13:
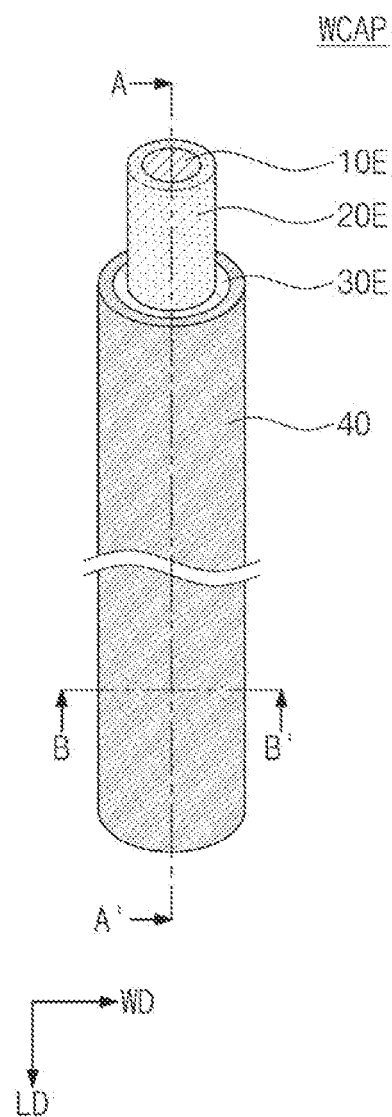
FIG. 13 is a perspective view schematically illustrating a capacitor wire, according to an embodiment of the inventive concept.
Figure 14A:
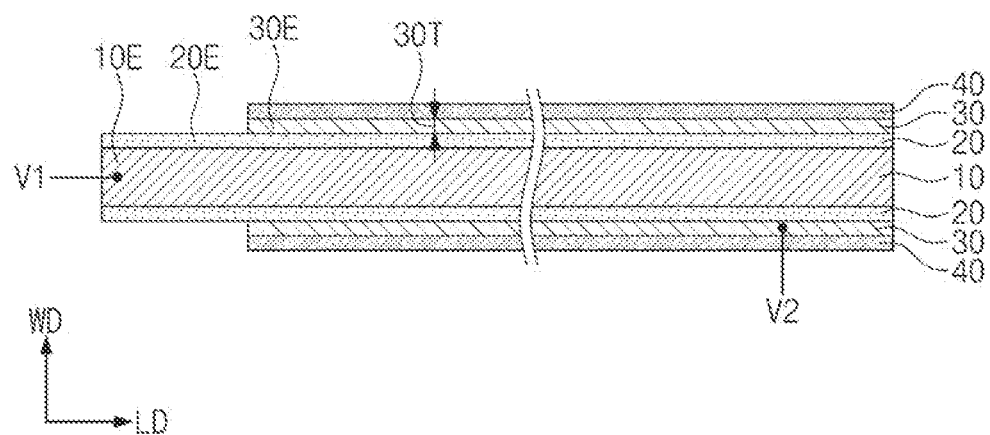
FIG. 14A is a sectional view taken along a line A-A' of FIG. 13.
Figure 14B:
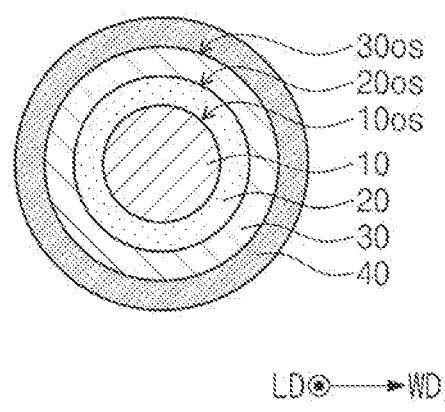
FIG. 14B is a sectional view taken along a line B-B' of FIG. 13.

FIG. 13 is a perspective view schematically illustrating a capacitor wire according to an example embodiment of the inventive concept. FIG. 14A is a sectional view taken along a line A-A' of FIG. 13, and FIG. 14B is a sectional view taken along a line B-B' of FIG. 13. For the sake of brevity, features, which are different from the capacitor wire of FIGS. 1 and 2A to 2C, will be mainly described below.

Referring to FIGS. 13, 14A, and 14B, a capacitor wire WCAP may include a core electrode line 10, an outer electrode line 30 covering at least a portion of the core electrode line 10, a dielectric line 20 interposed between the core electrode line 10 and the outer electrode line 30, and a passivation line 40 covering at least a portion of the outer electrode line 30.

The core electrode line 10 may be provided in the form of a wire and may have a rounded shape (e.g., circular shape) when viewed in a section taken along the width direction WD. As another example, the core electrode line 10 may have a polygonal (e.g., rectangular) shape, when viewed in a section taken along the width direction WD, as described with reference to FIG. 2C. The dielectric line 20 may enclose an outer circumference surface 10os of the core electrode line 10 and may be extended along the outer circumference surface 10os of the core electrode line 10 or in the length direction LD. The outer electrode line 30 may enclose an outer circumference surface 20os of the dielectric line 20 and may be extended along the outer circumference surface 20os of the dielectric line 20 or in the length direction LD. The passivation line 40 may enclose an outer circumference surface 30os of the outer electrode line 30 and may be extended along the outer circumference surface 30os of the outer electrode line 30 or in the length direction LD.

An end portion 10E of the core electrode line 10 may be enclosed by an end portion 20E of the dielectric line 20. The end portion 20E of the dielectric line 20 may not be covered with the outer electrode line 30 and the passivation line 40 and may be exposed to the outside. An end portion 30E of the outer electrode line 30 may be adjacent to the end portion 20E of the dielectric line 20 and may be covered with the passivation line 40. In example embodiments, end surfaces of the outer electrode line 30 and the passivation line 40 may be coplanar with one another. The end portion 30E of the outer electrode line 30 may have substantially the same thickness 30T as the outer electrode line 30. Except for the afore-described differences, the capacitor wire WCAP according to the present embodiment may be configured to have substantially the same features as the capacitor wire WCAP described with reference to FIGS. 1 and 2A to 2C.

In the present embodiment, the heating process H2 described with reference to FIG. 8B is not performed on the exposed end portion 20E of the dielectric line 20, and except for this difference, the capacitor wire WCAP may be formed by substantially the same method as that for the capacitor wire of FIGS. 8A and 8B.

Figure 15:
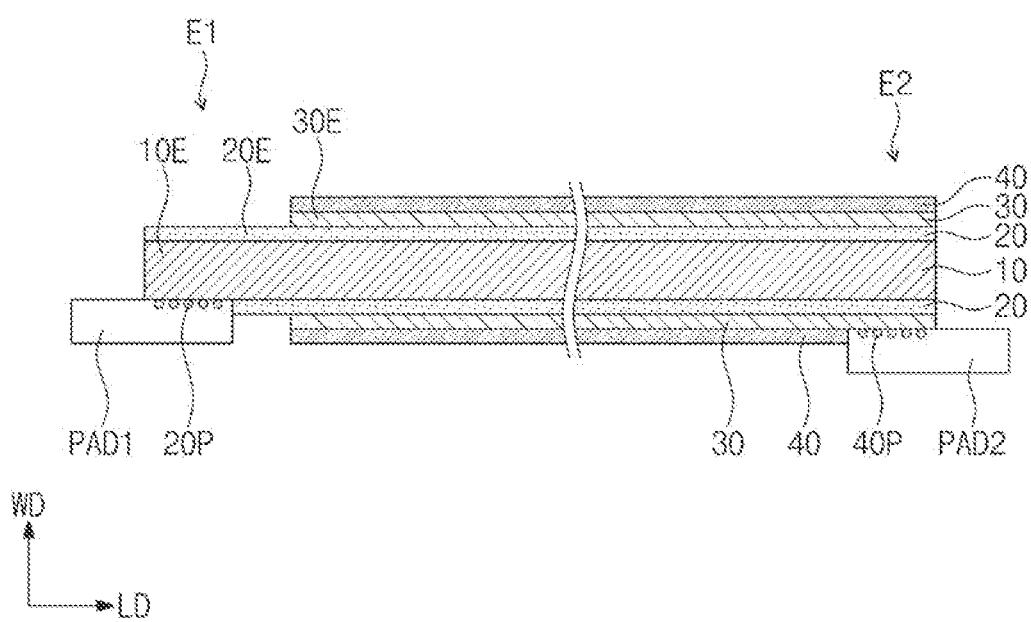
FIG. 15 is a conceptual diagram illustrating an example method of bonding the capacitor wire of FIG. 13.

FIG. 15 is a conceptual diagram illustrating an example method of bonding the capacitor wire of FIG. 13.

Referring to FIGS. 13 and 15, the capacitor wire WCAP may be connected to pads PAD1 and PAD2 by a wire bonding method. The capacitor wire WCAP may have a first end portion E1 and a second end portion E2, which are opposite to each other in the length direction LD. The first end portion E1 of the capacitor wire WCAP may include the end portion 20E of the dielectric line 20, which is not covered with the passivation line 40 and the outer electrode line 30 and is exposed to the outside, and the end portion 10E of the core electrode line 10, which is enclosed by the end portion 20E of the dielectric line 20. In the first end portion E1 of the capacitor wire WCAP, the end portion 10E of the core electrode line 10 may be connected to a first pad PAD1, which is one of the pads PAD1 and PAD2, in a wedge bonding method. The dielectric line 20 may be formed of or may include at least one of insulating or ceramic materials (e.g., $Al_2O_3$), and in this case, insulating particles 20P may be left in a bonding interface between the end portion 10E of the core electrode line 10 and the first pad PAD1.

The first end portion E1 of the capacitor wire WCAP may include an end portion 30E of the outer electrode line 30, and the second end portion E2 of the capacitor wire WCAP may include an opposite end portion of the outer electrode line 30. In the second end portion E2 of the capacitor wire WCAP, the opposite end portion of the outer electrode line 30 may be connected to a second pad PAD2, which is another of the pads PAD1 and PAD2, in a wedge bonding method. In an embodiment, the passivation line 40 may be formed of or may include at least one of insulating or ceramic materials (e.g., $Al_2O_3$), and in this case, passivation particles 40P may be left in a bonding interface between the opposite end portion of the outer electrode line 30 and the second pad PAD2.

Figure 16:
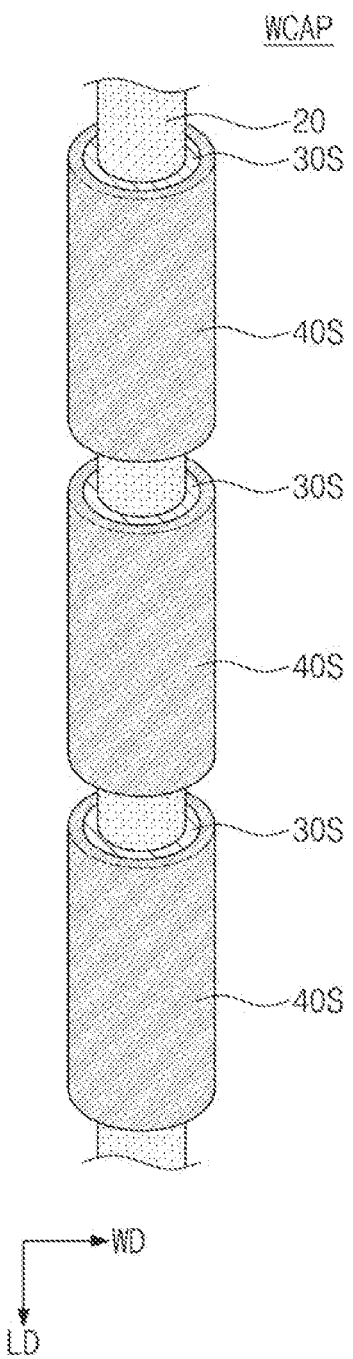
FIG. 16 is a perspective view schematically illustrating a capacitor wire, according to an example embodiment of the inventive concept.
Figure 17:
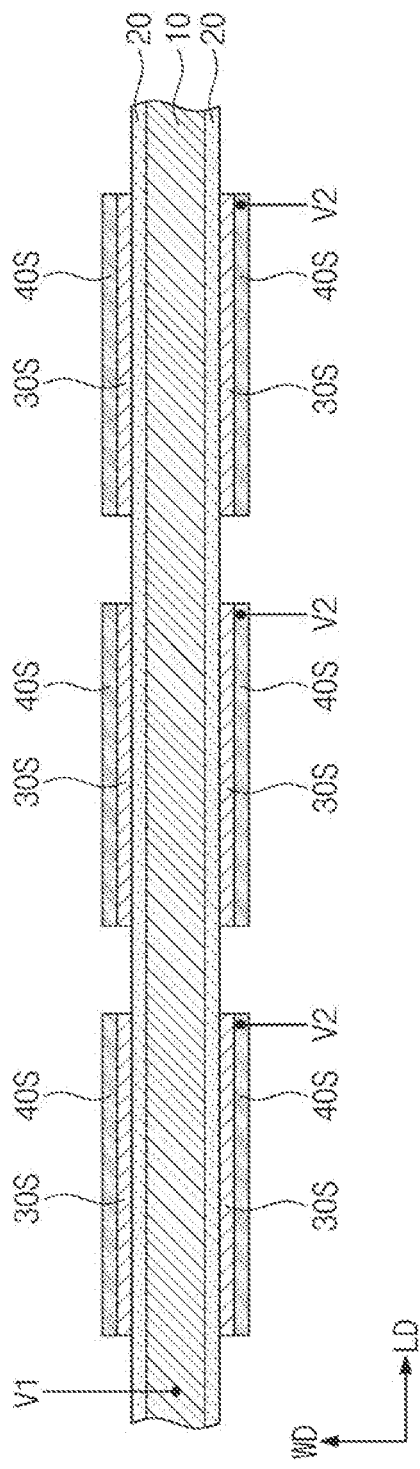
FIG. 17 is a sectional view taken along a line A-A' of FIG. 16.
Figure 18:
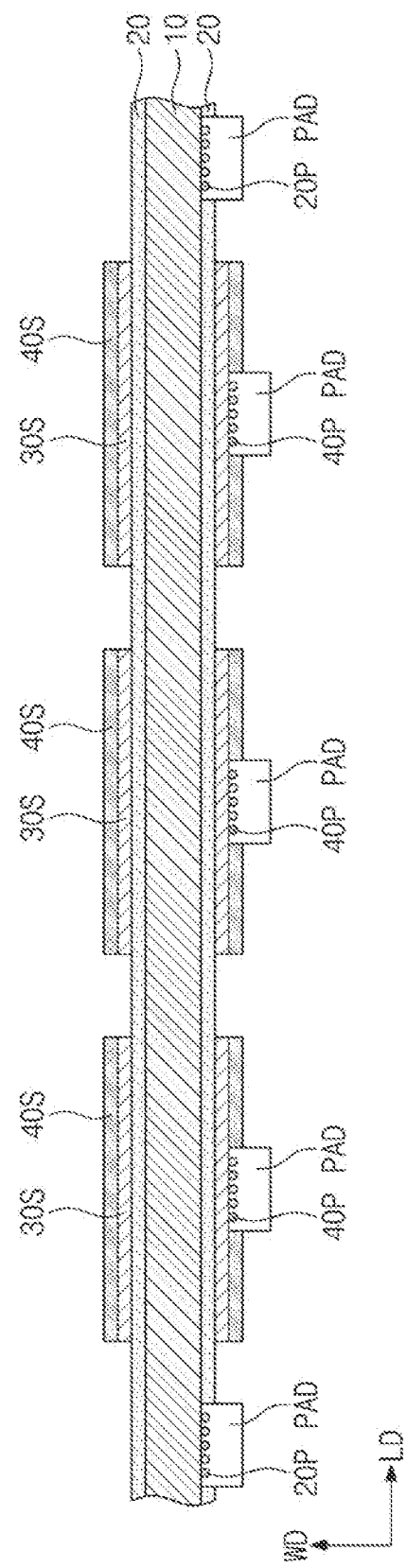
FIG. 18 is a conceptual diagram illustrating an example method of bonding the capacitor wire of FIG. 17.

FIG. 16 is a perspective view schematically illustrating a capacitor wire according to an example embodiment of the inventive concept. FIG. 17 is a sectional view taken along a line A-A' of FIG. 16, and FIG. 18 is a conceptual diagram illustrating an example method of bonding the capacitor wire of FIG. 17. For the sake of brevity, features, which are different from the capacitor wire of FIGS. 1 and 2A to 2C, will be mainly described below.

Referring to FIGS. 16 and 17, a capacitor wire WCAP may include a core electrode line 10, outer electrode segments 30S provided on the core electrode line 10 to be horizontally spaced apart from each other, a dielectric line 20 interposed between the core electrode line 10 and the outer electrode segments 30S, and passivation segments 40S covering the outer electrode segments 30S, respectively.

The core electrode line 10 may be provided in the form of a wire and may have a rounded shape (e.g., circular shape) when viewed in a section taken along the width direction WD. As another example, the core electrode line 10 may have a polygonal (e.g., rectangular) shape, when viewed in a section taken along the width direction WD, as described with reference to FIG. 2C.

The dielectric line 20 may cover at least a portion of the core electrode line 10 and may be extended in the length direction LD between the core electrode line 10 and the outer electrode segments 30S. As shown in FIGS. 2B and 2C, the dielectric line 20 may enclose an outer circumference surface 10os of the core electrode line 10 and may be extended along the outer circumference surface 10os of the core electrode line 10 or in the length direction LD.

Each of the outer electrode segments 30S may cover at least a portion of the dielectric line 20 and may be extended in the length direction LD between each of the passivation segments 40S and the dielectric line 20. As shown in FIGS. 2B and 2C, each of the outer electrode segments 30S may enclose an outer circumference surface 20os of the dielectric line 20 and may be extended along the outer circumference surface 20os of the dielectric line 20 or in the length direction LD. Each of the outer electrode segments 30S may be electrically disconnected or isolated from the core electrode line 10 by the dielectric line 20. The outer electrode segments 30S may be formed of or may include substantially the same material as the outer electrode line 30 described with reference to FIGS. 1 and 2A to 2C. The outer electrode segments 30S may be spaced apart from each other in the length direction LD.

The passivation segments 40S may be disposed on the outer electrode segments 30S, respectively. Each of the passivation segments 40S may cover at least a portion of each of the outer electrode segments 30S and may be extended in the length direction LD on each of the outer electrode segments 30S. As shown in FIGS. 2B and 2C, each of the passivation segments 40S may enclose an outer circumference surface 30os of each of the outer electrode segments 30S and may be extended along the outer circumference surface 30os of each of the outer electrode segments 30S or in the length direction LD. In example embodiments, end surfaces of the outer electrode segments 30S and the passivation segments 40S may be coplanar with one another. For example, lengths of the outer electrode segments 30S and the passivation segments 40S that are in contact with one another may have the same length in the length direction LD. The passivation segments 40S may be formed of or may include substantially the same material as the passivation line 40 described with reference to FIGS. 1 and 2A to 2C. The passivation segments 40S may be spaced apart from each other in the length direction LD.

In an example embodiment, although not shown, the core electrode line 10 may have a ball-shaped end portion 10E, as described with reference to FIGS. 1, 2A, 2B, 6, 7A, and 7B. In another example embodiment, the core electrode line 10 may have an end portion 10E, which is enclosed by the end portion 20E of the dielectric line 20, as described with reference to FIGS. 10, 11A, 11B, 13, 14A, and 14B.

A first voltage V1 may be applied to the core electrode line 10 through the end portion 10E of the core electrode line 10, and a second voltage V2 may be applied to each of the outer electrode segments 30S. The first and second voltages V1 and V2 may be different from each other. As an example, one of the first and second voltages V1 and V2 may be a power voltage, and the other of the first and second voltages V1 and V2 may be a ground voltage. Since the core electrode line 10 and the outer electrode segments 30S are applied with different voltages, electric charges may be accumulated in the dielectric line 20. Accordingly, each of the outer electrode segments 30S and portions of the dielectric line 20 and the core electrode line 10 adjacent thereto may serve as a capacitor.

Referring to FIG. 18, the capacitor wire WCAP may be connected to a plurality of pads PAD by a wire bonding method. The outer electrode segments 30S may be connected to corresponding ones of the pads PAD, respectively, by a stitch bonding method. In an embodiment, the passivation segments 40S may be formed of or may include at least one of insulating or ceramic materials (e.g., $Al_2O_3$), and in this case, passivation particles 40P may be left in a bonding interface between each of the outer electrode segments 30S and a corresponding pad PAD. The core electrode line 10 may be connected to a corresponding one of the pads PAD by a wedge bonding method, as described with reference to FIGS. 12 and 15. In addition, the core electrode line 10 may be connected to a corresponding one of the pads PAD by a ball bonding method, as described with reference to FIGS. 5 and 9.

FIG. 19 is a sectional view illustrating a modified example of the capacitor wire of FIG. 16 and corresponding to the line A-A' of FIG. 16. FIG. 20 is a conceptual diagram illustrating a method of bonding the capacitor wire of FIG. 19.

Referring to FIG. 19, end portions 30E of each of the outer electrode segments 30S may not be covered with the passivation segments 40S and may be exposed to the outside. For example, lengths of the outer electrode segments 30S may be greater than lengths of the adjacent passivation segments 40S in the length direction LD. A thickness 30ET of the end portion 30E of each of the outer electrode segments 30S may be larger than a thickness 30T of each of the outer electrode segments 30S. For example, the thickness 30ET of the end portion 30E of each of the outer electrode segments 30S may be larger than thicknesses 30T of other portions of each of the outer electrode segments 30S. In this case, the end portion 30E of each of the outer electrode segments 30S may have a ring shape enclosing the outer circumference surface 20os of the dielectric line 20. Except for the afore-described differences, the capacitor wire according to the present embodiment may be configured to have substantially the same features as the capacitor wire WCAP described with reference to FIGS. 16 and 17.

Referring to FIG. 20, the outer electrode segments 30S may include end portions 30E having a relatively large thickness. The outer electrode segments 30S may be connected to corresponding ones of the pads PAD, respectively, by a stitch bonding method, as described with reference to FIG. 18. The core electrode line 10 may be connected to a corresponding one of the pads PAD by a wedge or ball bonding method.

Figure 21:
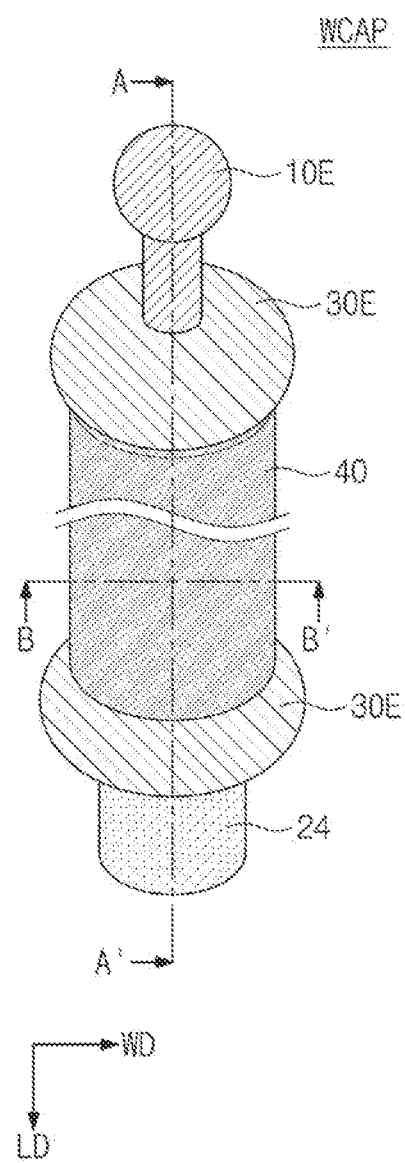
FIG. 21 is a perspective view schematically illustrating a capacitor wire, according to an example embodiment of the inventive concept.
Figure 22A:
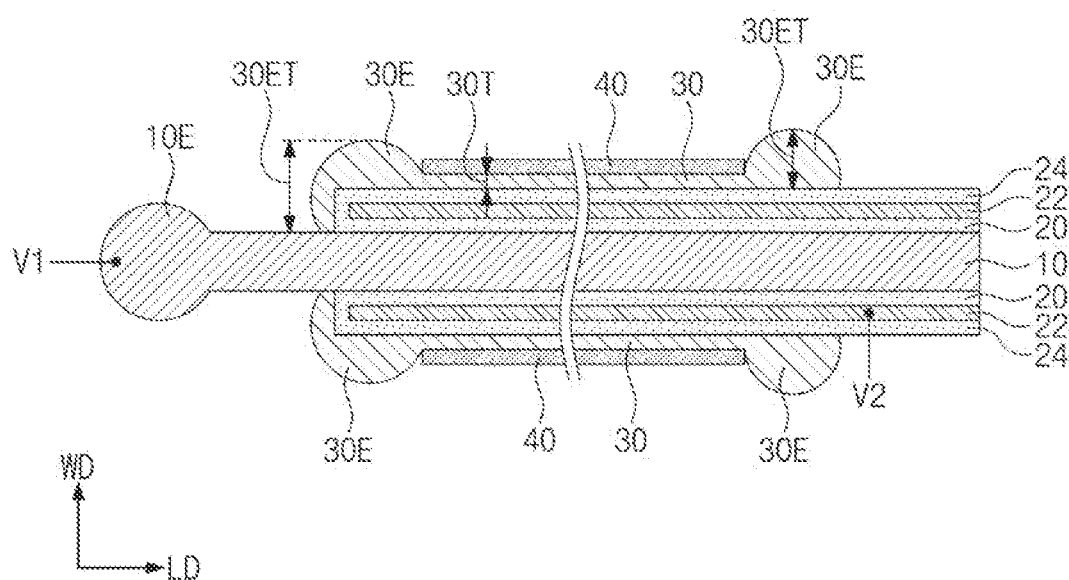
FIG. 22A is a sectional view taken along a line A-A' of FIG. 21.
Figure 22B:
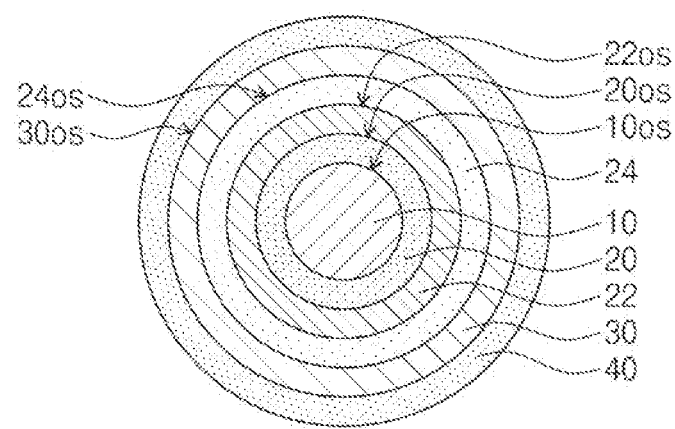
FIG. 22B is a sectional view taken along a line B-B' of FIG. 21.

FIG. 21 is a perspective view schematically illustrating a capacitor wire according to an example embodiment of the inventive concept. FIG. 22A is a sectional view taken along a line A-A' of FIG. 21, and FIG. 22B is a sectional view taken along a line B-B' of FIG. 21. For the sake of brevity, features, which are different from the capacitor wire of FIGS. 1 and 2A to 2C, will be mainly described below.

Referring to FIGS. 21, 22A, and 22B, a capacitor wire WCAP may include a core electrode line 10, an outer electrode line 30 covering at least a portion of the core electrode line 10, an inner electrode line 22 interposed between the core electrode line 10 and the outer electrode line 30, dielectric lines 20 and 24 interposed between the core electrode line 10 and the inner electrode line 22 and between the inner electrode line 22 and the outer electrode line 30, and a passivation line 40 covering at least a portion of the outer electrode line 30.

The core electrode line 10 may be provided in the form of a wire and may have a rounded shape (e.g., circular shape) when viewed in a section taken along the width direction WD. As another example, the core electrode line 10 may have a polygonal (e.g., rectangular) shape, when viewed in a section taken along the width direction WD, as described with reference to FIG. 2C.

The dielectric lines 20 and 24 may include a first dielectric line 20, which is interposed between the core electrode line 10 and the inner electrode line 22, and a second dielectric line 24, which is interposed between the inner electrode line 22 and the outer electrode line 30. The first dielectric line 20 may cover at least a portion of the core electrode line 10 and may be extended in the length direction LD, between the core electrode line 10 and the inner electrode line 22. The first dielectric line 20 may enclose an outer circumference surface 10os of the core electrode line 10 and may be extended along the outer circumference surface 10os of the core electrode line 10 or in the length direction LD.

The inner electrode line 22 may cover at least a portion of the first dielectric line 20 and may be extended in the length direction LD, between the first dielectric line 20 and the second dielectric line 24. The inner electrode line 22 may enclose an outer circumference surface 20os of the first dielectric line 20 and may be extended along the outer circumference surface 20os of the first dielectric line 20 or in the length direction LD. The inner electrode line 22 may be electrically disconnected or isolated from the core electrode line 10 by the first dielectric line 20.

The inner electrode line 22 may be formed of or may include at least one of materials (e.g., metal alloys) whose melting points are lower than that of the core electrode line 10 and are higher than that of the outer electrode line 30. In addition, the inner electrode line 22 may be formed of or may include at least one of materials (e.g., metal alloys) whose mechanical strengths are lower than that of the core electrode line 10. As an example, the core electrode line 10 may be formed of or may include a first metal, and the inner electrode line 22 may be formed of or may include a third metal different from the first metal. The inner electrode line 22 may be formed of or may include at least one of alloys of the third metal. For example, the inner electrode line 22 may be formed of or may include at least one of arsenic-copper alloy, aluminum-cerium alloy, aluminum-scandium alloy, silver-germanium alloy, silver-palladium alloy, aluminum-indium alloy, field's metal, arsenic-antimony alloy, aluminum-magnesium alloy, magnesium-praseodymium alloy, arsenic-tin alloy, aluminum-silicon alloy, gold-magnesium alloy, aluminum-gold alloy, silver-aluminum alloy, gold-lanthanum alloy, aluminum-copper alloy, silver-calcium alloy, aluminum-calcium alloy, silver-arsenic alloy, silver-cerium alloy, gold-cerium alloy, silver-lanthanum alloy, magnesium-nickel alloy, gold-cadmium alloy, silver-antimony alloy, silver-magnesium alloy, silver-strontium alloy, babbitt metal, aluminum-germanium alloy, magnesium-strontium alloy, gold-tellurium alloy, aluminum-zinc alloy, gold-silicon alloy, gold-antimony alloy, gold-germanium alloy, silver-tellurium alloy, magnesium-zinc alloy, or silver-lead alloy.

The second dielectric line 24 may cover at least a portion of the inner electrode line 22 and may be extended in the length direction LD, between the inner electrode line 22 and the outer electrode line 30. The second dielectric line 24 may enclose an outer circumference surface 22os of the inner electrode line 22 and may be extended along the outer circumference surface 22os of the inner electrode line 22 or in the length direction LD. The second dielectric line 24 may cover an end portion of the inner electrode line 22 and may be in contact with the first dielectric line 20. The first dielectric line 20 and the second dielectric line 24 may be connected to each other to form a single object. Each of the first dielectric line 20 and the second dielectric line 24 may be formed of or may include at least one of ceramic materials (e.g., $Al_2O_3$).

The outer electrode line 30 may cover at least a portion of the second dielectric line 24 and may be extended in the length direction LD, between the second dielectric line 24 and the passivation line 40. The outer electrode line 30 may enclose an outer circumference surface 24os of the second dielectric line 24 and may be extended along the outer circumference surface 24os of the second dielectric line 24 or in the length direction LD. The outer electrode line 30 may be electrically disconnected or isolated from the inner electrode line 22 by the second dielectric line 24.

The outer electrode line 30 may be formed of or may include at least one of materials (e.g., metal alloys) whose melting points are lower than that of the core electrode line 10 and the inner electrode line 22. In addition, the outer electrode line 30 may be formed of at least one of materials (e.g., metal alloys) having mechanical strengths smaller than the core electrode line 10. As an example, the outer electrode line 30 may include a second metal, which is different from the first metal, or an alloy of the second metal. The outer electrode line 30 may be formed of or may include the same material as the outer electrode line 30 described with reference to FIGS. 1 and 2A to 2C.

The passivation line 40 may cover at least a portion of the outer electrode line 30 and may be extended in the length direction LD, on the outer electrode line 30. The passivation line 40 may enclose an outer circumference surface 30os of the outer electrode line 30 and may be extended along the outer circumference surface 30os of the outer electrode line 30 and in the length direction LD. The outer electrode line 30 may be interposed between the second dielectric line 24 and the passivation line 40.

An end portion 10E of the core electrode line 10 may not be covered with the first and second dielectric lines 20 and 24, the inner electrode line 22, the outer electrode line 30, and the passivation line 40 and may be exposed to the outside. In an embodiment, the end portion 10E of the core electrode line 10 may be provided in the form of a ball.

The outer electrode line 30 may have end portions 30E, which are opposite to each other in the length direction LD, are not covered with the passivation line 40, and are exposed to the outside. One of the end portions 30E of the outer electrode line 30 may be adjacent to the end portion 10E of the core electrode line 10. The end portion 30E of the outer electrode line 30 may cover end portions of the first and second dielectric lines 20 and 24 and may be extended to be in contact with a portion of the core electrode line 10. The opposite one of the end portions 30E of the outer electrode line 30 may be provided to expose an end portion of the second dielectric line 24.

The outer electrode line 30 may have a thickness measured from an interface between the outer electrode line 30 and the second dielectric line 24 (e.g., the outer circumference surface 24os of the second dielectric line 24) in the width direction WD. In an embodiment, a thickness 30ET of each of the end portions 30E of the outer electrode line 30 may be larger than a thickness 30T of the outer electrode line 30. For example, the thickness 30ET of each of the end portions 30E of the outer electrode line 30 may be larger than the thickness 30T of other portions of the outer electrode line 30. The end portion 30E of the outer electrode line 30 may be provided to enclose the outer circumference surface 24os of the second dielectric line 24, to cover end portions of the first and second dielectric lines 20 and 24, to enclose the outer circumference surface 10os of the core electrode line 10, and to have a ring shape. The opposite end portion 30E of the outer electrode line 30 may have a ring shape enclosing the outer circumference surface 24os of the second dielectric line 24.

A first voltage V1 may be applied to the core electrode line 10 through the end portion 10E of the core electrode line 10. Since the end portion 30E of the outer electrode line 30 is in contact with a portion of the core electrode line 10, the first voltage may be applied to the outer electrode line 30. In other words, the core electrode line 10 and the outer electrode line 30 may be applied with the same voltage. A second voltage V2 may be applied to the inner electrode line 22, and the first and second voltages V1 and V2 may be different from each other. As an example, one of the first and second voltages V1 and V2 may be a power voltage, and the other of the first and second voltages V1 and V2 may be a ground voltage. Since the core electrode line 10 and the inner electrode line 22 are applied with different voltages, electric charges may be accumulated in the first dielectric line 20, and since the inner electrode line 22 and the outer electrode line 30 are applied with different voltages, electric charges may be accumulated in the second dielectric line 24. Accordingly, the capacitor wire WCAP, which has a wire shape and is used as a capacitor, may be realized.

In an embodiment, the capacitor wire WCAP may further include additional inner electrode line(s) and additional dielectric line(s), which are interposed between the inner electrode line 22 and the outer electrode line 30. In this case, the outer electrode line 30 may be electrically disconnected or isolated from the additional inner electrode line(s) by the additional dielectric line(s).

FIGS. 23A to 23E are sectional views illustrating an example method of fabricating the capacitor wire of FIG. 21 and corresponding to the line A-A' of FIG. 21. For the sake of brevity, description of features overlapped with the capacitor wire described with reference to FIGS. 21, 22A, and 22B will be omitted.

Figure 23A:
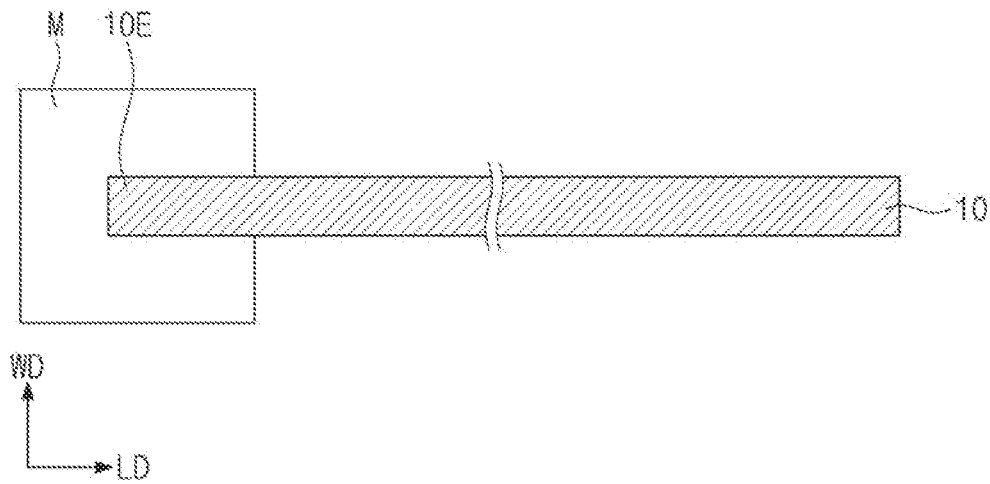
FIGS. 23A to 23E are sectional views illustrating an example method of fabricating the capacitor wire of FIG. 21 and corresponding to the line A-A' of FIG. 21.

Referring to FIG. 23A, a core electrode line 10 having a wire shape may be provided. A mask pattern M may be provided to enclose an end portion 10E of the core electrode line 10.

Figure 23B:
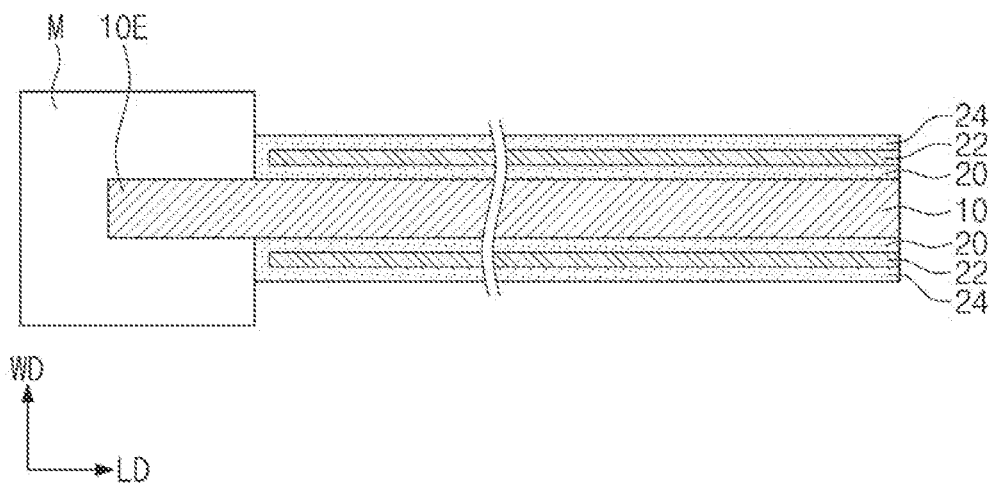

Referring to FIGS. 22B and 23B, a first dielectric line 20 may be formed to enclose an outer circumference surface 10os of the core electrode line 10 and may be formed by, for example, a physical vapor deposition method, a chemical vapor deposition method, or an atomic layer deposition method. An inner electrode line 22 may be formed to enclose an outer circumference surface 20os of the first dielectric line 20, and a second dielectric line 24 may be formed to enclose an outer circumference surface 22os of the inner electrode line 22. The second dielectric line 24 may cover an end portion of the inner electrode line 22 and may be in contact with the first dielectric line 20. The first dielectric line 20 and the second dielectric line 24 may be connected to each other to form a single structure. Each of the inner electrode line 22 and the second dielectric line 24 may be formed by, for example, a physical vapor deposition method, a chemical vapor deposition method, or an atomic layer deposition method.

Figure 23C:
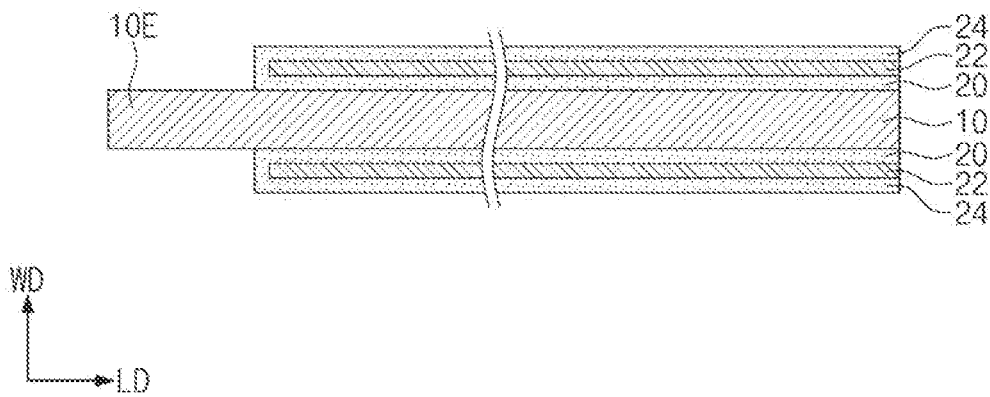

Referring to FIG. 23C, the mask pattern M may be removed, after the formation of the second dielectric line 24. Accordingly, the end portion 10E of the core electrode line 10 may be exposed.

Figure 23D:
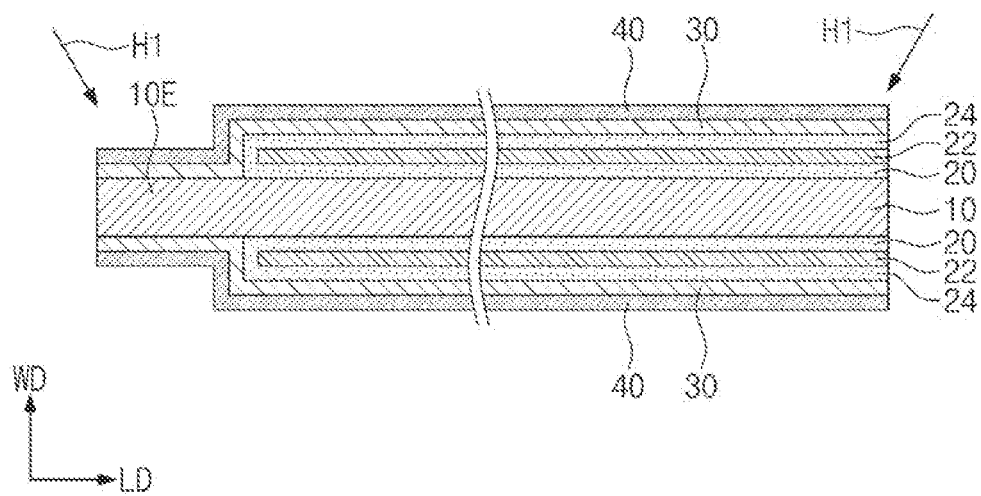

Referring to FIGS. 22B and 23D, an outer electrode line 30 may be formed to enclose an outer circumference surface 24os of the second dielectric line 24 and to enclose the end portion 10E of the core electrode line 10. A passivation line 40 may be formed to enclose an outer circumference surface 30os of the outer electrode line 30. Each of the outer electrode line 30 and the passivation line 40 may be formed by, for example, a physical vapor deposition method, a chemical vapor deposition method, or an atomic layer deposition method.

The passivation line 40 may have end portions, which are opposite to each other in the length direction LD, and a first heating process H1 may be performed on the end portions of the passivation line 40. The first heating process H1 may be performed using, for example, a laser beam or an electric spark.

Figure 23E:
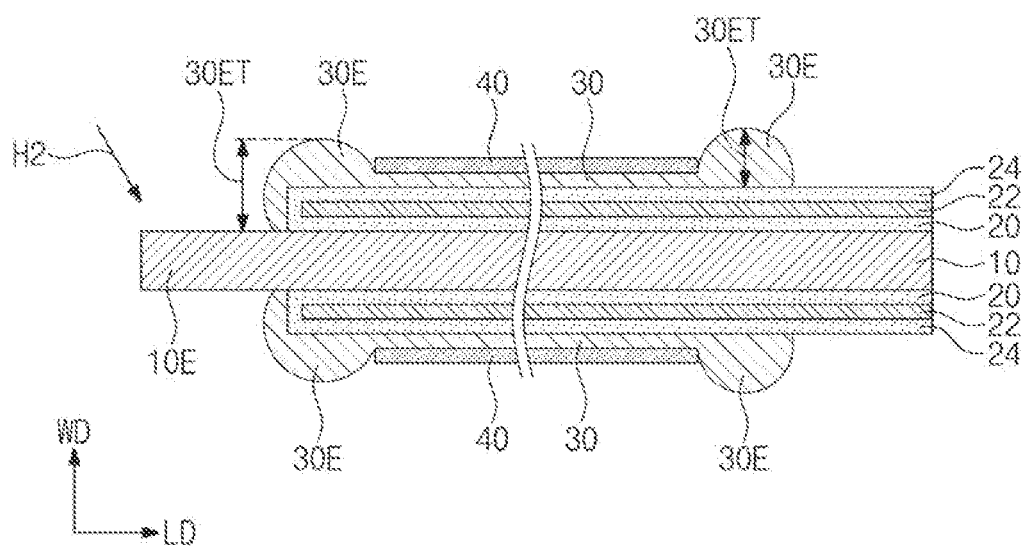

Referring to FIGS. 22B and 23E, as a result of the first heating process H1, the end portions of the passivation line 40 may be removed and portions of the outer electrode line 30 may be melted. Since the portions of the outer electrode line 30 are melted, end portions 30E of the outer electrode line 30 may be formed to have a relatively large thickness 30ET. The end portions 30E of the outer electrode line 30 may be opposite to each other in the length direction LD. An end portion 30E of the outer electrode line 30 may be provided to enclose the outer circumference surface 24os of the second dielectric line 24, to cover end portions of the first and second dielectric lines 20 and 24, to enclose the outer circumference surface 10os of the core electrode line 10, and to have a ring shape. The end portion 30E of the outer electrode line 30 may be provided to expose the end portion 10E of the core electrode line 10. An opposite end portion 30E of the outer electrode line 30 may be provided to enclose the outer circumference surface 24os of the second dielectric line 24, to have a ring shape, and to expose an end portion of the second dielectric line 24. Thereafter, a second heating process H2 may be performed on the exposed end portion 20E of the dielectric line 20. The second heating process H2 may be performed using, for example, a laser beam or an electric spark.

Referring back to FIGS. 22A and 22B, as a result of the second heating process H2, the exposed end portion 10E of the core electrode line 10 may be formed to have a ball shape. The capacitor wire WCAP of FIG. 21 may be fabricated by the afore-described method.

Figure 24:
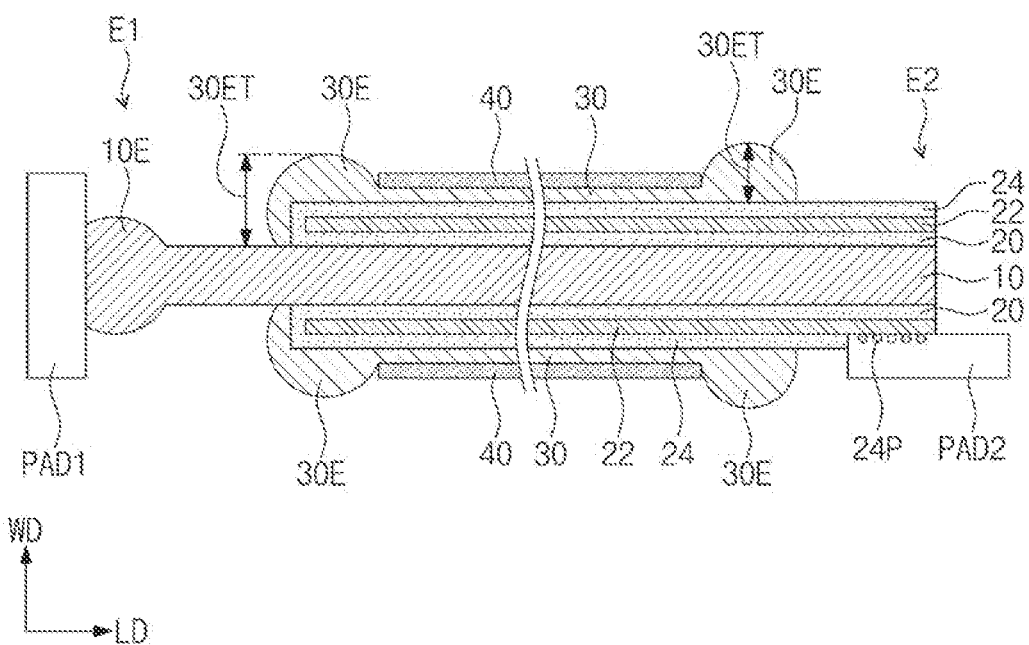
FIG. 24 is a conceptual diagram illustrating an example method of bonding the capacitor wire of FIG. 21.

FIG. 24 is a conceptual diagram illustrating an example method of bonding the capacitor wire of FIG. 21.

Referring to FIGS. 21 and 24, the capacitor wire WCAP may be connected to pads PAD1 and PAD2 by a wire bonding method. The capacitor wire WCAP may have a first end portion E1 and a second end portion E2, which are opposite to each other in the length direction LD. The first end portion E1 of the capacitor wire WCAP may include the end portion 10E of the core electrode line 10, which is not covered with the passivation line 40, the outer electrode line 30, the first and second dielectric lines 20 and 24, and the inner electrode line 22 and is exposed to the outside. The end portion 10E of the core electrode line 10 may be provided in the form of a ball. In the first end portion E1 of the capacitor wire WCAP, the end portion 10E of the core electrode line 10 may be connected to a first pad PAD1, which is one of the pads PAD1 and PAD2, by a ball bonding method.

The first end portion E1 of the capacitor wire WCAP may further include the end portion 30E of the outer electrode line 30 having a relatively large thickness 30ET. The end portion 30E of the outer electrode line 30 may have a ring shape and may expose the end portion 10E of the core electrode line 10. The second end portion E2 of the capacitor wire WCAP may include the opposite end portion 30E of the outer electrode line 30 having a relatively large thickness 30ET. The opposite end portion 30E of the outer electrode line 30 may have a ring shape and may expose the end portion of the second dielectric line 24. In the second end portion E2 of the capacitor wire WCAP, an end portion of the inner electrode line 22 may be connected to a second pad PAD2, which is another of the pads PAD1 and PAD2, by a wedge bonding method. The second dielectric line 24 may be formed of or may include at least one of insulating or ceramic materials (e.g., $Al_2O_3$), and in this case, insulating particles 24P may be left in a bonding interface between the end portion of the inner electrode line 22 and the second pad PAD2.

Figure 25:
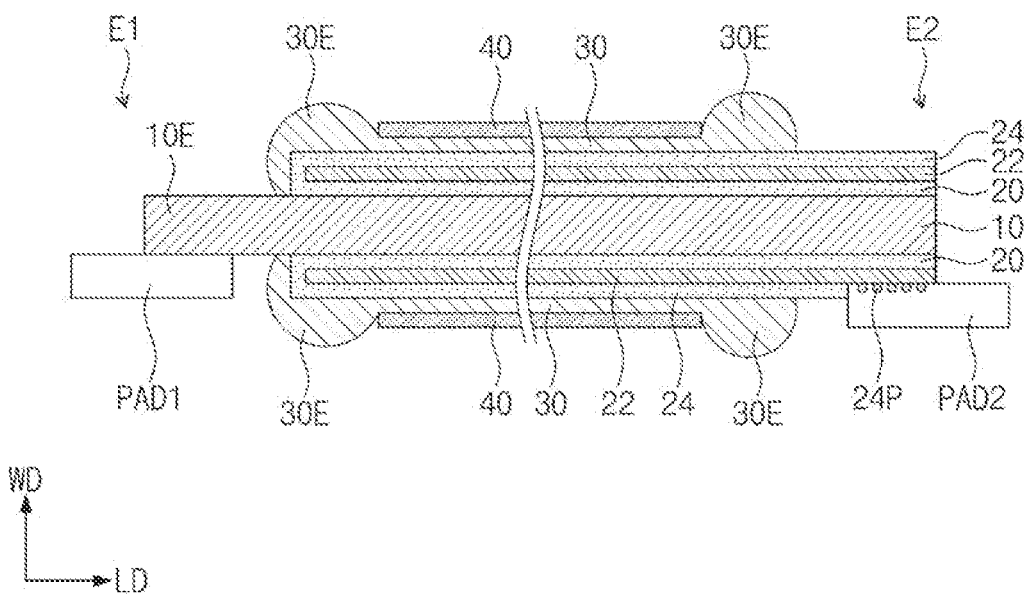
FIG. 25 is a conceptual diagram illustrating an example method of bonding the capacitor wire of FIG. 21 according to a example modified embodiment.

FIG. 25 is a conceptual diagram illustrating an example method of bonding the capacitor wire of FIG. 21 according to a modified embodiment.

Referring to FIG. 25, in an embodiment, the first end portion E1 of the capacitor wire WCAP may include the end portion 10E of the core electrode line 10, which is not covered with the passivation line 40, the outer electrode line 30, the first and second dielectric lines 20 and 24, and the inner electrode line 22 and is exposed to the outside, and the end portion 10E of the core electrode line 10 may not have a ball shape. In this case, in the first end portion E1 of the capacitor wire WCAP, the end portion 10E of the core electrode line 10 may be connected to a first pad PAD1, which is one of the pads PAD1 and PAD2, in a wedge bonding method. Except for the afore-described differences, the capacitor wire WCAP according to the present embodiment may be configured to have substantially the same features as the capacitor wire WCAP described with reference to FIGS. 21, 22A, and 22B and may be connected to the pads PAD1 and PAD2 by the substantially same bonding method as described with reference to FIG. 24.

Figure 26:
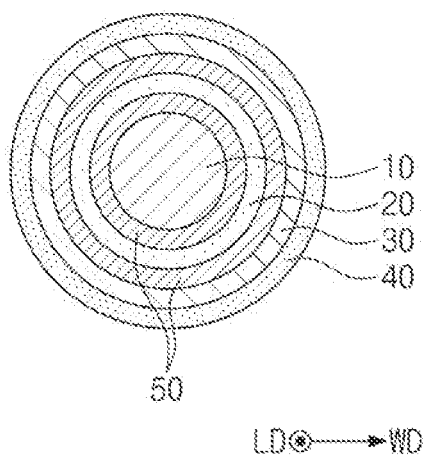
FIG. 26 is a sectional view illustrating a capacitor wire, according to an example embodiment of the inventive concept and corresponding to the line B-B' of FIG. 1.

FIG. 26 is a sectional view illustrating a capacitor wire according to an example embodiment of the inventive concept and corresponding to the line B-B' of FIG. 1.

Referring to FIGS. 1 and 26, the capacitor wire WCAP may further include a barrier line 50. The barrier line 50 may be interposed between the core electrode line 10 and the dielectric line 20 or between the dielectric line 20 and the outer electrode line 30. In an embodiment, the capacitor wire WCAP may further include a plurality of barrier lines 50, which are respectively interposed between the core electrode line 10 and the dielectric line 20 and between the dielectric line 20 and the outer electrode line 30. The barrier line 50 may be formed of or may include at least one of, for example, TiN, TaN, WN, NiSi, WSi, Ag, Ni, steel, $Al_2O_3$, $TiO_2$, or BaO. The barrier line 50 may be used to improve an adhesion property between the core electrode line 10 and the dielectric line 20 and/or between the dielectric line 20 and the outer electrode line 30 or to prevent an interdiffusion phenomenon between the core electrode line 10 and the dielectric line 20 and/or between the dielectric line 20 and the outer electrode line 30.

Figure 27:
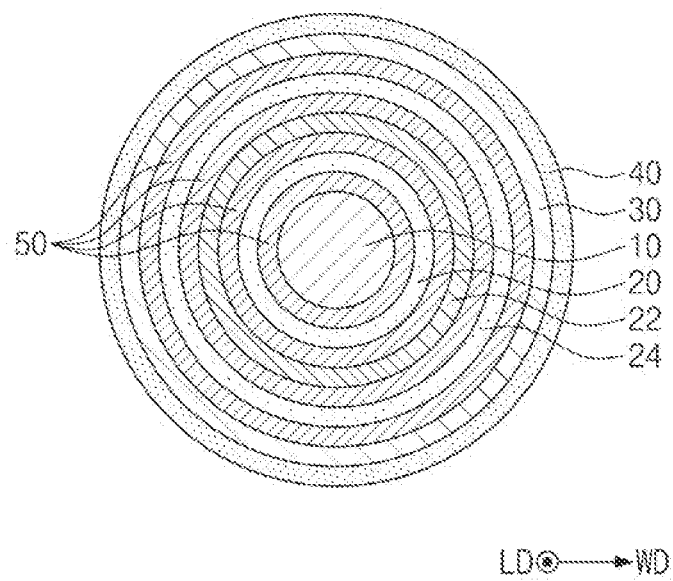
FIG. 27 is a sectional view illustrating a capacitor wire, according to an example embodiment of the inventive concept and corresponding to the line B-B' of FIG. 21.

FIG. 27 is a sectional view illustrating a capacitor wire according to an example embodiment of the inventive concept and corresponding to the line B-B' of FIG. 21.

Referring to FIGS. 21 and 27, in an embodiment, the capacitor wire WCAP may further include a barrier line 50. The barrier line 50 may be interposed between the core electrode line 10 and the first dielectric line 20, between the first dielectric line 20 and the inner electrode line 22, between the inner electrode line 22 and the second dielectric line 24, or between the second dielectric line 24 and the outer electrode line 30. In an embodiment, the capacitor wire WCAP may further include a plurality of barrier lines 50, and the barrier lines 50 may be respectively interposed between the core electrode line 10 and the first dielectric line 20, between the first dielectric line 20 and the inner electrode line 22, between the inner electrode line 22 and the second dielectric line 24, and between the second dielectric line 24 and the outer electrode line 30. The barrier line 50 may be formed of or may include substantially the same material as the barrier line 50 described with reference to FIG. 26. The barrier line 50 may be used to improve an adhesion property between the core electrode line 10 and the first dielectric line 20, between the first dielectric line 20 and the inner electrode line 22, between the inner electrode line 22 and the second dielectric line 24, and/or between the second dielectric line 24 and the outer electrode line 30 or to prevent an interdiffusion phenomenon between the core electrode line 10 and the first dielectric line 20, between the first dielectric line 20 and the inner electrode line 22, between the inner electrode line 22 and the second dielectric line 24, and/or between the second dielectric line 24 and the outer electrode line 30.

Figure 28:
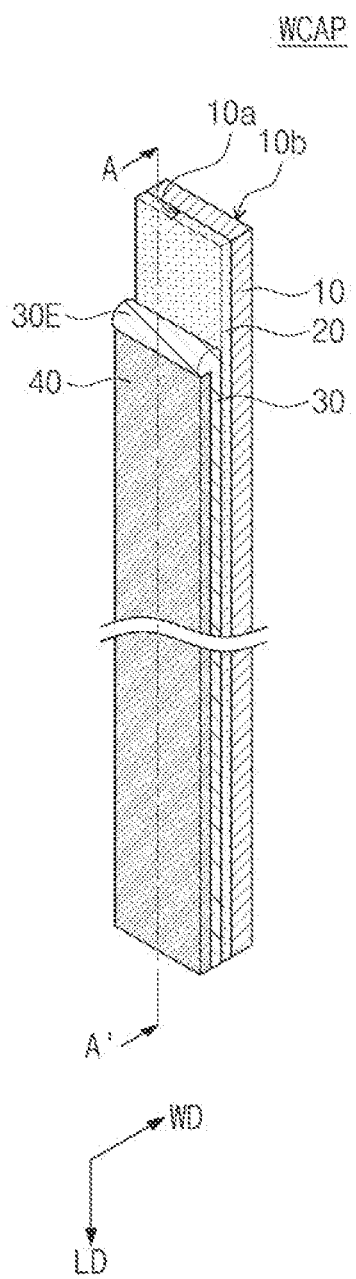
FIG. 28 is a perspective view schematically illustrating a capacitor wire, according to an example embodiment of the inventive concept.
Figure 29:
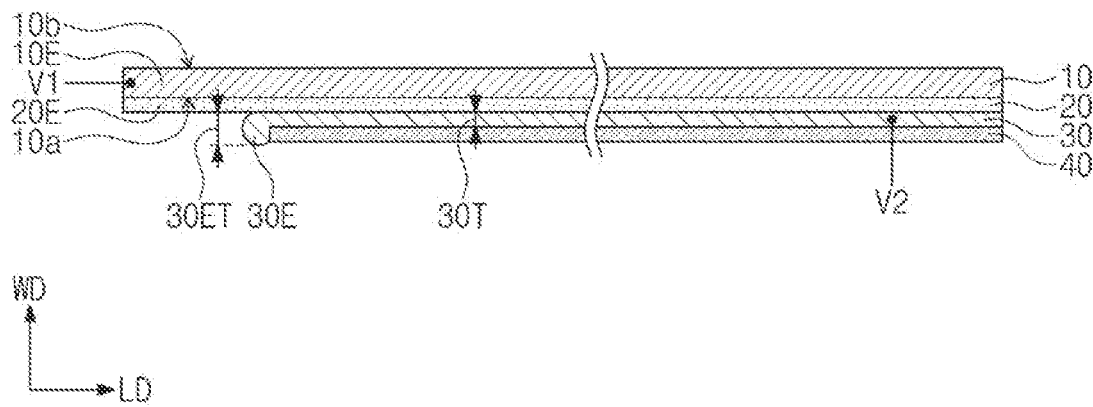
FIG. 29 is a sectional view taken along a line A-A' of FIG. 28.
Figure 30:
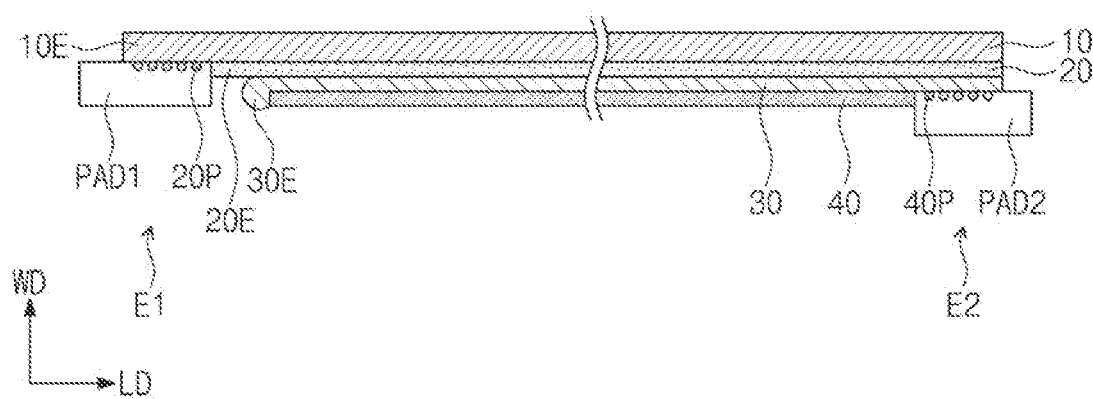
FIG. 30 is a conceptual diagram illustrating an example method of bonding the capacitor wire of FIG. 28.

FIG. 28 is a perspective view schematically illustrating a capacitor wire according to an example embodiment of the inventive concept, and FIG. 29 is a sectional view taken along a line A-A' of FIG. 28. FIG. 30 is a conceptual diagram illustrating an example method of bonding the capacitor wire of FIG. 28. For the sake of brevity, features, which are different from the capacitor wire of FIGS. 1 and 2A to 2C, will be mainly described below.

Referring to FIGS. 28 and 29, a capacitor wire WCAP may include a core electrode line 10, an outer electrode line 30 covering at least a portion of the core electrode line 10, a dielectric line 20 interposed between the core electrode line 10 and the outer electrode line 30, and a passivation line 40 covering at least a portion of the outer electrode line 30.

The core electrode line 10 may have a wire shape and may be elongated in a specific direction. The specific direction may be referred to as a length direction LD of the core electrode line 10, and a direction perpendicular to the length direction LD may be referred to as a width direction WD. The core electrode line 10 may have a polygonal (e.g., rectangular) shape, when viewed in a section taken along the width direction WD. The core electrode line 10 may have a first surface 10a and a second surface 10b, which are opposite to each other in the width direction WD and are parallel to each other.

The dielectric line 20, the outer electrode line 30, and the passivation line 40 may be sequentially stacked on the first surface 10a of the core electrode line 10. The dielectric line 20 may be extended in the length direction LD, between the first surface 10a of the core electrode line 10 and the outer electrode line 30, and the outer electrode line 30 may be extended in the length direction LD, between the dielectric line 20 and the passivation line 40. The passivation line 40 may be extended in the length direction LD on the outer electrode line 30. The outer electrode line 30 may be electrically disconnected or isolated from the core electrode line 10 by the dielectric line 20.

An end portion 20E of the dielectric line 20 may not be covered with the outer electrode line 30 and the passivation line 40 and may be exposed to the outside. The end portion 20E of the dielectric line 20 may be adjacent to an end portion 10E of the core electrode line 10 and may cover the end portion 10E of the core electrode line 10. An end portion 30E of the outer electrode line 30 may be provided near the end portion 10E of the core electrode line 10 and adjacent to the end portion 20E of the dielectric line 20. The end portion 30E of the outer electrode line 30 may not be covered with the passivation line 40 and may be exposed to the outside.

The outer electrode line 30 may have a thickness measured from an interface between the outer electrode line 30 and the dielectric line 20 in the width direction WD. In an embodiment, a thickness 30ET of the end portion 30E of the outer electrode line 30 may be larger than a thickness 30T of the outer electrode line 30. For example, the thickness 30ET of the end portion 30E of the outer electrode line 30 may be larger than the thickness 30T of other portions of the outer electrode line 30.

A first voltage V1 may be applied to the core electrode line 10 through the end portion 10E of the core electrode line 10, and a second voltage V2 may be applied to the outer electrode line 30. The first and second voltages V1 and V2 may be different from each other. As an example, one of the first and second voltages V1 and V2 may be a power voltage, and the other of the first and second voltages V1 and V2 may be a ground voltage. Since the core electrode line 10 and the outer electrode line 30 are applied with different voltages, electric charges may be accumulated in the dielectric line 20. Accordingly, the capacitor wire WCAP, which has a wire shape and is used as a capacitor, may be realized.

Referring to FIG. 30, the capacitor wire WCAP may be connected to pads PAD1 and PAD2 by a wire bonding method. The capacitor wire WCAP may have a first end portion E1 and a second end portion E2, which are opposite to each other in the length direction LD. The first end portion E1 of the capacitor wire WCAP may include the end portion 20E of the dielectric line 20 and the end portion 10E of the core electrode line 10, which are not covered with the passivation line 40 and the outer electrode line 30 and are exposed to the outside. In the first end portion E1 of the capacitor wire WCAP, the end portion 10E of the core electrode line 10 may be connected to a first pad PAD1, which is one of the pads PAD1 and PAD2, in a wedge bonding method. The dielectric line 20 may be formed of or may include at least one of insulating or ceramic materials (e.g., $Al_2O_3$), and in this case, insulating particles 20P may be left in a bonding interface between the end portion 10E of the core electrode line 10 and the first pad PAD1.

The first end portion E1 of the capacitor wire WCAP may further include the end portion 30E of the outer electrode line 30 having a relatively large thickness 30ET in the width direction WD. The second end portion E2 of the capacitor wire WCAP may include an opposite end portion of the outer electrode line 30. In the second end portion E2 of the capacitor wire WCAP, the opposite end portion of the outer electrode line 30 may be connected to a second pad PAD2, which is another of the pads PAD1 and PAD2, by a wedge bonding method. In an embodiment, the passivation line 40 may be formed of or may include at least one of insulating or ceramic materials (e.g., $Al_2O_3$), and in this case, passivation particles 40P may be left in a bonding interface between the opposite end portion of the outer electrode line 30 and the second pad PAD2.

Figure 31:
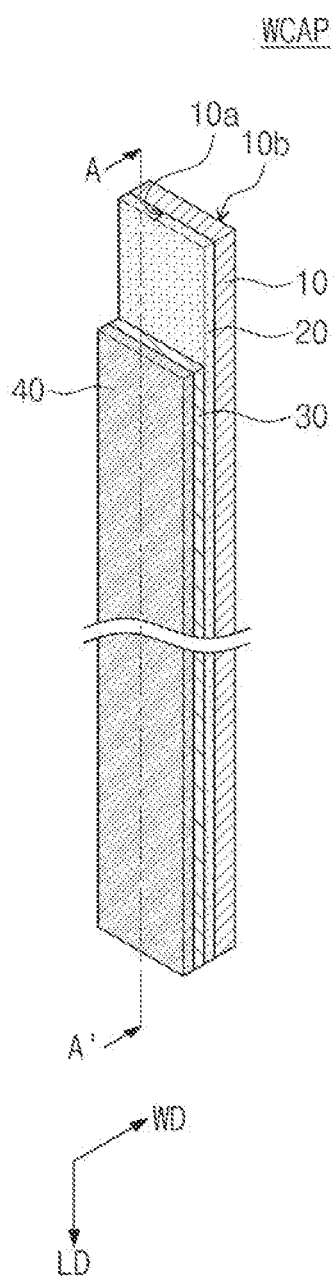
FIG. 31 is a perspective view schematically illustrating a capacitor wire, according to an example embodiment of the inventive concept.
Figure 32:
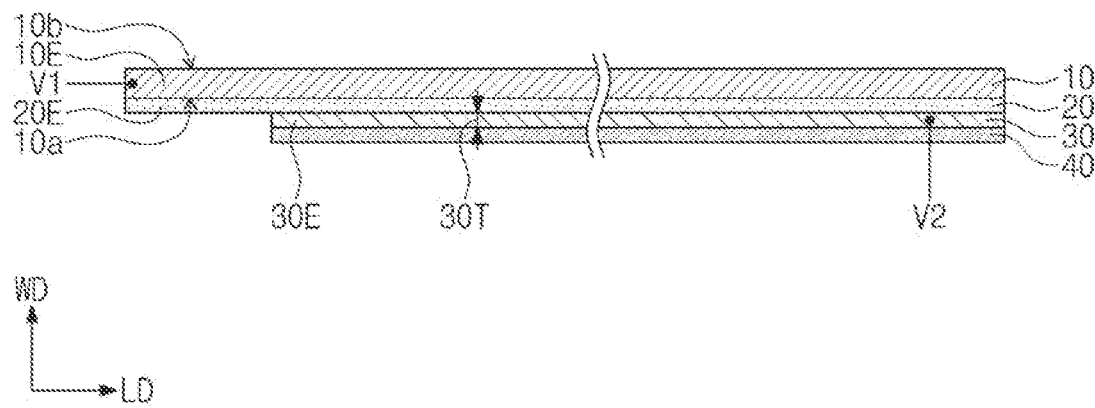
FIG. 32 is a sectional view taken along a line A-A' of FIG. 31.
Figure 33:
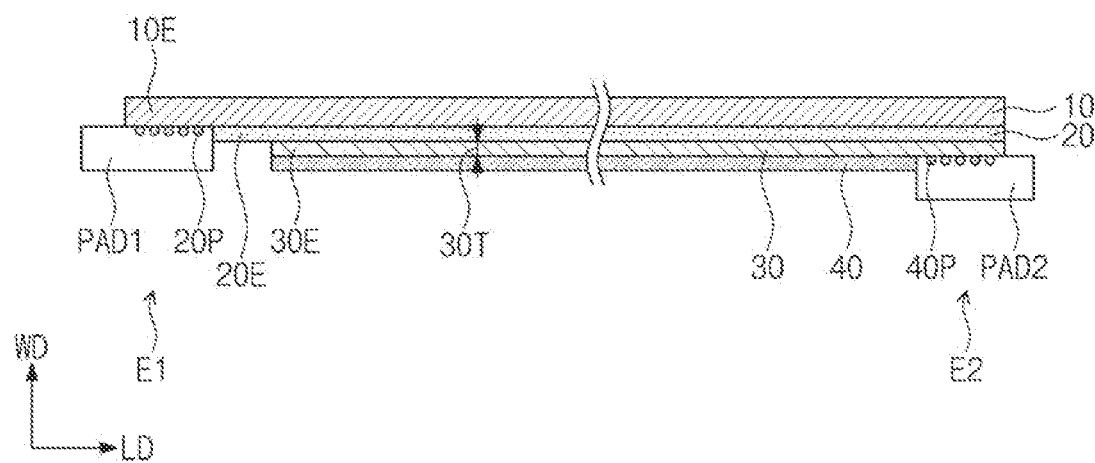
FIG. 33 is a conceptual diagram illustrating a, example method of bonding the capacitor wire of FIG. 31.

FIG. 31 is a perspective view schematically illustrating a capacitor wire according to an example embodiment of the inventive concept, and FIG. 32 is a sectional view taken along a line A-A' of FIG. 31. FIG. 33 is a conceptual diagram illustrating an example method of bonding the capacitor wire of FIG. 31. For the sake of brevity, features, which are different from the capacitor wire of FIGS. 28 to 30, will be mainly described below.

Referring to FIGS. 31 and 32, an end portion 30E of the outer electrode line 30 may be provided near the end portion 10E of the core electrode line 10 and adjacent to the end portion 20E of the dielectric line 20. The end portion 30E of the outer electrode line 30 may be covered with the passivation line 40. In an embodiment, the end portion 30E of the outer electrode line 30 may have substantially the same thickness (e.g., 30T) as the outer electrode line 30. Except for the afore-described differences, the capacitor wire WCAP according to the present embodiment may be configured to have substantially the same features as the capacitor wire WCAP described with reference to FIGS. 28 to 30.

Referring to FIG. 33, the capacitor wire WCAP may have a first end portion E1 and a second end portion E2, which are opposite to each other in the length direction LD. The first end portion E1 of the capacitor wire WCAP may further include the end portion 30E of the outer electrode line 30, which has substantially the same thickness (i.e., 30T) as the outer electrode line 30. The second end portion E2 of the capacitor wire WCAP may include an opposite end portion of the outer electrode line 30. As described with reference to FIG. 30, in the first end portion E1 of the capacitor wire WCAP, the end portion 10E of the core electrode line 10 may be connected to a first pad PAD1, which is one of the pads PAD1 and PAD2, in a wedge bonding method. In the second end portion E2 of the capacitor wire WCAP, the opposite end portion of the outer electrode line 30 may be connected to a second pad PAD2, which is another of the pads PAD1 and PAD2, by a wedge bonding method.

Figure 34:
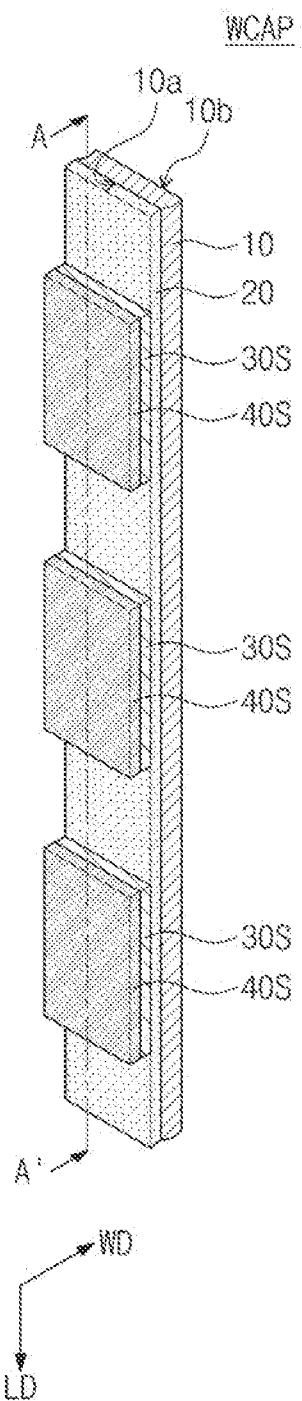
FIG. 34 is a perspective view schematically illustrating a capacitor wire according to an example embodiment of the inventive concept.
Figure 35:
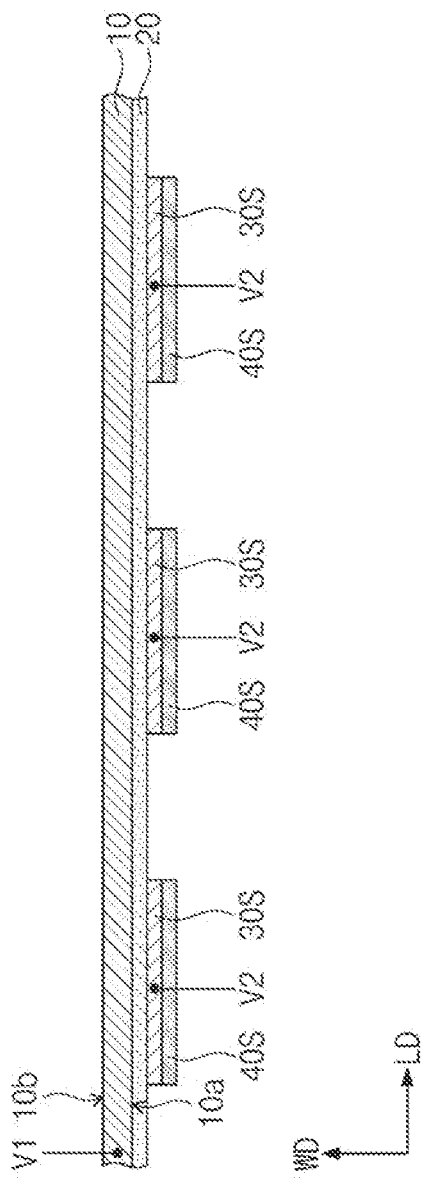
FIG. 35 is a sectional view taken along a line A-A' of FIG. 34.
Figure 36:
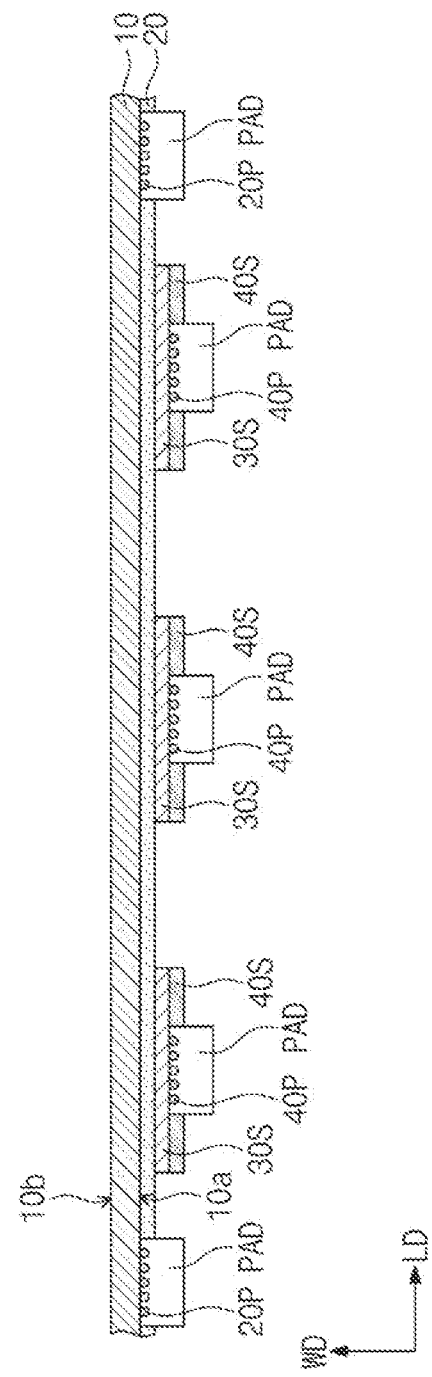
FIG. 36 is a conceptual diagram illustrating an example method of bonding the capacitor wire of FIG. 35.

FIG. 34 is a perspective view schematically illustrating a capacitor wire according to an example embodiment of the inventive concept. FIG. 35 is a sectional view taken along a line A-A' of FIG. 34, and FIG. 36 is a conceptual diagram illustrating an example method of bonding the capacitor wire of FIG. 35. For the sake of brevity, features, which are different from the capacitor wire of FIGS. 28 to 30, will be mainly described below.

Referring to FIGS. 34 and 35, a capacitor wire WCAP may include a core electrode line 10, outer electrode segments 30S provided on the core electrode line 10 to be horizontally spaced apart from each other, a dielectric line 20 interposed between the core electrode line 10 and the outer electrode segments 30S, and passivation segments 40S covering the outer electrode segments 30S, respectively.

The dielectric line 20 may be extended in the length direction LD, between the first surface 10a of the core electrode line 10 and the outer electrode segments 30S. The outer electrode segments 30S may be spaced apart from each other in the length direction LD, on the first surface 10a of the core electrode line 10 and on the dielectric line 20. The passivation segments 40S may be disposed on the first surface 10a of the core electrode line 10 and on the outer electrode segments 30S, respectively.

Although not shown, the end portion 10E of the core electrode line 10 and the end portion 20E of the dielectric line 20 may not be covered with the outer electrode segments 30S and the passivation segments 40S and may be exposed to the outside, as described with reference to FIGS. 28 to 30.

A first voltage V1 may be applied to the core electrode line 10 through the end portion 10E of the core electrode line 10, and a second voltage V2 may be applied to each of the outer electrode segments 30S. The first and second voltages V1 and V2 may be different from each other. As an example, one of the first and second voltages V1 and V2 may be a power voltage, and the other of the first and second voltages V1 and V2 may be a ground voltage. Since the core electrode line 10 and the outer electrode segments 30S are applied with different voltages, electric charges may be accumulated in the dielectric line 20. Accordingly, each of the outer electrode segments 30S and portions of the dielectric line 20 and the core electrode line 10 adjacent thereto may serve as a capacitor.

Referring to FIG. 36, the capacitor wire WCAP may be connected to a plurality of pads PAD by a wire bonding method. The outer electrode segments 30S may be connected to corresponding ones of the pads PAD, respectively, by a stitch bonding method. In an embodiment, the passivation segments 40S may be formed of or may include at least one of insulating or ceramic materials (e.g., Al$_2$O$_3$), and in this case, passivation particles 40P may be left in a bonding interface between each of the outer electrode segments 30S and a corresponding pad PAD. The core electrode line 10 may be connected to a corresponding one of the pads PAD by a wedge bonding method. The dielectric line 20 may be formed of or may include at least one of insulating or ceramic materials (e.g., Al$_2$O$_3$), and in this case, insulating particles 20P may be left in a bonding interface between the core electrode line 10 and the corresponding pad PAD.

Figure 37:
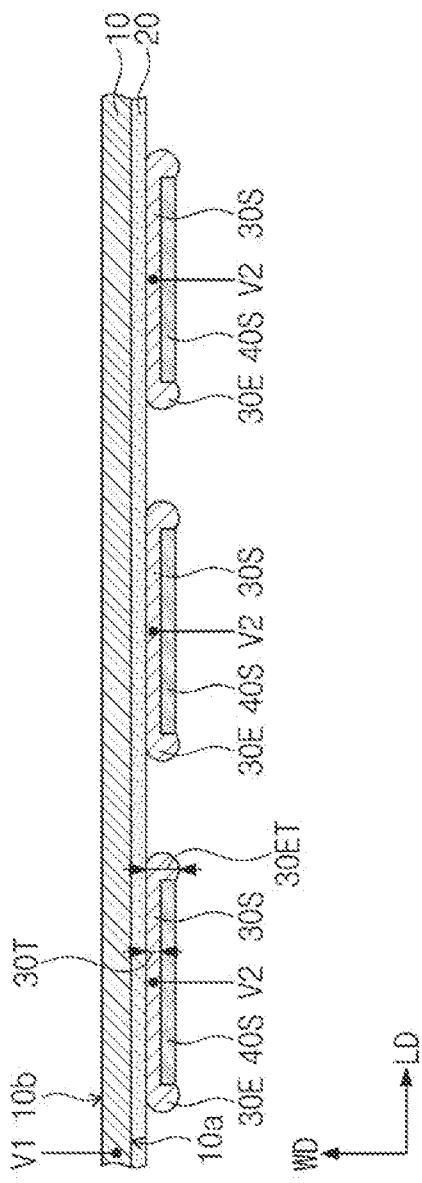
FIG. 37 is a sectional view illustrating a modified example of the capacitor wire of FIG. 34 and corresponding to the line A-A' of FIG. 34.
Figure 38:
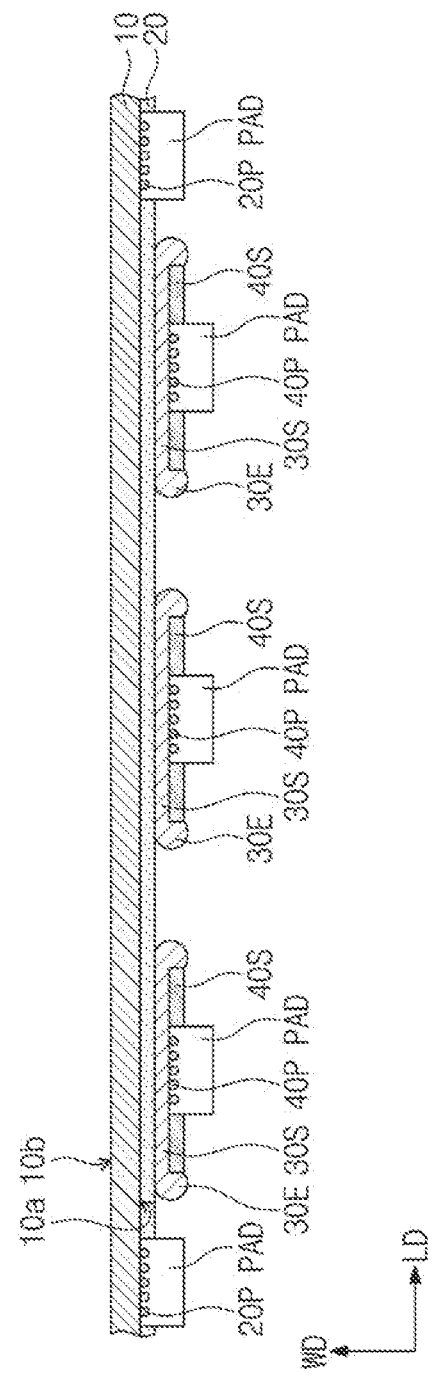
FIG. 38 is a conceptual diagram illustrating an example method of bonding the capacitor wire of FIG. 37.

FIG. 37 is a sectional view illustrating a modified example of the capacitor wire of FIG. 34 and corresponding to the line A-A' of FIG. 34. FIG. 38 is a conceptual diagram illustrating an example method of bonding the capacitor wire of FIG. 37.

Referring to FIG. 37, end portions 30E of the outer electrode segments 30S may not be covered with the passivation segments 40S and may be exposed to the outside. A thickness 30ET of the end portion 30E of each of the outer electrode segments 30S may be larger than a thickness 30T of each of the outer electrode segments 30S. For example, the thickness 30ET of the end portion 30E of each of the outer electrode segments 30S may be larger than the thickness 30T of other portions of each of the outer electrode segments 30S. Except for the afore-described differences, the capacitor wire according to the present embodiment may be configured to have substantially the same features as the capacitor wire WCAP described with reference to FIGS. 34 and 35.

Referring to FIG. 38, the outer electrode segments 30S may include end portions 30E having a relatively large thickness in the width direction WD. The outer electrode segments 30S may be connected to corresponding ones of the pads PAD, respectively, by a stitch bonding method, as described with reference to FIG. 36. The core electrode line 10 may be connected to a corresponding one of the pads PAD by a wedge bonding method.

Figure 39:
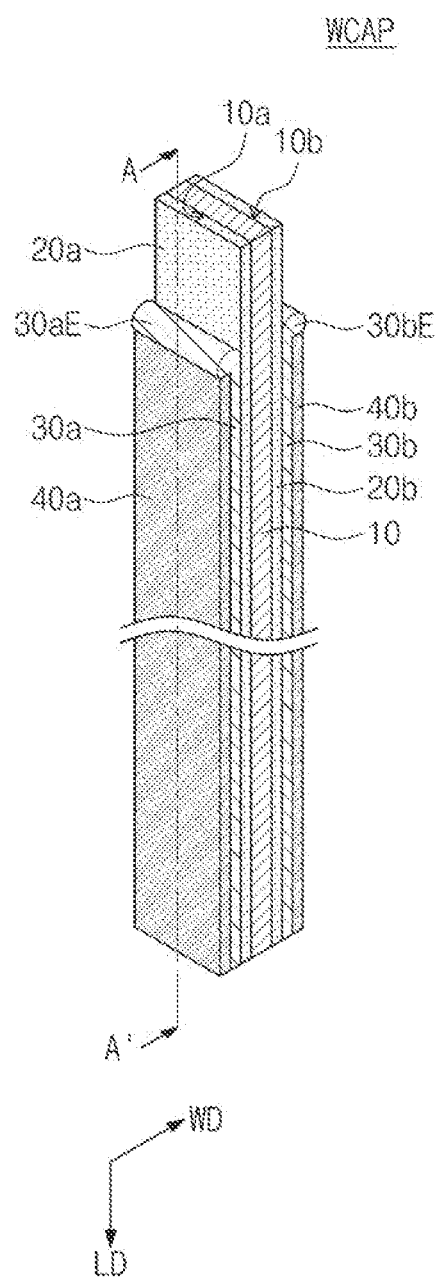
FIG. 39 is a perspective view schematically illustrating a capacitor wire, according to an example embodiment of the inventive concept.
Figure 40:
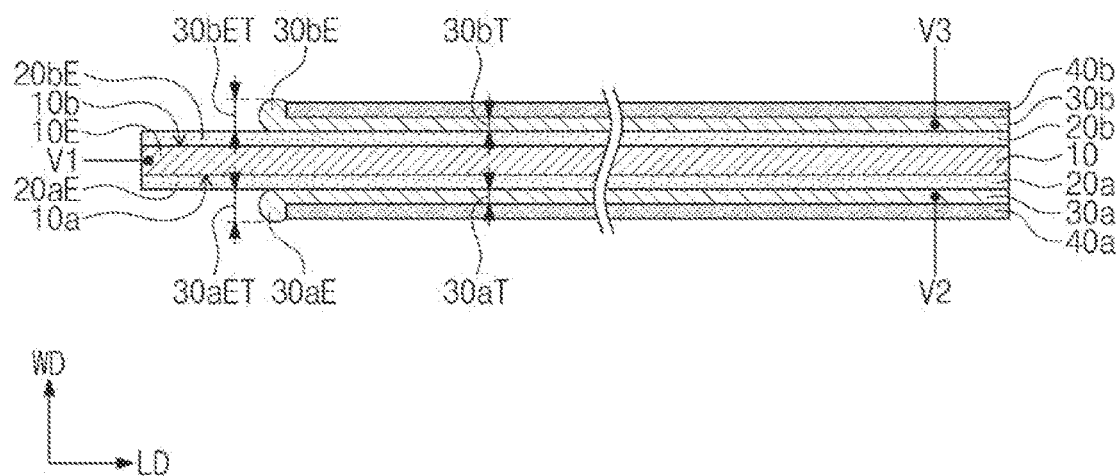
FIG. 40 is a sectional view taken along a line A-A' of FIG. 39.
Figure 41:
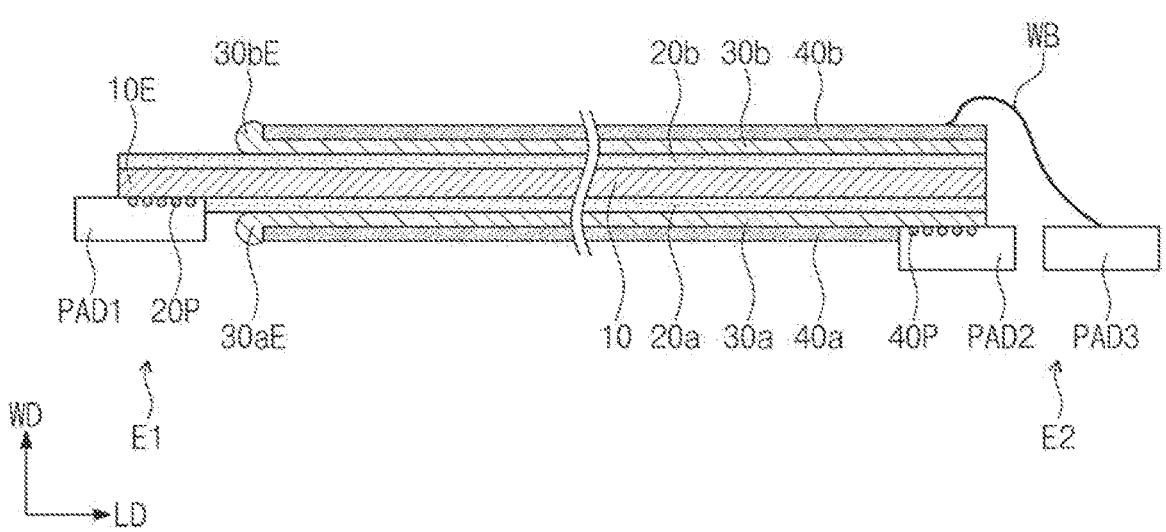
FIG. 41 is a conceptual diagram illustrating an example method of bonding the capacitor wire of FIG. 39.

FIG. 39 is a perspective view schematically illustrating a capacitor wire according to an example embodiment of the inventive concept. FIG. 40 is a sectional view taken along a line A-A' of FIG. 39, and FIG. 41 is a conceptual diagram illustrating an example method of bonding the capacitor wire of FIG. 39. For the sake of brevity, features, which are different from the capacitor wire of FIGS. 28 to 30, will be mainly described below.

Referring to FIGS. 39 and 40, a capacitor wire WCAP may include a core electrode line 10, a first outer electrode line 30a and a second outer electrode line 30b, which are spaced apart from each other with the core electrode line 10 interposed therebetween, a lower dielectric line 20a and an upper dielectric line 20b, which are respectively interposed between the core electrode line 10 and the first outer electrode line 30a and between the core electrode line 10 and the second outer electrode line 30b, and a first passivation line 40a and a second passivation line 40b, which are respectively disposed on the first outer electrode line 30a and the second outer electrode line 30b.

The core electrode line 10 may be provided in the form of a wire and may have a polygonal (e.g., rectangular) shape, when viewed in a section taken along the width direction WD. The core electrode line 10 may have a first surface 10a and a second surface 10b, which are opposite to each other in the width direction WD and are parallel to each other.

The lower dielectric line 20a, the first outer electrode line 30a, and the first passivation line 40a may be sequentially stacked on the first surface 10a of the core electrode line 10, and the upper dielectric line 20b, the second outer electrode line 30b, and the second passivation line 40b may be sequentially stacked on the second surface 10b of the core electrode line 10.

The lower dielectric line 20a may be extended in the length direction LD, between the first surface 10a of the core electrode line 10 and the first outer electrode line 30a, and the first outer electrode line 30a may be extended in the length direction LD, between the lower dielectric line 20a and the first passivation line 40a. The first passivation line 40a may be extended in the length direction LD, on the first outer electrode line 30a. The first outer electrode line 30a may be electrically disconnected or isolated from the core electrode line 10 by the lower dielectric line 20a. The upper dielectric line 20b may be extended in the length direction LD, between the second surface 10b of the core electrode line 10 and the second outer electrode line 30b, and the second outer electrode line 30b may be extended in the length direction LD, between the upper dielectric line 20b and the second passivation line 40b. The second passivation line 40b may be extended in the length direction LD, on the second outer electrode line 30b. The second outer electrode line 30b may be electrically disconnected or isolated from the core electrode line 10 by the upper dielectric line 20b.

An end portion 20aE of the lower dielectric line 20a may not be covered with the first outer electrode line 30a and the first passivation line 40a and may be exposed to the outside. An end portion 20bE of the upper dielectric line 20b may not be covered with the second outer electrode line 30b and the second passivation line 40b and may be exposed to the outside. The end portion 20aE of the lower dielectric line 20a and the end portion 20bE of the upper dielectric line 20b may be adjacent to an end portion 10E of the core electrode line 10 and may cover the end portion 10E of the core electrode line 10.

An end portion 30aE of the first outer electrode line 30a may be provided near the end portion 10E of the core electrode line 10 and adjacent to the end portion 20aE of the lower dielectric line 20a. The end portion 30aE of the first outer electrode line 30a may not be covered with the first passivation line 40a and may be exposed to the outside. In an embodiment, a thickness 30aET of the end portion 30aE of the first outer electrode line 30a may be larger than a thickness 30aT of the first outer electrode line 30a. An end portion 30bE of the second outer electrode line 30b may be provided near the end portion 10E of the core electrode line 10 and adjacent to the end portion 20bE of the upper dielectric line 20b. The end portion 30bE of the second outer electrode line 30b may not be covered with the second passivation line 40b and may be exposed to the outside. In an embodiment, a thickness 30bET of the end portion 30bE of the second outer electrode line 30b may be larger than a thickness 30bT of the second outer electrode line 30b.

A first voltage V1 may be applied to the core electrode line 10 through the end portion 10E of the core electrode line 10. A second voltage V2 different from the first voltage V1 may be applied to the first outer electrode line 30a, and a third voltage V3 different from the first voltage V1 may be applied to the second outer electrode line 30b. The second voltage V2 may be equal to or different from the third voltage V3. In an embodiment, the first voltage V1 may be a power or ground voltage. Since the first and second outer electrode lines 30a and 30b are applied with a voltage different from the core electrode line 10, electric charges may be accumulated in the lower and upper dielectric lines 20a and 20b. Accordingly, the capacitor wire WCAP, which has a wire shape and is used as a capacitor, may be realized.

Referring to FIG. 41, the capacitor wire WCAP may be connected to pads PAD1, PAD2, and PAD3 by a wire bonding method. The capacitor wire WCAP may have a first end portion E1 and a second end portion E2, which are opposite to each other in the length direction LD. In the first end portion E1 of the capacitor wire WCAP, the end portion 10E of the core electrode line 10 may be connected to a first pad PAD1, which is one of the pads PAD1, PAD2, and PAD3, by a wedge bonding method. The lower dielectric line 20a may be formed of or may include at least one of insulating or ceramic materials (e.g., $Al_2O_3$), and in this case, insulating particles 20P may be left in a bonding interface between the end portion 10E of the core electrode line 10 and the first pad PAD1. In the second end portion E2 of the capacitor wire WCAP, an end portion of the first outer electrode line 30a may be connected to a second pad PAD2, which is one of the pads PAD1, PAD2, and PAD3, by a wedge bonding method. In an embodiment, the first passivation line 40a may be formed of or may include at least one of insulating or ceramic materials (e.g., $Al_2O_3$), and in this case, passivation particles 40P may be left in a bonding interface between the end portion of the first outer electrode line 30a and the second pad PAD2. The second outer electrode line 30b may be connected to a third pad PAD3, which is one of the pads PAD1, PAD2, and PAD3, through a conductive wire WB.

Figure 42:
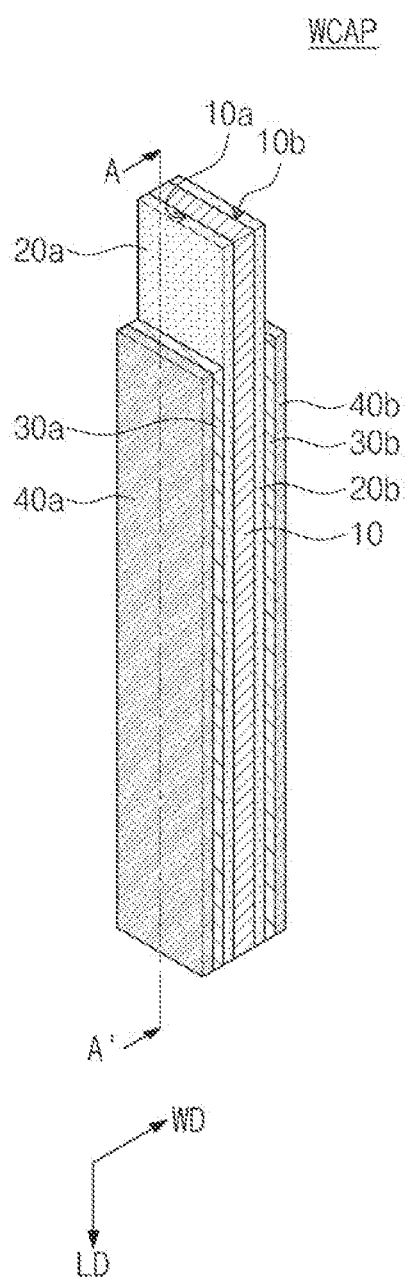
FIG. 42 is a perspective view schematically illustrating a capacitor wire, according to an example embodiment of the inventive concept.
Figure 43:
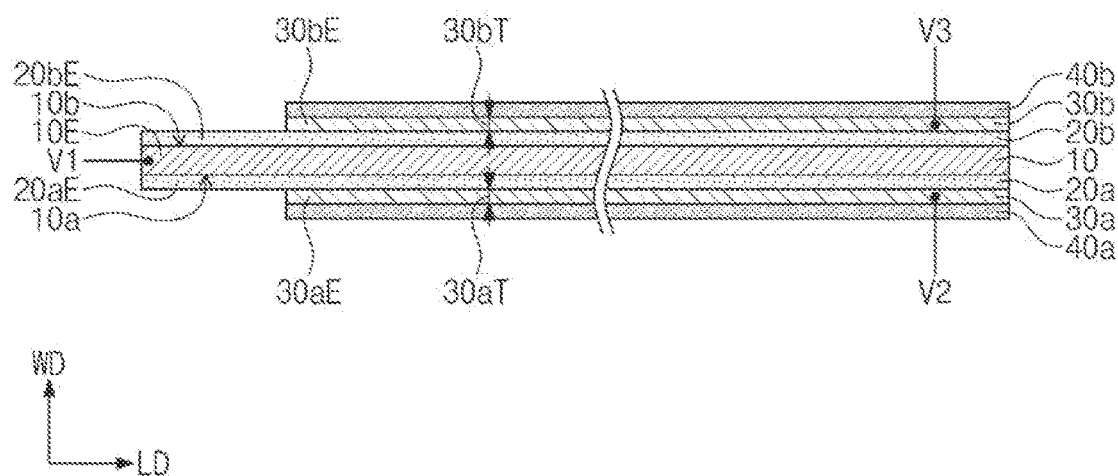
FIG. 43 is a sectional view taken along a line A-A' of FIG. 42.
Figure 44:
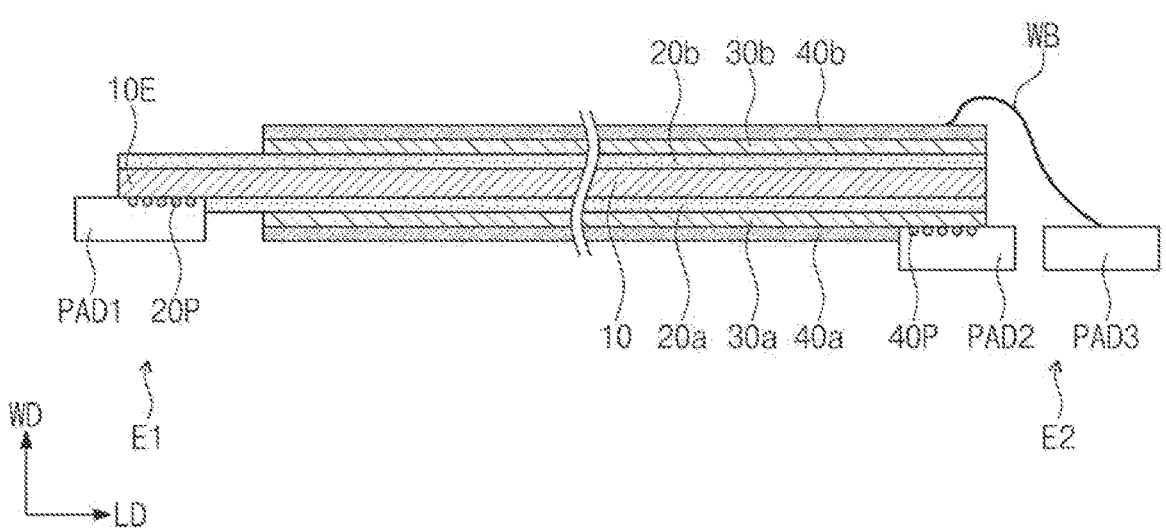
FIG. 44 is a conceptual diagram illustrating an example method of bonding the capacitor wire of FIG. 42.

FIG. 42 is a perspective view schematically illustrating a capacitor wire according to an example embodiment of the inventive concept, and FIG. 43 is a sectional view taken along a line A-A' of FIG. 42. FIG. 44 is a conceptual diagram illustrating an example method of bonding the capacitor wire of FIG. 42. For the sake of brevity, features, which are different from the capacitor wire of FIGS. 39 to 41, will be mainly described below.

Referring to FIGS. 42 and 43, the end portion 30aE of the first outer electrode line 30a may be covered with the first passivation line 40a, and the end portion 30bE of the second outer electrode line 30b may be covered with the second passivation line 40b. In an embodiment, the end portion 30aE of the first outer electrode line 30a may have substantially the same thickness 30aT as the first outer electrode line 30a, and the end portion 30bE of the second outer electrode line 30b may have substantially the same thickness 30bT as the second outer electrode line 30b. Except for the aforedescribed differences, the capacitor wire WCAP according to the present embodiment may be configured to have substantially the same features as the capacitor wire WCAP described with reference to FIGS. 39 to 41.

Referring to FIG. 44, in the first end portion E1 of the capacitor wire WCAP, the end portion 10E of the core electrode line 10 may be connected to a first pad PAD1, which is one of the pads PAD1, PAD2, and PAD3, by a wedge bonding method. In the second end portion E2 of the capacitor wire WCAP, an end portion of the first outer electrode line 30a may be connected to a second pad PAD2, which is another of the pads PAD1, PAD2, and PAD3, by a wedge bonding method. The second outer electrode line 30b may be connected to a third pad PAD3, which is other of the pads PAD1, PAD2, and PAD3, through a conductive wire WB.

Figure 45:
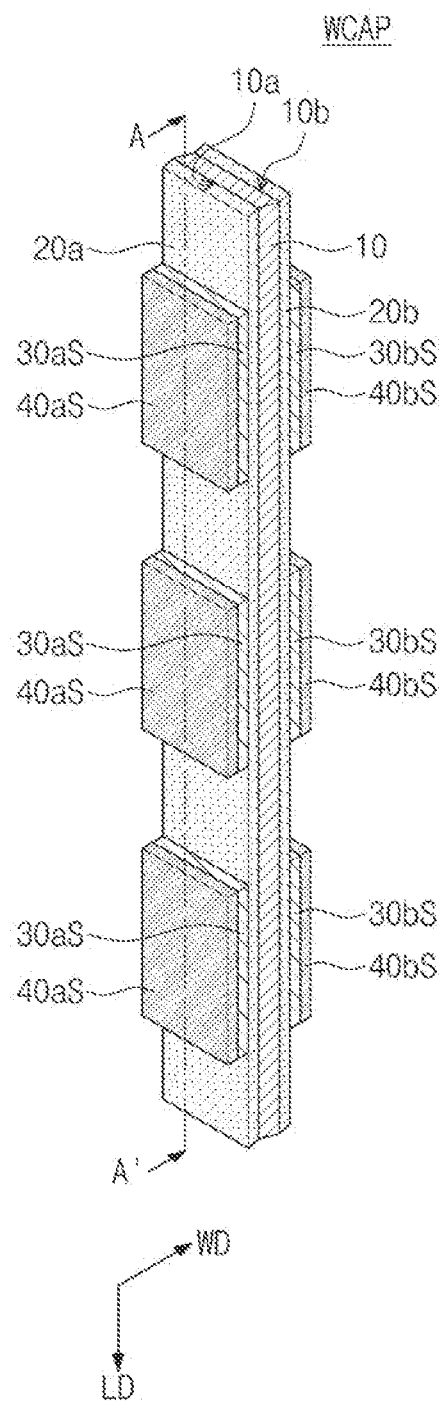
FIG. 45 is a perspective view schematically illustrating a capacitor wire, according to an example embodiment of the inventive concept.

FIG. 45 is a perspective view schematically illustrating a capacitor wire according to an example embodiment of the inventive concept. FIG. 46 is a sectional view taken along a line A-A' of FIG. 45, and FIG. 47 is a conceptual diagram illustrating an example method of bonding the capacitor wire of FIG. 46. For the sake of brevity, features, which are different from the capacitor wire of FIGS. 34 to 36, will be mainly described below.

Referring to FIGS. 45 and 46, a capacitor wire WCAP may include a core electrode line 10, first outer electrode segments 30aS, which are provided on a first surface 10a of the core electrode line 10 to be horizontally spaced apart from each other, a lower dielectric line 20a, which is interposed between the first surface 10a of the core electrode line 10 and the first outer electrode segments 30aS, first passivation segments 40aS, which are provided to cover the first outer electrode segments 30aS, respectively, second outer electrode segments 30bS, which are provided on a second surface 10b of the core electrode line 10 to be horizontally spaced apart from each other, an upper dielectric line 20b, which is interposed between the second surface 10b of the core electrode line 10 and the second outer electrode segments 30bS, and second passivation segments 40bS, which are provided to cover the second outer electrode segments 30bS, respectively.

The lower dielectric line 20a may be extended in the length direction LD between the first surface 10a of the core electrode line 10 and the first outer electrode segments 30aS, and the upper dielectric line 20b may be extended in the length direction LD between the second surface 10b of the core electrode line 10 and the second outer electrode segments 30bS.

The first outer electrode segments 30aS on the first surface 10a of the core electrode line 10 may be provided on the lower dielectric line 20a to be spaced apart from each other in the length direction LD. The first passivation segments 40aS may be disposed on the first surface 10a of the core electrode line 10 and on the first outer electrode segments 30aS, respectively. The second outer electrode segments 30bS on the second surface 10b of the core electrode line 10 may be provided on the upper dielectric line 20b to be spaced apart from each other in the length direction LD. The second passivation segments 40bS may be disposed on the second surface 10b of the core electrode line 10 and on the second outer electrode segments 30bS, respectively.

Although not shown, as described with reference to FIGS. 39 to 41, the end portion 10E of the core electrode line 10, the end portion 20aE of the lower dielectric line 20a, and the end portion 20bE of the upper dielectric line 20b may not be covered with the first and second outer electrode segments 30aS and 30bS and the first and second passivation segments 40aS and 40bS and may be exposed to the outside.

A first voltage V1 may be applied to the core electrode line 10 through the end portion 10E of the core electrode line 10. A second voltage V2 different from the first voltage V1 may be applied to each of the first outer electrode segments 30aS, and a third voltage V3 different from the first voltage V1 may be applied to each of the second outer electrode segments 30bS. The second voltage V2 may be equal to or different from the third voltage V3. In an embodiment, the first voltage V1 may be a power or ground voltage. Since the first and second outer electrode segments 30aS and 30bS are applied with a voltage different from the core electrode line 10, electric charges may be accumulated in the lower and upper dielectric lines 20a and 20b. Accordingly, each of the first and second outer electrode segments 30aS and 30bS, a portion of each of the lower and upper dielectric lines 20a and 20b adjacent thereto, and a portion of the core electrode line 10 adjacent thereto may serve as a capacitor.

Referring to FIG. 47, the capacitor wire WCAP may be connected to a plurality of pads PAD by a wire bonding method. The first outer electrode segments 30aS may be connected to corresponding ones of the pads PAD, respectively, by a stitch bonding method. In an embodiment, the first passivation segments 40aS may be formed of or may include at least one of insulating or ceramic materials (e.g., $Al_2O_3$), and in this case, passivation particles 40P may be left in a bonding interface between each of the first outer electrode segments 30aS and a corresponding pad PAD. The second outer electrode segments 30bS may be connected to corresponding ones of the pads PAD, respectively, through conductive wires WB. The core electrode line 10 may be connected to a corresponding one of the pads PAD by a wedge bonding method. The lower dielectric line 20a may be formed of or may include at least one of insulating or ceramic materials (e.g., $Al_2O_3$), and in this case, insulating particles 20P may be left in a bonding interface between the core electrode line 10 and the corresponding pad PAD.

Figure 48:
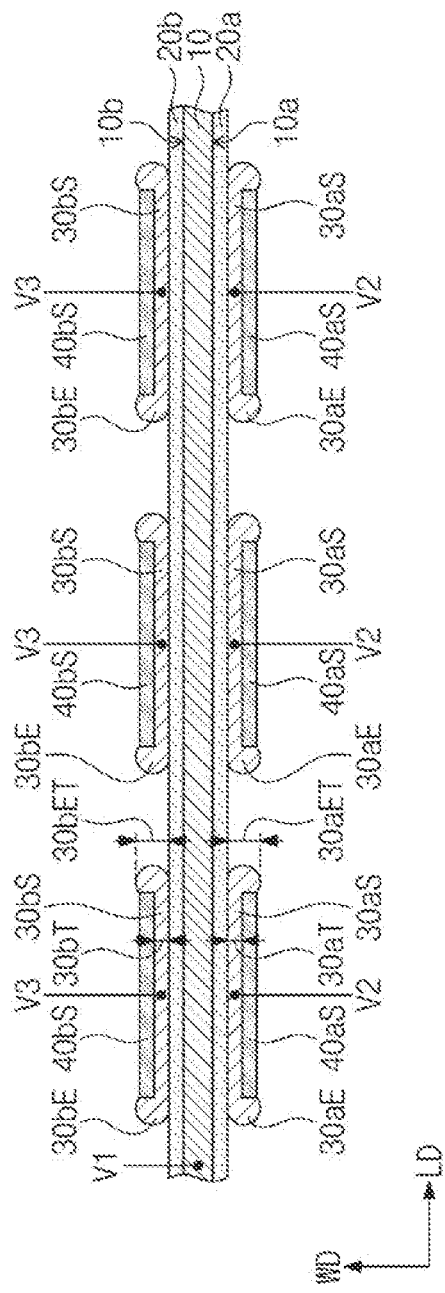
FIG. 48 is a sectional view illustrating a modified example of the capacitor wire of FIG. 45 and corresponding to the line A-A' of FIG. 45.
Figure 49:
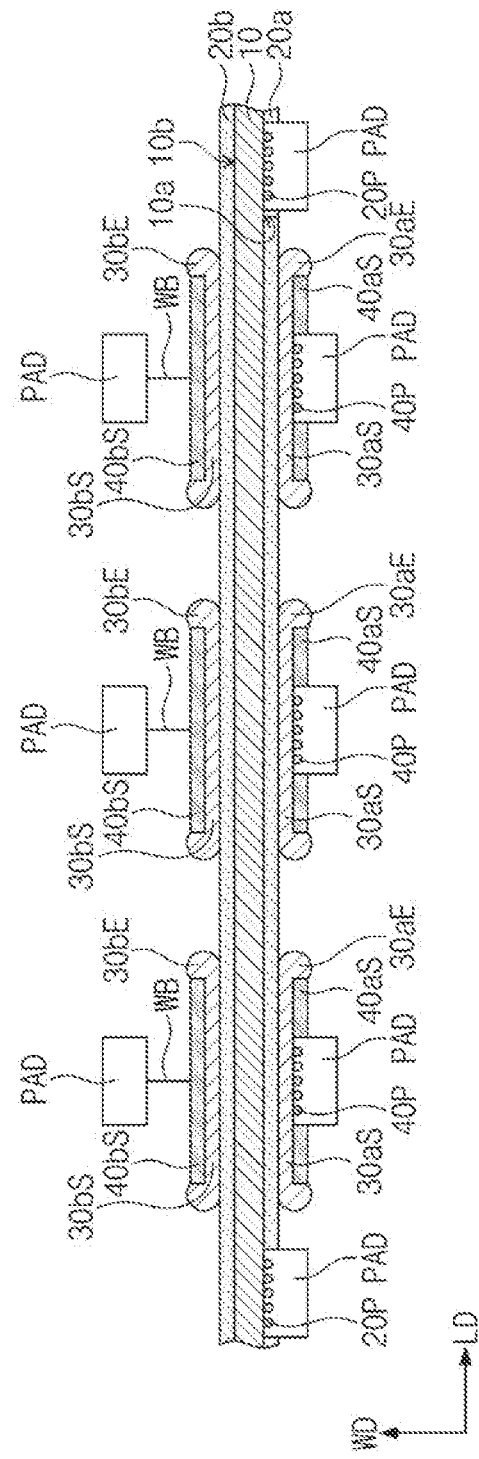
FIG. 49 is a conceptual diagram illustrating an example method of bonding the capacitor wire of FIG. 48.

FIG. 48 is a sectional view illustrating a modified example of the capacitor wire of FIG. 45 and corresponding to the line A-A' of FIG. 45. FIG. 49 is a conceptual diagram illustrating an example method of bonding the capacitor wire of FIG. 48.

Referring to FIG. 48, end portions 30aE of the first outer electrode segments 30aS may not be covered with respective ones of the first passivation segments 40aS and may be exposed to the outside. A thickness 30aET of the end portions 30aE may be larger than a thickness 30aT of the first outer electrode segments 30aS. End portions 30bE of the second outer electrode segments 30bS may not be covered with respective ones of the second passivation segments 40bS and may be exposed to the outside. A thickness 30bET of the end portions 30bE may be larger than a thickness 30bT of the second outer electrode segments 30bS. Except for the afore-described differences, the capacitor wire according to the present embodiment may be configured to have substantially the same features as the capacitor wire WCAP described with reference to FIGS. 45 and 46.

Referring to FIG. 49, each of the first outer electrode segments 30aS may include end portions 30aE having a relatively large thickness, and each of the second outer electrode segments 30bS may include end portions 30bE having a relatively large thickness. The capacitor wire in the present embodiment may be connected to a plurality of pads PAD by the same bonding method as described with reference to FIG. 47.

FIGS. 50 to 53 are conceptual diagrams, each of which illustrates an electronic device, on which a capacitor wire is mounted, according to example embodiments of the inventive concept.

Referring to FIGS. 50 to 53, an electronic device may include a substrate 100, pads PAD disposed on a surface of the substrate 100, and a capacitor wire WCAP electrically connected to the pads PAD.

The substrate 100 may be a semiconductor chip, a redistribution substrate, or a printed circuit board. The pads PAD may be electrically connected to internal interconnection lines in the substrate 100 and may be formed of or may include at least one of conductive or metallic materials. The capacitor wire WCAP may be one of the capacitor wires WCAP described with reference to FIGS. 1 to 49.

The capacitor wire WCAP may be connected to the pads PAD by a wire bonding method. The capacitor wire WCAP may have a first end portion E1 and a second end portion E2, which are opposite to each other in an elongated or length direction of the capacitor wire WCAP. Each of the first and second end portions E1 and E2 of the capacitor wire WCAP may be connected to a corresponding one of the pads PAD by a ball or wedge bonding method, as described with reference to FIGS. 1 to 49. The capacitor wire WCAP, which is connected to the pads PAD, may have an arch shape.

Figure 50:
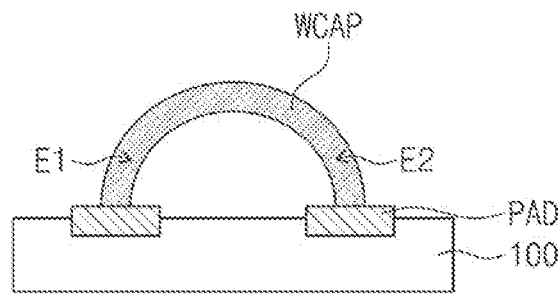
FIGS. 50 to 57 are conceptual diagrams, each of which illustrates an electronic device, on which a capacitor wire is mounted, according to an example embodiment of the inventive concept.
Figure 51:
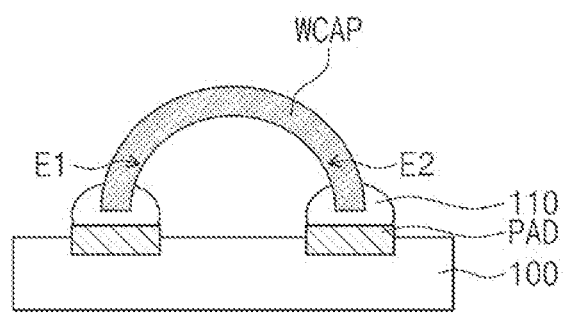
Figure 52:
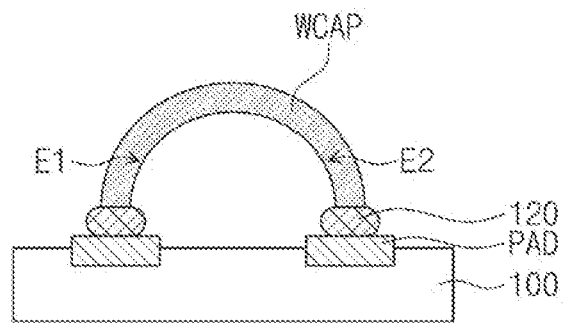
Figure 53:
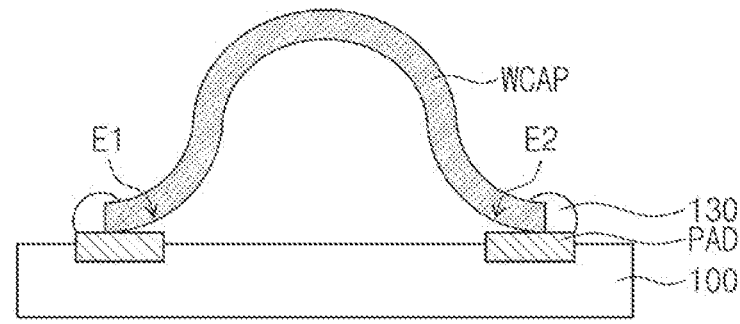

In an embodiment, as shown in FIG. 50, each of the first and second end portions E1 and E2 of the capacitor wire WCAP may be in direct contact with the corresponding pad PAD. In another embodiment, as shown in FIG. 51, a solder ball 110 may be interposed between each of the first and second end portions E1 and E2 of the capacitor wire WCAP and the corresponding pad PAD. The solder ball 110 may be formed of or may include at least one of conductive or metallic materials. Each of the first and second end portions E1 and E2 of the capacitor wire WCAP may include a portion that is inserted into the solder ball 110. In other embodiment, as shown in FIG. 52, a conductive bump 120 may be interposed between each of the first and second end portions E1 and E2 of the capacitor wire WCAP and the corresponding pad PAD. The conductive bump 120 may be formed of or may include at least one of conductive or metallic materials. In still other embodiment, as shown in FIG. 53, each of the first and second end portions E1 and E2 of the capacitor wire WCAP may be in direct contact with the corresponding pad PAD, and a reinforcing pattern 130 may be disposed on the corresponding pad PAD. The reinforcing pattern 130 may be provided to cover each of the first and second end portions E1 and E2 and the corresponding pad PAD. The reinforcing pattern 130 may be formed of or may include at least one of conductive or metallic materials.

Figure 54:
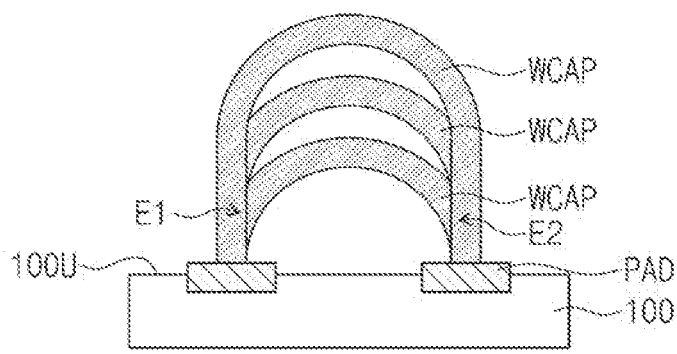
Figure 55:
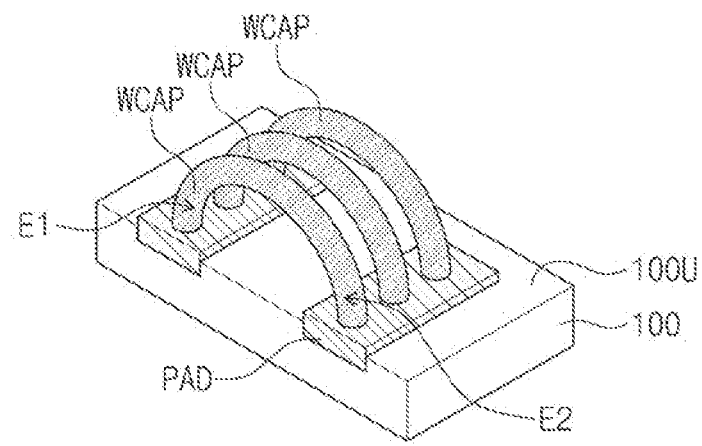
Figure 56:
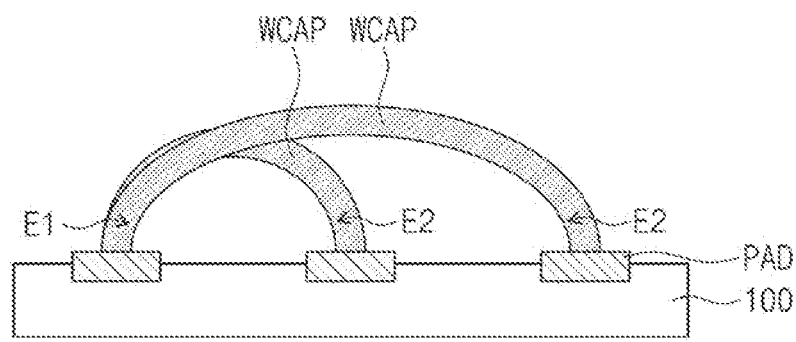

FIGS. 54 to 56 are conceptual diagrams, each of which illustrates an electronic device, on which a capacitor wire is mounted, according to example embodiments of the inventive concept. For the sake of brevity, features, which are different from the electronic device of FIGS. 50 to 53, will be mainly described below.

Referring to FIGS. 54 to 56, an electronic device may include a substrate 100, pads PAD disposed on a surface of the substrate 100, and a plurality of capacitor wires WCAP electrically connected to the pads PAD. The capacitor wires WCAP may be connected to the pads PAD by a wire bonding method. Each of the capacitor wires WCAP connected to the pads PAD may have an arch shape.

In an embodiment, as shown in FIG. 54, first end portions E1 of the capacitor wires WCAP may be connected in common to one of the pads PAD, and second end portions E2 of the capacitor wires WCAP may be connected in common to another of the pads PAD. The capacitor wires WCAP may have different lengths from each other and may be mounted on corresponding ones of the pads PAD to be stacked in a direction perpendicular to an upper surface of the substrate 100.

In another embodiment, as shown in FIG. 55, first end portions E1 of the capacitor wires WCAP may be connected in common to one of the pads PAD, and second end portions E2 of the capacitor wires WCAP may be connected in common to another of the pads PAD. The capacitor wires WCAP may have the same length and may be mounted on corresponding ones of the pads PAD to be spaced apart from each other in a direction parallel to an upper surface of the substrate 100.

In other embodiment, as shown in FIG. 56, first end portions E1 of the capacitor wires WCAP may be connected in common to one of the pads PAD, whereas second end portions E2 of the capacitor wires WCAP may be respectively connected to different ones of the pads PAD. In this case, a ground voltage may be applied in common to the capacitor wires WCAP, and different power voltages may be applied to the capacitor wires WCAP, respectively.

Figure 57:
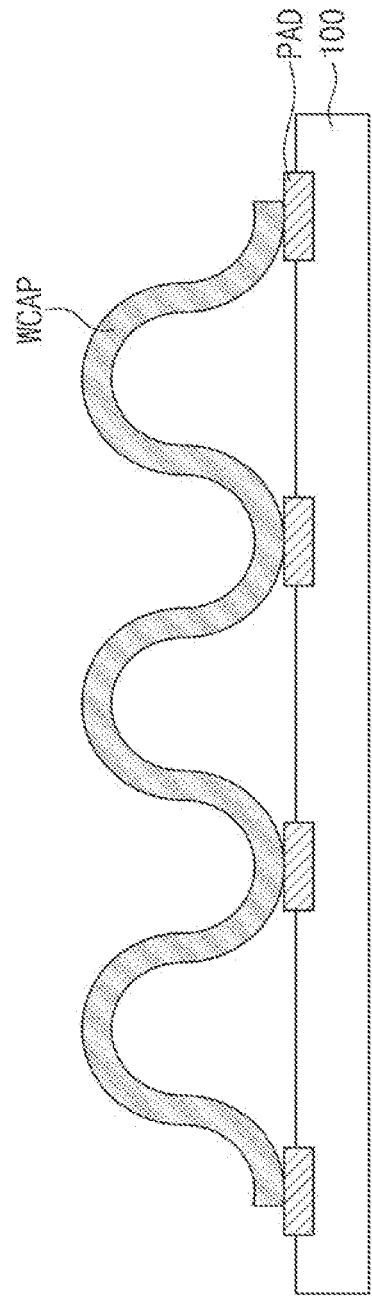

FIG. 57 is a conceptual diagram illustrating an electronic device, on which a capacitor wire is mounted, according to an example embodiment of the inventive concept. For the sake of brevity, features, which are different from the electronic device of FIGS. 50 to 53, will be mainly described below.

Referring to FIG. 57, an electronic device may include a substrate 100, pads PAD disposed on a surface of the substrate 100, and a capacitor wire WCAP electrically connected to the pads PAD. The capacitor wire WCAP may be one of the capacitor wires WCAP described with reference to FIGS. 16, 34, and 45.

The capacitor wire WCAP may be connected to the pads PAD by a stitch bonding method. The capacitor wire WCAP may include outer electrode segments 30S, 30aS, and 30bS, which are spaced apart from each other in an elongation or length direction of the capacitor wire WCAP, as described with reference to FIGS. 16, 34, and 45. The outer electrode segments 30S, 30aS, and 30bS of the capacitor wire WCAP may be connected to corresponding ones of the pads PAD by a stitch bonding method. The capacitor wire WCAP connected to the pads PAD may have a plurality of portions, each of which has an arch shape.

Figure 58:
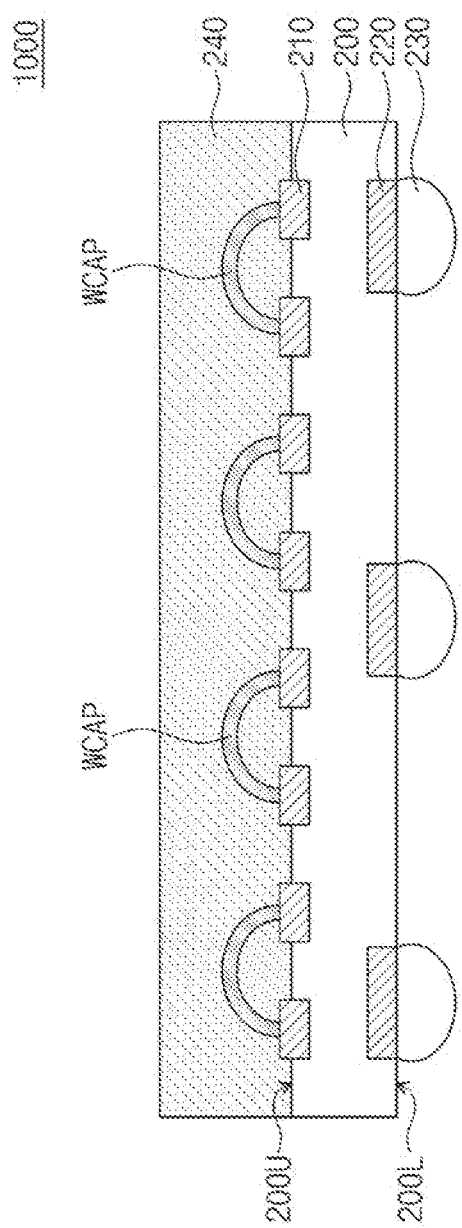
FIGS. 58 to 65 are conceptual diagrams, each of which illustrates an electronic device, on which a capacitor wire is mounted, according to an example embodiment of the inventive concept.

FIG. 58 is a sectional view illustrating an electronic device, on which a capacitor wire is mounted, according to an example embodiment of the inventive concept.

Referring to FIG. 58, an electronic device 1000 may include a package substrate 200, first substrate pads 210, second substrate pads 220, outer connection terminals 230, a plurality of capacitor wires WCAP, and a mold layer 240.

The package substrate 200 may be a printed circuit board or a redistribution substrate and may have an upper surface 200U and a lower surface 200L, which are opposite to each other. The first substrate pads 210 may be disposed on the upper surface 200U of the package substrate 200, and the second substrate pads 220 may be disposed on the lower surface 200L of the package substrate 200. The first substrate pads 210 may be electrically connected to the second substrate pads 220 through internal interconnection lines in the package substrate 200. The first and second substrate pads 210 and 220 may be formed of or may include at least one of conductive or metallic materials. The outer connection terminals 230 may be disposed on the lower surface 200L of the package substrate 200 and may be disposed on the second substrate pads 220, respectively. The outer connection terminals 230 may be electrically connected to the second substrate pads 220. The outer connection terminals 230 may be formed of or may include at least one of pillars, bumps, or solder balls and may be formed of or may include a conductive material.

Each of the capacitor wires WCAP may be connected to corresponding ones of the first substrate pads 210. Each of the capacitor wires WCAP may be connected to the corresponding first substrate pads 210 by a wire bonding method, as described with reference to FIGS. 50 to 57. Each of the capacitor wires WCAP connected to the first substrate pads 210 may have an arch shape.

The mold layer 240 may be disposed on the upper surface 200U of the package substrate 200 to hermetically encapsulate the capacitor wires WCAP. The mold layer 240 may be formed of or may include at least one of insulating materials (e.g., epoxy molding compounds).

In an embodiment, the electronic device 1000 may be a capacitor chip that is used as a capacitor.

Figure 59:
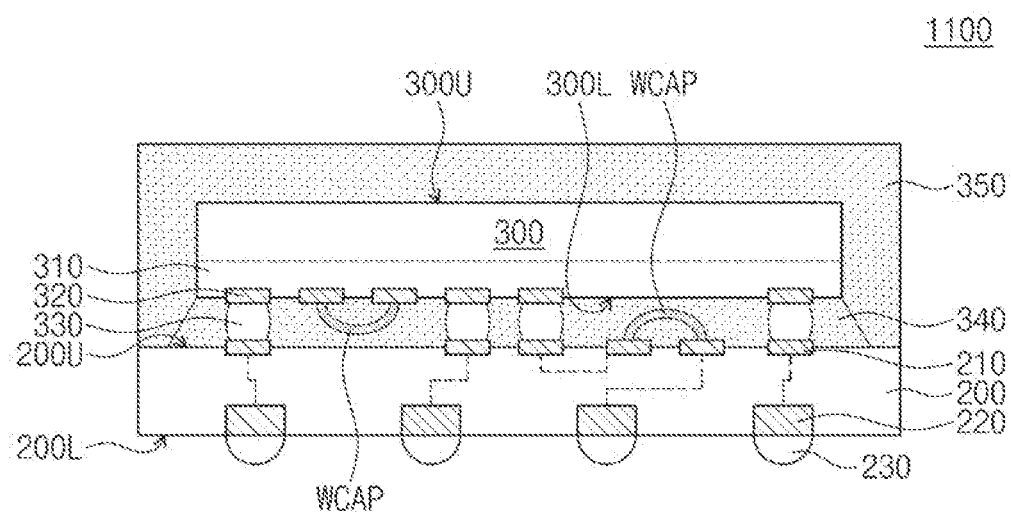

FIG. 59 is a sectional view illustrating an electronic device, on which a capacitor wire is mounted, according to an example embodiment of the inventive concept.

Referring to FIG. 59, an electronic device 1100 may include a package substrate 200, first substrate pads 210, second substrate pads 220, outer connection terminals 230, a semiconductor chip 300, at least one capacitor wire WCAP, connection bumps 330, an under fill layer 340, and a chip mold layer 350.

The package substrate 200 may be a printed circuit board or a redistribution substrate and may have an upper surface 200U and a lower surface 200L, which are opposite to each other. The first substrate pads 210 may be disposed on the upper surface 200U of the package substrate 200, and the second substrate pads 220 may be disposed on the lower surface 200L of the package substrate 200. The first substrate pads 210 may be electrically connected to the second substrate pads 220 through internal interconnection lines in the package substrate 200. The first and second substrate pads 210 and 220 may be formed of or may include at least one of conductive or metallic materials. The outer connection terminals 230 may be disposed on the lower surface 200L of the package substrate 200 and may be disposed on the second substrate pads 220, respectively. The outer connection terminals 230 may be electrically connected to the second substrate pads 220. The outer connection terminals 230 may include at least one of pillar, bumps, or solder balls and may be formed of or may include at least one of conductive materials.

The semiconductor chip 300 may be mounted on the upper surface 200U of the package substrate 200. The semiconductor chip 300 may be a memory chip, a logic chip, an application processor (AP) chip, or a system-on-chip (SOC) and may have an upper surface 300U and a lower surface 300L, which are opposite to each other. The semiconductor chip 300 may include a circuit layer 310, which is adjacent to the lower surface 300L of the semiconductor chip 300, and chip pads 320, which are disposed on the lower surface 300L of the semiconductor chip 300. The chip pads 320 may be electrically connected to the circuit layer 310. The semiconductor chip 300 may be disposed such that the lower surface 300L of the semiconductor chip 300 faces the upper surface 200U of the package substrate 200.

The connection bumps 330 may be disposed between the semiconductor chip 300 and the package substrate 200 and may electrically connect the semiconductor chip 300 to the package substrate 200. The connection bumps 330 may be disposed on corresponding ones of the chip pads 320, respectively, and may be electrically connected to the corresponding chip pads 320, respectively. The connection bumps 330 may be disposed on and electrically connected to respective ones of the first substrate pads 210. The semiconductor chip 300 may be electrically connected to the package substrate 200 through the connection bumps 330, the corresponding chip pads 320, and the corresponding first substrate pads 210. The connection bumps 330 may include at least one of pillars, bumps, or solder balls and may be formed of or may include at least one of conductive materials.

The at least one capacitor wire WCAP may be disposed between the semiconductor chip 300 and the package substrate 200. As an example, the at least one capacitor wire WCAP may be disposed below the semiconductor chip 300 and may be connected to corresponding ones of the first substrate pads 210. As another example, the at least one capacitor wire WCAP may be disposed on the lower surface 300L of the semiconductor chip 300 and may be connected to corresponding ones of the chip pads 320. The at least one capacitor wire WCAP may be connected to the corresponding first substrate pads 210 or the corresponding chip pads 320 by a wire bonding method, as described with reference to FIGS. 50 to 57. The at least one capacitor wire WCAP, which is connected to the corresponding first substrate pads 210 or the corresponding chip pads 320, may have an arch shape.

The under fill layer 340 may fill a space between the semiconductor chip 300 and the package substrate 200 and may cover the connection bumps 330 and the at least one capacitor wire WCAP. The under fill layer 340 may be formed of or may include at least one of insulating polymer materials (e.g., epoxy resins).

The chip mold layer 350 may be disposed on the upper surface 200U of the package substrate 200 to hermetically encapsulate the semiconductor chip 300. The chip mold layer 350 may cover the semiconductor chip 300 and the under fill layer 340 and may be in contact with the upper surface 200U of the package substrate 200. The chip mold layer 350 may be formed of or may include at least one of insulating materials (e.g., epoxy molding compounds).

The electronic device 1100 may be a semiconductor package, which includes the semiconductor chip 300 mounted on the package substrate 200.

Figure 60:
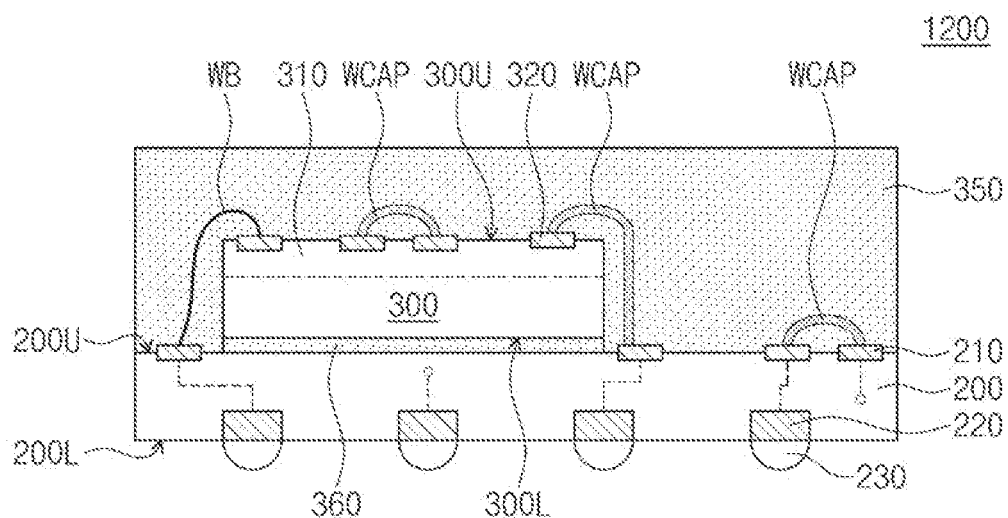

FIG. 60 is a sectional view illustrating an electronic device, on which a capacitor wire is mounted, according to an example embodiment of the inventive concept. For the sake of brevity, features, which are different from the electronic device of FIG. 59, will be mainly described below.

Referring to FIG. 60, an electronic device 1200 may include a package substrate 200, first substrate pads 210, second substrate pads 220, outer connection terminals 230, a semiconductor chip 300, at least one capacitor wire WCAP, an adhesive layer 360, and a chip mold layer 350.

The package substrate 200, the first substrate pads 210, the second substrate pads 220, and the outer connection terminals 230 may be the same as the package substrate 200, the first substrate pads 210, the second substrate pads 220, and the outer connection terminals 230, respectively, described with reference to FIG. 59.

The semiconductor chip 300 may be mounted on an upper surface 200U of the package substrate 200. The semiconductor chip 300 may be a memory chip, a logic chip, an application processor (AP) chip, or a system-on-chip (SOC) and may have an upper surface 300U and a lower surface 300L, which are opposite to each other. The semiconductor chip 300 may include a circuit layer 310, which is adjacent to the upper surface 300U of the semiconductor chip 300, and chip pads 320, which are disposed on the upper surface 300U of the semiconductor chip 300. The chip pads 320 may be electrically connected to the circuit layer 310. The semiconductor chip 300 may be disposed such that the lower surface 300L of the semiconductor chip 300 faces the upper surface 200U of the package substrate 200.

The adhesive layer 360 may be disposed between the semiconductor chip 300 and the package substrate 200. The adhesive layer 360 may be in contact with the lower surface 300L of the semiconductor chip 300 and the upper surface 200U of the package substrate 200. The semiconductor chip 300 may be attached to the package substrate 200 by the adhesive layer 360. In an embodiment, the adhesive layer 360 may be formed of or may include at least one of organic insulating materials.

A conductive wire WB may be electrically connected to one of the chip pads 320 of the semiconductor chip 300 and one of the first substrate pads 210 of the package substrate 200. The semiconductor chip 300 may be electrically connected to the package substrate 200 through the conductive wire WB.

The at least one capacitor wire WCAP may be mounted on the semiconductor chip 300 or the package substrate 200. As an example, the at least one capacitor wire WCAP may be disposed on the upper surface 300U of the semiconductor chip 300 and may be connected to corresponding ones of the chip pads 320. As another example, an end portion of the at least one capacitor wire WCAP may be connected to a corresponding one of the chip pads 320 of the semiconductor chip 300, and an opposite end portion of the at least one capacitor wire WCAP may be connected to a corresponding one of the first substrate pads 210 of the package substrate 200. As other example, the at least one capacitor wire WCAP may be disposed on the package substrate 200 to be horizontally spaced apart from the semiconductor chip 300. The at least one capacitor wire WCAP may be connected to corresponding ones of the first substrate pads 210. The at least one capacitor wire WCAP may be connected to the corresponding first substrate pads 210 or the corresponding chip pads 320 by a wire bonding method, as described with reference to FIGS. 50 to 57. The at least one capacitor wire WCAP, which is connected to the corresponding first substrate pads 210 or the corresponding chip pads 320, may have an arch shape.

The chip mold layer 350 may be disposed on the upper surface 200U of the package substrate 200 to hermetically encapsulate the semiconductor chip 300. The chip mold layer 350 may cover the semiconductor chip 300, the at least one capacitor wire WCAP, and the conductive wire WB and may be in contact with the upper surface 200U of the package substrate 200. The chip mold layer 350 may be formed of or may include at least one of insulating materials (e.g., epoxy molding compounds).

The electronic device 1200 may be a semiconductor package, which includes the semiconductor chip 300 mounted on the package substrate 200.

Figure 61:
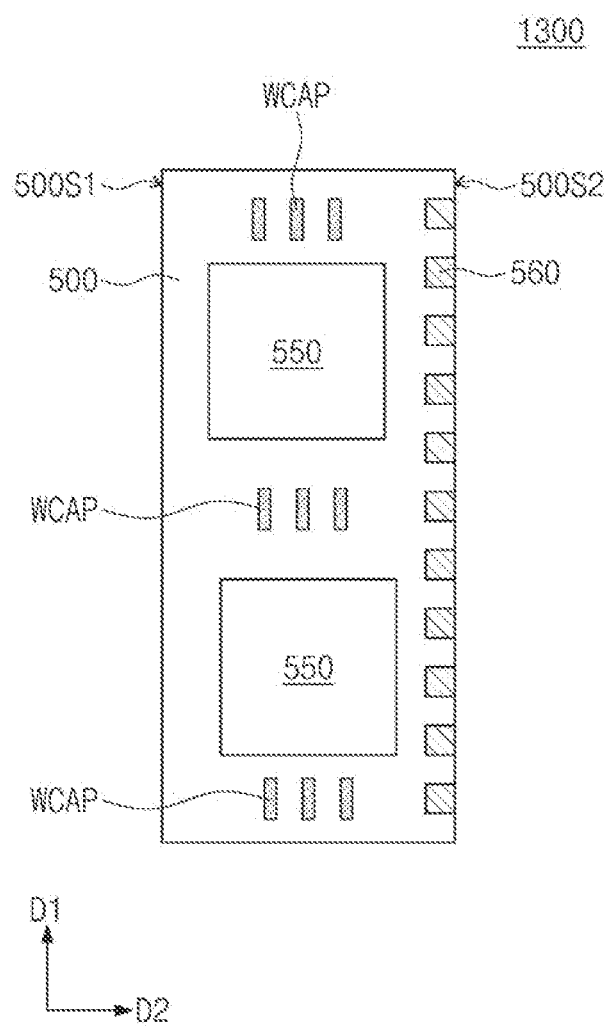
Figure 62:
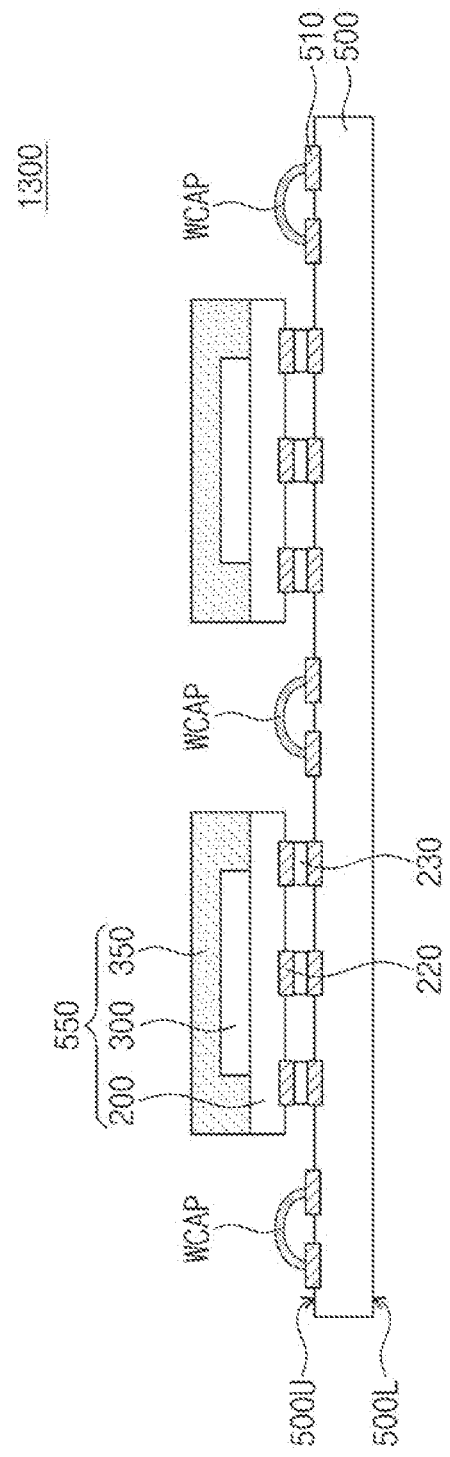

FIG. 61 is a plan view illustrating an electronic device, on which a capacitor wire according to an example embodiment of the inventive concept is mounted, and FIG. 62 is a sectional view of the electronic device of FIG. 61, when viewed in a first side of the electronic device.

Referring to FIGS. 61 and 62, an electronic device 1300 may include a module substrate 500, module substrate pads 510, a plurality of tabs 560, semiconductor packages 550, and at least one capacitor wire WCAP.

The module substrate 500 may be a printed circuit board and may have an upper surface 500U and a lower surface 500L, which are opposite to each other. The module substrate 500 may have a first side 500S1 and a second side 500S2, which are extended in in a first direction D1 and are opposite to each other in a second direction D2. The first direction D1 and the second direction D2 may be parallel to the upper surface 500U of the module substrate 500 and may be non-parallel (e.g., orthogonal) to each other. The module substrate pads 510 may be disposed on the upper surface 500U of the module substrate 500 and may be electrically connected to internal interconnection lines in the module substrate 500. The module substrate pads 510 may be formed of or may include at least one of conductive or metallic materials.

The tabs 560 may be disposed on the upper surface 500U of the module substrate 500 and adjacent to the second side 500S2. The tabs 560 may be arranged along the second side 500S2 of the module substrate 500 or in the first direction D1. The tabs 560 may be formed of or may include at least one of metallic materials (e.g., copper or aluminum). The tabs 560 may be provided to have the standardized function and arrangement (e.g., meeting the JEDEC standards). The tabs 560 may be used as input/output terminals of data signals or as transmission paths of command/address (C/A) signals.

The semiconductor packages 550 may be disposed on the upper surface 500U of the module substrate 500 and may be arranged in the first direction D1. The tabs 560 may be spaced apart from the semiconductor packages 550 horizontally (e.g., in the second direction D2). The semiconductor packages 550 may be electrically connected to the tabs 560 through internal interconnection lines in the module substrate 500. Accordingly, the data signals and the C/A signals may be transmitted between the semiconductor packages 550 and the tabs 560.

Each of the semiconductor packages 550 may include a package substrate 200, a semiconductor chip 300, and a chip mold layer 350. The package substrate 200, the semiconductor chip 300, and the chip mold layer 350 may be configured to have the same features as the package substrate 200, the semiconductor chip 300, and the chip mold layer 350, respectively, described with reference to FIGS. 59 and 60. Each of the semiconductor packages 550 may be configured to have substantially the same features as the electronic devices 1100 and 1200 described with reference to FIGS. 59 and 60. Substrate pads 220 may be disposed on a lower surface of the package substrate 200, and connection terminals 230 may be electrically connected to the substrate pads 220. The substrate pads 220 and the connection terminals 230 may be configured to have the same features as the second substrate pads 220 and the outer connection terminals 230, respectively, described with reference to FIGS. 59 and 60. The connection terminals 230 may be electrically connected to corresponding ones of the module substrate pads 510. Each of the semiconductor packages 550 may be electrically connected to internal interconnection lines in the module substrate 500 through the substrate pads 220, the connection terminals 230, and the corresponding module substrate pads 510. The semiconductor chip 300 of each of the semiconductor packages 550 may be electrically connected to the internal interconnection lines in the module substrate 500 through the package substrate 200, the substrate pads 220, the connection terminals 230, and the corresponding module substrate pads 510.

The at least one capacitor wire WCAP may be disposed on the upper surface 500U of the module substrate 500 and may be connected to corresponding ones of the module substrate pads 510. The at least one capacitor wire WCAP, which is disposed on the upper surface 500U of the module substrate 500, may be horizontally spaced apart from the semiconductor packages 550. The at least one capacitor wire WCAP may be connected to the corresponding module substrate pads 510 by a wire bonding method, as described with reference to FIGS. 50 to 57. The at least one capacitor wire WCAP, which is connected to the corresponding module substrate pads 510, may have an arch shape. The at least one capacitor wire WCAP may be electrically connected to internal interconnection lines in the module substrate 500 through the corresponding module substrate pads 510. The at least one capacitor wire WCAP may be electrically connected to the semiconductor packages 550 through the internal interconnection lines in the module substrate 500.

The electronic device 1300 may be a semiconductor module, which includes the semiconductor packages 550 mounted on the module substrate 500. Although not shown, the electronic device 1300 may further include an encapsulation layer, which is disposed on the module substrate 500 to cover the semiconductor packages 550 and at least one capacitor wire WCAP.

Figure 63:
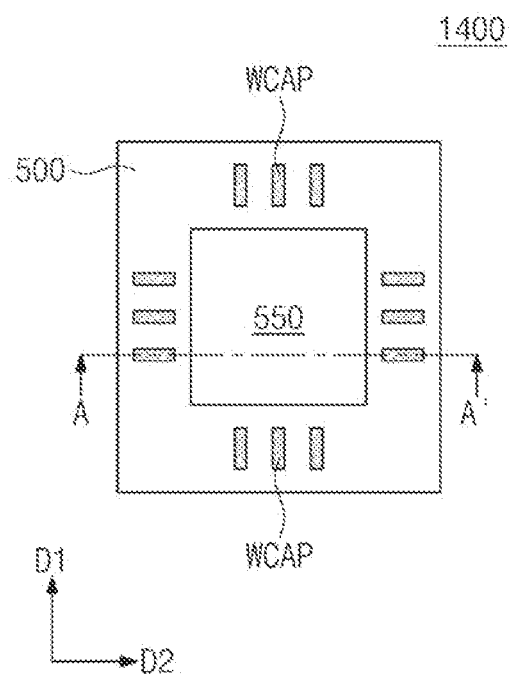
Figure 64:
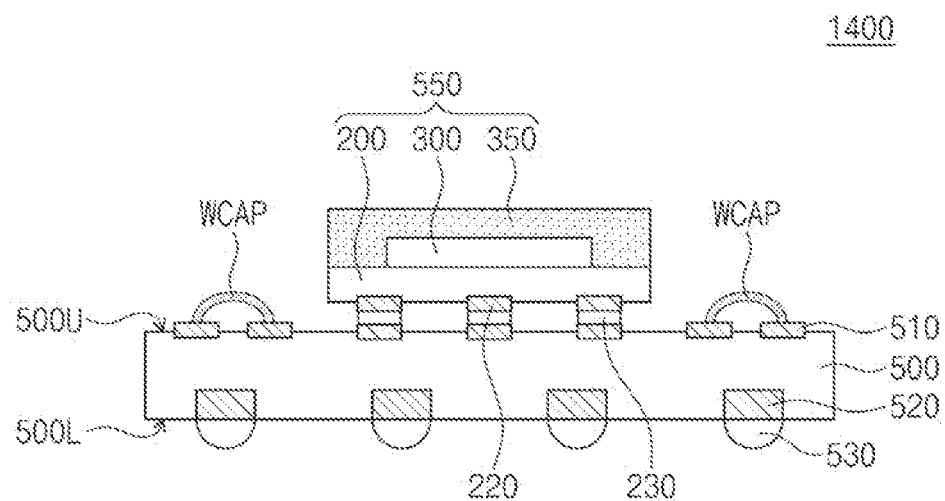

FIG. 63 is a plan view illustrating an electronic device, on which a capacitor wire according to an example embodiment of the inventive concept is mounted, and FIG. 64 is a sectional view taken along a line A-A' of FIG. 63. For the sake of brevity, features, which are different from the electronic device of FIGS. 61 and 62, will be mainly described below.

Referring to FIGS. 63 and 64, an electronic device 1400 may include a module substrate 500, first module substrate pads 510, second module substrate pads 520, module connection terminals 530, at least one semiconductor package 550, and at least one capacitor wire WCAP.

The module substrate 500 may be a printed circuit board and may have an upper surface 500U and a lower surface 500L, which are opposite to each other. The first module substrate pads 510 may be disposed on the upper surface 500U of the module substrate 500, and the second module substrate pads 520 may be disposed on the lower surface 500L of the module substrate 500. The first module substrate pads 510 may be electrically connected to the second module substrate pads 520 through internal interconnection lines in the module substrate 500. The first and second module substrate pads 510 and 520 may be formed of or may include at least one of conductive or metallic materials. The module connection terminals 530 may be disposed on the lower surface 500L of the module substrate 500 and may be disposed on the second module substrate pads 520, respectively. The module connection terminals 530 may be electrically connected to the second module substrate pads 520. The module connection terminals 530 may be formed of or may include at least one of pillars, bumps, or solder balls and may be formed of or may include a conductive material. The module connection terminals 530 may be used as input/output terminals of data signals or as transmission paths of command/address (C/A) signals.

The at least one semiconductor package 550 may be disposed on the upper surface 500U of the module substrate 500. The semiconductor package 550 may include a package substrate 200, a semiconductor chip 300, and a chip mold layer 350. The package substrate 200, the semiconductor chip 300, and the chip mold layer 350 may be configured to have substantially the same features as the package substrate 200, the semiconductor chip 300, and the chip mold layer 350 described with reference to FIGS. 59 and 60. The semiconductor package 550 may be configured to have substantially the same features as the electronic devices 1100 and 1200 described with reference to FIGS. 59 and 60. Substrate pads 220 may be disposed on a lower surface of the package substrate 200, and connection terminals 230 may be electrically connected to the substrate pads 220. The substrate pads 220 and the connection terminals 230 may be configured to have substantially the same features as the second substrate pads 220 and the outer connection terminals 230 described with reference to FIGS. 59 and 60. The connection terminals 230 may be electrically connected to corresponding ones of the first module substrate pads 510. The semiconductor package 550 may be electrically connected to internal interconnection lines in the module substrate 500 through the substrate pads 220, the connection terminals 230, and the corresponding first module substrate pads 510. The semiconductor chip 300 may be electrically connected to the internal interconnection lines in the module substrate 500 through the package substrate 200, the substrate pads 220, the connection terminals 230, and the corresponding first module substrate pads 510. The semiconductor package 550 may be electrically connected to the module connection terminals 530 through the internal interconnection lines in the module substrate 500 and the second module substrate pads 520, and thus, data signals and command/address signals may be exchanged between the semiconductor package 550 and the module connection terminals 530.

The at least one capacitor wire WCAP may be disposed on the upper surface 500U of the module substrate 500 and may be connected to corresponding ones of the first module substrate pads 510. The at least one capacitor wire WCAP, which is disposed on the upper surface 500U of the module substrate 500, may be horizontally spaced apart from the semiconductor package 550. The at least one capacitor wire WCAP may be connected to the corresponding first module substrate pads 510 by a wire bonding method, as described with reference to FIGS. 50 to 57. The at least one capacitor wire WCAP, which is connected to the corresponding first module substrate pads 510, may have an arch shape. The at least one capacitor wire WCAP may be electrically connected to internal interconnection lines in the module substrate 500 through the corresponding first module substrate pads 510. The at least one capacitor wire WCAP may be electrically connected to the semiconductor package 550 through the internal interconnection lines in the module substrate 500.

The electronic device 1400 may be a semiconductor module, which includes the at least one semiconductor package 550 mounted on the module substrate 500.

Figure 65:
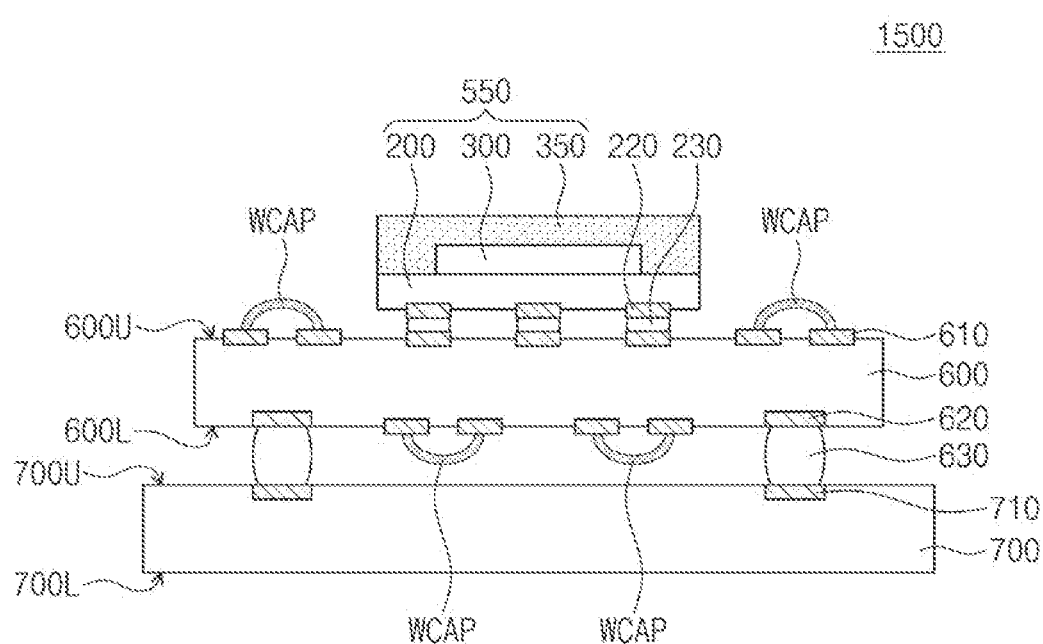

FIG. 65 is a sectional view illustrating an electronic device, on which a capacitor wire is mounted, according to an example embodiment of the inventive concept.

Referring to FIG. 65, an electronic device 1500 may include a lower substrate 700, an upper substrate 600, a semiconductor package 550, and at least one capacitor wire WCAP.

The upper substrate 600 may be a printed circuit board or a redistribution substrate and may have an upper surface 600U and a lower surface 600L, which are opposite to each other. First upper substrate pads 610 may be disposed on the upper surface 600U of the upper substrate 600, and second upper substrate pads 620 may be disposed on the lower surface 600L of the upper substrate 600. The first upper substrate pads 610 may be electrically connected to the second upper substrate pads 620 through internal interconnection lines in the upper substrate 600. The first and second upper substrate pads 610 and 620 may be formed of or may include at least one of conductive or metallic materials.

The semiconductor package 550 may be mounted on the upper surface 600U of the upper substrate 600. The semiconductor package 550 may include a package substrate 200, a semiconductor chip 300, and a chip mold layer 350. The package substrate 200, the semiconductor chip 300, and the chip mold layer 350 may be configured to have the same features as the package substrate 200, the semiconductor chip 300, and the chip mold layer 350, respectively, described with reference to FIGS. 59 and 60. The semiconductor package 550 may be configured to have substantially the same features as the electronic devices 1100 and 1200 described with reference to FIGS. 59 and 60. Substrate pads 220 may be disposed on a lower surface of the package substrate 200, and connection terminals 230 may be electrically connected to the substrate pads 220. The substrate pads 220 and the connection terminals 230 may be configured to have the same features as the second substrate pads 220 and the outer connection terminals 230, respectively, described with reference to FIGS. 59 and 60. The connection terminals 230 may be electrically connected to corresponding ones of the first upper substrate pads 610. The semiconductor package 550 may be electrically connected to the internal interconnection lines in the upper substrate 600 through the substrate pads 220, the connection terminals 230, and the corresponding first upper substrate pads 610. The semiconductor chip 300 may be electrically connected to the internal interconnection lines in the upper substrate 600 through the package substrate 200, the substrate pads 220, the connection terminals 230, and the corresponding first upper substrate pads 610.

In an embodiment, the at least one capacitor wire WCAP may be disposed on the upper surface 600U of the upper substrate 600 and may be connected to corresponding ones of the first upper substrate pads 610. The at least one capacitor wire WCAP, which is disposed on the upper surface 600U of the upper substrate 600, may be horizontally spaced apart from the semiconductor package 550. In another embodiment, the at least one capacitor wire WCAP may be disposed on the lower surface 600L of the upper substrate 600 and may be connected to corresponding ones of the second upper substrate pads 620. In this case, the at least one capacitor wire WCAP may be disposed between the upper substrate 600 and the lower substrate 700. The at least one capacitor wire WCAP may be connected to the corresponding first upper substrate pads 610 or the corresponding second upper substrate pads 620 by a wire bonding method, as described with reference to FIGS. 50 to 57. The at least one capacitor wire WCAP, which is connected to the corresponding first upper substrate pads 610 or the corresponding second upper substrate pads 620, may have an arch shape. The at least one capacitor wire WCAP may be electrically connected to the internal interconnection lines in the upper substrate 600 through the corresponding first upper substrate pads 610 or the corresponding second upper substrate pads 620. The at least one capacitor wire WCAP may be electrically connected to the semiconductor package 550 through the internal interconnection lines in the upper substrate 600.

The lower substrate 700 may be a printed circuit board or a redistribution substrate and may have an upper surface 700U and a lower surface 700L, which are opposite to each other. Lower substrate pads 710 may be disposed on the upper surface 700U of the lower substrate 700 and may be formed of or may include at least one of conductive or metallic materials. Lower connection terminals 630 may be disposed between the upper substrate 600 and the lower substrate 700. The lower connection terminals 630 may be connected to corresponding ones of the second upper substrate pads 620 of the upper substrate 600 and to corresponding ones of the lower substrate pads 710. The semiconductor package 550 may be electrically connected to the lower substrate 700 through the upper substrate 600 and the lower connection terminals 630.

According to an embodiment of the inventive concept, provided is a capacitor wire having a wire shape and serving as a capacitor. The capacitor wire is connected to pads on a substrate by a wire bonding method. Due to its wire shape, it may be easy to reduce a size of the capacitor wire. In addition, since the wire bonding method is used to connect the capacitor wire to the pads, the capacitor wire may be easily mounted on the substrate. As a result, it may be possible to easily increase an integration density of an electronic device with the capacitor wire.

In sum, according to an embodiment of the inventive concept, the size of the capacitor wire can be easily reduced, the capacitor wire can be easily mounted on the substrate, and the integration density of the electronic device can be easily increased.

While example embodiments of the inventive concept have been particularly shown and described, it will be understood by one of ordinary skill in the art that variations in form and detail may be made therein without departing from the spirit and scope of the attached claims.

What is claimed is:

1. A capacitor wire, comprising:
a core electrode line having a wire shape;
an outer electrode line covering at least a portion of the core electrode line; and
a dielectric line interposed between the core electrode line and the outer electrode line,
wherein the outer electrode line comprises material having a melting point lower than a melting point of material of the core electrode line,
wherein an end portion of at least one of the core electrode line and the dielectric line is not covered with the outer electrode line and is exposed to an outside,
wherein the outer electrode line has an end portion adjacent to the end portion of the core electrode line, and has a thickness measured from an interface between the outer electrode line and the dielectric line, and
wherein the thickness of the end portion of the outer electrode line is larger than a thickness of the outer electrode line.

2. The capacitor wire of claim 1,
wherein the core electrode line comprises a first metal, and
wherein the outer electrode line comprises a second metal different from the first metal.

3. The capacitor wire of claim 1, wherein the dielectric line comprises a ceramic material.

4. The capacitor wire of claim 1,
wherein the dielectric line encloses an outer circumference surface of the core electrode line, and
wherein the outer electrode line encloses an outer circumference surface of the dielectric line.

5. The capacitor wire of claim 4, wherein the end portion of the core electrode line has a ball shape.

6. The capacitor wire of claim 4,
wherein the end portion of the outer electrode line has a ring shape enclosing the outer circumference surface of the dielectric line.

7. The capacitor wire of claim 1,
wherein the core electrode line has a first surface and a second surface, which are opposite to each other, and
wherein the dielectric line and the outer electrode line are sequentially stacked on the first surface of the core electrode line.

8. The capacitor wire of claim 7,
wherein the dielectric line and the outer electrode line are a first dielectric line and a first outer electrode line, respectively,
wherein the capacitor wire further comprises a second dielectric line and second outer electrode lines, which are sequentially stacked on the second surface of the core electrode line, and
wherein the second dielectric line is interposed between the core electrode line and the second outer electrode line.

9. The capacitor wire of claim 1, further comprising:
an inner electrode line interposed between the core electrode line and the outer electrode line,
wherein the dielectric line comprises:
a first dielectric line interposed between the core electrode line and the inner electrode line; and
a second dielectric line interposed between the inner electrode line and the outer electrode line.

10. The capacitor wire of claim 9, wherein the inner electrode line is electrically disconnected from the core electrode line and the outer electrode line by the dielectric line.

11. The capacitor wire of claim 9, wherein the end portion of the core electrode line is not covered with the dielectric line, the inner electrode line, and the outer electrode line, and is exposed to the outside.

12. The capacitor wire of claim 11, wherein the second dielectric line covers an end portion of the inner electrode line and is in contact with the first dielectric line.

13. The capacitor wire of claim 12,
wherein the end portion of the outer electrode line is adjacent to the end portion of the core electrode line, and
wherein the end portion of the outer electrode line covers an end portion of the dielectric line and is in contact with the core electrode line.

14. A capacitor wire, comprising:
a core electrode line having a wire shape;
an outer electrode line covering at least a portion of the core electrode line and extending in a length direction of the core electrode line;
a dielectric line interposed between the core electrode line and the outer electrode line and extended in the length direction of the core electrode line; and
a passivation line covering the outer electrode line and extending in the length direction of the core electrode line,
wherein the outer electrode line is interposed between the dielectric line and the passivation line, wherein an end portion of at least one of the core electrode line and the dielectric line is not covered with the outer electrode line and the passivation line and is exposed to an outside, wherein the outer electrode line has an end portion, which is adjacent to the end portion of the core electrode line, and has a thickness measured from an interface between the outer electrode line and the dielectric line, and wherein the thickness of the end portion of the outer electrode line is larger than a thickness of the outer electrode line.

15. The capacitor wire of claim 14, wherein the core electrode line comprises a metallic material, and wherein the outer electrode line comprises a metal alloy having a melting point lower than a melting point of the metallic material of the core electrode line.

16. A capacitor wire, comprising:

a core electrode line having a wire shape and including an end portion;

a dielectric line covering at least a portion of the core electrode line and including an end portion adjacent to the end portion of the core electrode line; and an outer electrode line on the dielectric line and including an end portion adjacent to the end portion of the dielectric line, wherein the outer electrode line comprises material having a melting point lower than a melting point of material of the core electrode line, wherein the end portion of the dielectric line is not covered with the outer electrode line and is exposed to an outside, wherein the end portion of the outer electrode line has a thickness measured from an outer surface of the dielectric line, and wherein the thickness of the end portion of the outer electrode line is larger than a thickness of the outer electrode line.

17. The capacitor wire of claim 16, wherein the dielectric line encloses an outer circumference surface of the core electrode line, and wherein the outer electrode line encloses an outer circumference surface of the dielectric line.

18. The capacitor wire of claim 16, wherein the end portion of the core electrode line has a ball shape.

19. The capacitor wire of claim 16, further comprising:

an inner electrode line interposed between the core electrode line and the outer electrode line, wherein the dielectric line comprises:

a first dielectric line interposed between the core electrode line and the inner electrode line; and a second dielectric line interposed between the inner electrode line and the outer electrode line.

20. The capacitor wire of claim 16, wherein the core electrode line has a first surface and a second surface, which are opposite to each other, and wherein the dielectric line and the outer electrode line are sequentially stacked on the first surface of the core electrode line.

21. The capacitor wire of claim 20, wherein the dielectric line and the outer electrode line are a first dielectric line and a first outer electrode line, respectively, wherein the capacitor wire further comprises a second dielectric line and second outer electrode lines, which are sequentially stacked on the second surface of the core electrode line, and wherein the second dielectric line is interposed between the core electrode line and the second outer electrode line.

\* \* \* \* \*